US009526970B1

(12) United States Patent
Failing

(10) Patent No.: US 9,526,970 B1
(45) Date of Patent: Dec. 27, 2016

(54) SPORTS BOARD CONFIGURATION

(71) Applicant: Bryan Marc Failing, Morgan Hill, CA (US)

(72) Inventor: Bryan Marc Failing, Morgan Hill, CA (US)

( * ) Notice: Subject to any disclaimer, the term of this patent is extended or adjusted under 35 U.S.C. 154(b) by 0 days.

(21) Appl. No.: 15/083,227

(22) Filed: Mar. 28, 2016

Related U.S. Application Data

(62) Division of application No. 13/457,077, filed on Apr. 26, 2012, now Pat. No. 9,305,120.

(60) Provisional application No. 61/480,963, filed on Apr. 29, 2011.

(51) Int. Cl.

| | |
|---|---|
| ***G06F 17/50*** | (2006.01) |
| ***A63C 5/03*** | (2006.01) |
| ***A63C 5/06*** | (2006.01) |
| ***A63C 5/04*** | (2006.01) |

(52) U.S. Cl.
CPC . *A63C 5/03* (2013.01); *A63C 5/04* (2013.01); *A63C 5/06* (2013.01)

(58) Field of Classification Search
None
See application file for complete search history.

(56) References Cited

U.S. PATENT DOCUMENTS

| | | | |
|---|---|---|---|
| 2,258,046 | A | 10/1941 | Clement |
| 2,918,293 | A | 12/1959 | Tavi |
| 3,300,226 | A | 1/1967 | Reed, Jr. |
| 3,774,923 | A | 11/1973 | Suroff |
| 3,978,725 | A | 9/1976 | Hadtke |
| 4,018,454 | A | 4/1977 | Burkart |
| 4,089,057 | A | 5/1978 | Eriksson |
| 4,141,570 | A | 2/1979 | Sudmeier |
| 4,199,169 | A | 4/1980 | Guenzel et al. |
| 4,221,400 | A | 9/1980 | Powers |
| 4,293,142 | A | 10/1981 | Davignon |
| 4,300,786 | A | 11/1981 | Alley |
| 4,349,212 | A | 9/1982 | Svoboda |
| 4,402,524 | A | 9/1983 | D'Antonio et al. |
| 4,444,411 | A | 4/1984 | Svoboda et al. |
| 4,496,168 | A | 1/1985 | D'Antonio et al. |
| 4,502,146 | A | 2/1985 | D'Antonio |
| 4,516,110 | A | 5/1985 | Overmyer |
| 4,565,940 | A | 1/1986 | Hubbard, Jr. |
| 4,576,396 | A | 3/1986 | Stempfhuber |
| 4,577,886 | A | 3/1986 | Chernega |
| 4,592,567 | A | 6/1986 | Sartor |
| 4,626,730 | A | 12/1986 | Hubbard, Jr. |
| 4,722,222 | A | 2/1988 | Purdy et al. |

(Continued)

FOREIGN PATENT DOCUMENTS

| | | |
|---|---|---|
| EP | 970727 | 4/2005 |
| EP | 1557206 | 7/2005 |

(Continued)

OTHER PUBLICATIONS

Ashley, Steven, "Smart Skis and Other Adaptive Structures," Mechanical Engineering, vol. 117, No. 11, Nov. 1995, pp. 76-81, XP000539264.

(Continued)

*Primary Examiner* — John Walters
*Assistant Examiner* — Hilary L Johns

(57) ABSTRACT

A component of a sports board may be controlled to configure the sports board. The component may be coupled with at least one layer of the sports board.

41 Claims, 34 Drawing Sheets

(56) References Cited

U.S. PATENT DOCUMENTS 4,740,009 A 4/1988 Hoelzl
4,754,989 A 7/1988 Hoelzl
4,757,714 A 7/1988 Purdy et al.
4,848,786 A 7/1989 Mankau
4,856,895 A 8/1989 Parker
4,892,325 A 1/1990 D'Antonio
4,955,314 A 9/1990 Skedeleski et al.
4,979,761 A 12/1990 Rohlin
5,046,751 A 9/1991 Scherubl
5,232,241 A 8/1993 Knott et al.
5,312,258 A 5/1994 Giorgio
5,332,252 A 7/1994 Le Masson et al.
5,342,077 A 8/1994 Abondance
5,417,448 A 5/1995 Le Masson et al.
5,431,427 A 7/1995 Pieber et al.
5,435,588 A 7/1995 Commier et al.
5,447,322 A 9/1995 le Masson et al.
5,514,018 A 5/1996 Hara
5,538,272 A 7/1996 Peart
5,590,908 A 1/1997 Carr
5,636,146 A 6/1997 Flentov et al.
5,681,054 A 10/1997 Bonvallet
5,687,462 A 11/1997 Lazarus et al.
5,775,715 A 7/1998 Vandergrift
5,775,716 A 7/1998 Harsanyi et al.
5,779,257 A 7/1998 Bonvallet et al.
5,857,694 A 1/1999 Lazarus et al.
5,924,707 A 7/1999 Metrot
5,960,380 A 9/1999 Flentov et al.
5,984,343 A 11/1999 Longoni et al.
5,984,344 A 11/1999 Harsanyi et al.
5,997,018 A 12/1999 Lee
6,007,086 A 12/1999 Hopkins
6,056,310 A 5/2000 Hangl
6,086,490 A 7/2000 Spangler et al.
6,095,547 A 8/2000 Vandergrift et al.
6,102,425 A 8/2000 Gotzfried
6,102,426 A 8/2000 Lazarus et al.
6,113,115 A 9/2000 Hurth
6,139,031 A 10/2000 Wingard
6,182,998 B1 2/2001 Huyghe et al.
6,196,935 B1 3/2001 Spangler et al.
6,230,501 B1 5/2001 Bailey, Sr. et al.
6,266,623 B1 7/2001 Vock et al.
6,270,108 B1 8/2001 Phelipon et al.
6,325,404 B1 12/2001 Liard et al.
6,345,834 B1 2/2002 Bianchini et al.
6,412,807 B1 7/2002 Arduin et al.
6,485,380 B2 11/2002 Spangler et al.
6,488,308 B1 12/2002 Clausing
6,496,787 B1 12/2002 Flentov et al.
6,498,994 B2 12/2002 Vock et al.
6,499,000 B2 12/2002 Flentov et al.
6,516,284 B2 2/2003 Flentov et al.
6,533,296 B1 3/2003 Farraday
6,539,336 B1 3/2003 Vock et al.
6,616,170 B1 9/2003 Quarti
6,631,918 B2 10/2003 Silva
6,641,162 B2 11/2003 Allmann et al.
6,648,362 B1 11/2003 Bunter
6,679,513 B1 1/2004 Emig et al.
6,688,632 B2 2/2004 Merino et al.
6,707,360 B2 3/2004 Underwood et al.
6,715,773 B2 4/2004 Aiken
6,834,881 B2 12/2004 Mash
6,856,934 B2 2/2005 Vock et al.
6,861,782 B2 3/2005 Lammer
6,865,825 B2 3/2005 Bailey, Sr. et al.
6,882,086 B2 4/2005 Kornbluh et al.
6,883,823 B2 4/2005 Riepler et al.
6,885,971 B2 4/2005 Vock et al.
6,886,848 B2 5/2005 Riepler
6,935,640 B2 8/2005 Gille et al.
6,955,374 B2 10/2005 Stefanova et al.
6,959,259 B2 10/2005 Vock et al.
6,963,818 B2 11/2005 Flentov et al.
6,969,290 B2 11/2005 Shaw
6,983,951 B2 1/2006 Merino et al.
7,011,331 B2 3/2006 Riepler
7,011,332 B2 3/2006 Zanco
7,014,206 B2 3/2006 Donze
7,021,647 B2 4/2006 Restani
7,036,842 B2 5/2006 Krumbeck et al.
7,054,784 B2 5/2006 Flentov et al.
7,059,028 B2 6/2006 Lammer
7,059,614 B2 6/2006 Cole, III
7,063,345 B2 6/2006 Holzer
7,072,789 B2 7/2006 Vock et al.
7,080,849 B2 7/2006 Lammer
7,092,846 B2 8/2006 Vock et al.
7,098,578 B2 8/2006 Lammer
7,107,706 B1 9/2006 Bailey, Sr. et al.
7,111,864 B2 9/2006 Molg
7,134,680 B2 11/2006 Emig et al.
7,158,912 B2 1/2007 Vock et al.
7,159,891 B1 1/2007 Niggemann
7,162,392 B2 1/2007 Vock et al.
7,171,331 B2 1/2007 Vock et al.
7,178,814 B2 2/2007 Mash
7,185,908 B2 3/2007 Emig
7,204,041 B1 4/2007 Bailey, Sr. et al.
7,219,449 B1 5/2007 Hoffberg et al.
7,220,158 B1 5/2007 Norris
7,264,262 B2 9/2007 Zanco
7,290,784 B2 11/2007 Heil et al.
7,296,818 B2 11/2007 Krumbeck et al.
7,314,227 B2 1/2008 Sanders
7,344,148 B2 3/2008 Donze et al.
7,360,782 B2 4/2008 Gignoux
7,386,401 B2 6/2008 Vock et al.
7,395,614 B1 7/2008 Bailey, Sr. et al.
7,419,179 B2 9/2008 Zanco et al.
7,425,017 B2 9/2008 Mash
7,433,805 B2 10/2008 Vock et al.
7,451,056 B2 11/2008 Flentov et al.
7,457,724 B2 11/2008 Vock et al.
7,500,691 B2 3/2009 Haas
7,512,515 B2 3/2009 Vock et al.
7,540,525 B2 6/2009 Ametsbichler et al.
7,607,679 B2 10/2009 Wilson
7,623,987 B2 11/2009 Vock et al.
7,640,135 B2 12/2009 Vock et al.
7,641,215 B2 1/2010 Ellison
7,690,674 B2 4/2010 Trimble et al.
7,693,668 B2 4/2010 Vock et al.
7,708,302 B2 5/2010 Wilson
7,770,701 B1 8/2010 Davis
7,793,969 B2 9/2010 Wilson
7,813,887 B2 10/2010 Vock et al.
7,837,217 B2 11/2010 Avgustin et al.
7,859,171 B2 12/2010 Micallef
7,860,666 B2 12/2010 Vock et al.
7,863,859 B2 1/2011 Soar
7,942,436 B2 5/2011 Holzer et al.
7,942,450 B2 5/2011 Kawano et al.
7,949,488 B2 5/2011 Flentov et al.
7,966,154 B2 6/2011 Vock et al.
7,966,752 B2 6/2011 Grandin et al.
7,967,324 B2 6/2011 Miette et al.
7,983,876 B2 7/2011 Vock et al.
7,991,565 B2 8/2011 Vock et al.
7,994,752 B2 8/2011 Soar
7,999,447 B2 8/2011 Micallef
8,002,304 B2 8/2011 Heil et al.
8,033,564 B2 10/2011 Riepler et al.
8,036,851 B2 10/2011 Vock et al.
8,042,827 B2 10/2011 Karlsen
8,052,165 B2 11/2011 Holzer
8,052,293 B2 11/2011 Hurwitz
8,083,251 B2 12/2011 Wasserman
8,087,677 B2 1/2012 Bouttie
8,157,285 B2 4/2012 Wasserman
8,172,250 B2 5/2012 Krafft et al.
8,172,251 B2 5/2012 Holzer et al.

(56) References Cited

U.S. PATENT DOCUMENTS

| | | | |
|---|---|---|---|
| 8,239,146 | B2 | 8/2012 | Vock et al. |
| 8,246,070 | B2 | 8/2012 | Lin |
| 8,251,395 | B2 | 8/2012 | Ellison |
| 8,262,123 | B2 | 9/2012 | Smith et al. |
| 8,297,640 | B2 | 10/2012 | Ametsbichler |
| 8,306,673 | B1 | 11/2012 | Manning |
| 8,352,211 | B2 | 1/2013 | Vock et al. |
| 8,419,043 | B2 | 4/2013 | Fournier |
| 8,448,974 | B2 | 5/2013 | Huber et al. |
| 8,463,573 | B2 | 6/2013 | Flentov et al. |
| 8,465,044 | B2 | 6/2013 | Scaturro et al. |
| 8,469,372 | B2 | 6/2013 | Kloster et al. |
| 8,469,569 | B1 | 6/2013 | Tunnicliffe et al. |
| 8,480,112 | B2 | 7/2013 | Holzer et al. |
| 8,485,556 | B2 | 7/2013 | Shaheen |
| 8,556,289 | B2 | 10/2013 | Luthardt |
| 8,600,699 | B2 | 12/2013 | Vock et al. |
| 8,620,600 | B2 | 12/2013 | Vock et al. |
| 8,660,712 | B2 | 2/2014 | Grabowsky et al. |
| 8,678,958 | B2 | 3/2014 | Kuwabara |
| 8,708,371 | B2 | 4/2014 | Balun |
| 8,714,577 | B2 | 5/2014 | Fournier |
| 8,733,783 | B2 | 5/2014 | Kloster et al. |
| 8,762,092 | B2 | 6/2014 | Vock et al. |
| 8,794,658 | B2 | 8/2014 | Wilson |
| 8,849,606 | B2 | 9/2014 | Flentov et al. |
| 9,060,385 | B1 | 6/2015 | Manning |
| 9,078,485 | B2 | 7/2015 | Bender et al. |
| 9,132,336 | B2 | 9/2015 | Bulan |
| 9,138,628 | B2 | 9/2015 | Kloster et al. |
| 9,285,241 | B2 | 3/2016 | Rogel et al. |
| 2001/0001770 | A1 | 5/2001 | Spangler et al. |
| 2001/0034583 | A1 | 10/2001 | Flentov et al. |
| 2001/0037179 | A1 | 11/2001 | Vock et al. |
| 2002/0008365 | A1 | 1/2002 | Allmann et al. |
| 2002/0011717 | A1 | 1/2002 | Merino et al. |
| 2002/0014757 | A1 | 2/2002 | Silva |
| 2002/0047250 | A1 | 4/2002 | Luitz et al. |
| 2002/0059044 | A1 | 5/2002 | Flentov et al. |
| 2002/0093174 | A1 | 7/2002 | Mangold et al. |
| 2002/0096860 | A1 | 7/2002 | Lowe |
| 2002/0116147 | A1 | 8/2002 | Vock et al. |
| 2002/0175594 | A1 | 11/2002 | Kornbluh et al. |
| 2003/0014210 | A1 | 1/2003 | Vock et al. |
| 2003/0030249 | A1 | 2/2003 | Lammer |
| 2003/0055595 | A1 | 3/2003 | Flentov et al. |
| 2003/0090086 | A1 | 5/2003 | Gousie |
| 2003/0093248 | A1 | 5/2003 | Vock et al. |
| 2003/0111824 | A1 | 6/2003 | Riepler |
| 2003/0116941 | A1 | 6/2003 | Mash |
| 2003/0155726 | A1 | 8/2003 | Braun |
| 2003/0193168 | A1 | 10/2003 | Chou |
| 2003/0208928 | A1 | 11/2003 | Steszyn et al. |
| 2004/0036257 | A1 | 2/2004 | Lille et al. |
| 2004/0100067 | A1 | 5/2004 | Riepler et al. |
| 2004/0145152 | A1 | 7/2004 | Santa Cruz et al. |
| 2004/0178606 | A1 | 9/2004 | Ashley |
| 2004/0186975 | A1 | 9/2004 | Saha |
| 2004/0225467 | A1 | 11/2004 | Vock et al. |
| 2005/0021292 | A1 | 1/2005 | Vock et al. |
| 2005/0050945 | A1 | 3/2005 | Hrovath |
| 2005/0114165 | A1 | 5/2005 | Allegre et al. |
| 2005/0127638 | A1 | 6/2005 | Feichtlbauer et al. |
| 2005/0151350 | A1 | 7/2005 | Watson |
| 2005/0206131 | A1 | 9/2005 | Merino et al. |
| 2005/0212258 | A1 | 9/2005 | Enders |
| 2007/0011920 | A1 | 1/2007 | DiBenedetto et al. |
| 2007/0108867 | A1 | 5/2007 | Saloka et al. |
| 2007/0144842 | A1 | 6/2007 | Zhou |
| 2008/0021676 | A1 | 1/2008 | Vock et al. |
| 2008/0029998 | A1 | 2/2008 | Largueze et al. |
| 2008/0251981 | A1 | 10/2008 | Greshake et al. |
| 2009/0006029 | A1 | 1/2009 | Vock et al. |
| 2009/0256332 | A1 | 10/2009 | Ekberg |
| 2009/0265958 | A1 | 10/2009 | DiBenedetto et al. |
| 2009/0267324 | A1 | 10/2009 | Macek |
| 2010/0148472 | A1 | 6/2010 | Phelipon et al. |
| 2010/0191499 | A1 | 7/2010 | Vock et al. |
| 2010/0237588 | A1 | 9/2010 | Krause et al. |
| 2010/0320731 | A1 | 12/2010 | Wilson |
| 2010/0328001 | A1 | 12/2010 | Harjes |
| 2011/0060550 | A1 | 3/2011 | Vock et al. |
| 2011/0233900 | A1 | 9/2011 | Huard |
| 2011/0272920 | A1 | 11/2011 | Adamczewski |
| 2011/0272922 | A1 | 11/2011 | Puget et al. |
| 2011/0282594 | A1 | 11/2011 | Vock et al. |
| 2011/0313731 | A1 | 12/2011 | Vock et al. |
| 2012/0116714 | A1 | 5/2012 | Rogel et al. |
| 2014/0038480 | A1 | 2/2014 | Luthardt |
| 2014/0138195 | A1 | 5/2014 | Anderfaas et al. |
| 2014/0203683 | A1 | 7/2014 | Kuwabara |
| 2014/0252748 | A1 | 9/2014 | Fournier |
| 2014/0312597 | A1 | 10/2014 | Wilson |
| 2016/0023044 | A1 | 1/2016 | Bender et al. |

FOREIGN PATENT DOCUMENTS

| | | |
|---|---|---|
| WO | 8303360 | 10/1983 |
| WO | 9704841 | 2/1997 |
| WO | 9711756 | 4/1997 |
| WO | 9834689 | 8/1998 |

OTHER PUBLICATIONS

Brennan, Matthew, "Piezoelectric Power Consumption for Active Vibration Control," Master of Science Thesis, The University of Vermont, Jul. 25, 1997.

U.S Notice of Allowance, U.S. Appl. No. 13/457,077, mailed Feb. 10, 2016.

U.S Office Action, U.S. Appl. No. 13/457,077, mailed Feb. 7, 2014.

U.S Office Action, U.S. Appl. No. 13/457,077, mailed Jan. 12, 2015.

U.S Office Action, U.S. Appl. No. 13/457,077, mailed Jul. 2, 2013.

U.S Office Action, U.S. Appl. No. 13/457,077, mailed Jul. 22, 2014.

U.S Office Action, U.S. Appl. No. 13/457,077, mailed Mar. 24, 2014.

U.S. Office Action, U.S. Appl. No. 13/457,077, mailed Septemer 10, 2015.

1500

1700

2800

2810 2820 2830

| | Configuration 1 | Configuration 2 | Configuration 3 |
|---|---|---|---|
| Component 1 | Position 1 | Position 2 | Position 3 |
| Component 2 | Pressure 1 | Pressure 2 | Pressure 3 |
| Component 3 | Temperature 1 | Temperature 2 | Temperature 3 |
| Component 4 | Magnetic Field Property 1 | Magnetic Field Property 2 | Magnetic Field Property 3 |
| Component 5 | Current 1 | Current 2 | Current 3 |
| Component 6 | Voltage 1 | Voltage 2 | Voltage 3 |

| 2930 | | 2940 | 2950 | 2960 | 2970 |
|---|---|---|---|---|---|
| | | **Attribute 1** | **Attribute 2** | **Attribute 3** | **Attribute 4** |
| 2910 | **Bending Stiffness** | 3 | 2 | 1 | 2 |
| | **Torsional Stiffness** | 7 | 5 | 3 | 1 |
| | **Vibration Characteristic(s)** | 5 | 7 | 5 | 3 |
| | **Shape** | Rocker 10% | Rocker 20% | Camber 40% | Camber 20% |
| 2920 | **Bending Stiffness** | 5 | 3 | 3 | 1 |
| | **Torsional Stiffness** | 3 | 4 | 5 | 6 |
| | **Vibration Characteristic(s)** | 6 | 2 | 2 | 4 |
| | **Shape** | Flat | Small curve | Medium curve | Large curve |

FIGURE 29

SPORTS BOARD CONFIGURATION

RELATED APPLICATIONS

The present application is a divisional of U.S. patent application Ser. No. 13/457,077, filed Apr. 26, 2012, entitled "SPORTS BOARD CONFIGURATION," naming Bryan Marc Failing as the inventor, which claims the benefit of U.S. Provisional Patent Application No. 61/480,963, filed Apr. 29, 2011, entitled "CONFIGURABLE VEHICLE." Those applications are incorporated herein by reference in their entirety and for all purposes.

BACKGROUND

Conventional vehicles are typically offered in several models designed for different applications. For example, a manufacturer of conventional snowboards may offer one model intended for freestyle or park use, another model for backcountry or powder use, and yet another model for all-mountain use. Each of these models has a unique configuration intended for a specific application. Additionally, each of these models cannot be reconfigured. However, the differences from one model to another are usually small and subtle. As such, manufacturers can increase sales and obtain the benefits of product differentiation without significantly increasing costs.

Although offering different, application-specific models is advantageous for the manufacturers of conventional vehicles, it creates several problems for consumers. For example, multiple vehicles of different model types must be purchased to accommodate different types of terrain or use, thereby significantly increasing the cost of the purchase. Additionally, the cost of accessories for the multiple vehicles is scaled by the number of vehicles purchased. Further, storage and transportation becomes more difficult and inconvenient as the number of vehicles increases. And further yet, the time and effort spent transitioning from one vehicle to another at the time of use is increased, thereby reducing the enjoyment and duration of use.

SUMMARY

Accordingly, a need exists to reduce the cost of vehicles with different configurations. A need also exists to allow easier and/or more convenient storage and/or transportation of vehicles with different configurations. Additionally, a need exists to reduce the time and effort spent transitioning from one vehicle to another at the time of use. Embodiments provide novel solutions to these needs and others as described below.

BRIEF DESCRIPTION OF THE DRAWINGS

The present invention is illustrated by way of example, and not by way of limitation, in the figures of the accompanying drawings and in which like reference numerals refer to the same or similar elements.

FIG. 28 shows a data structure in accordance with one embodiment.

FIG. 29 shows a data structure in accordance with one embodiment.

DETAILED DESCRIPTION OF THE INVENTION

Figure 1A:
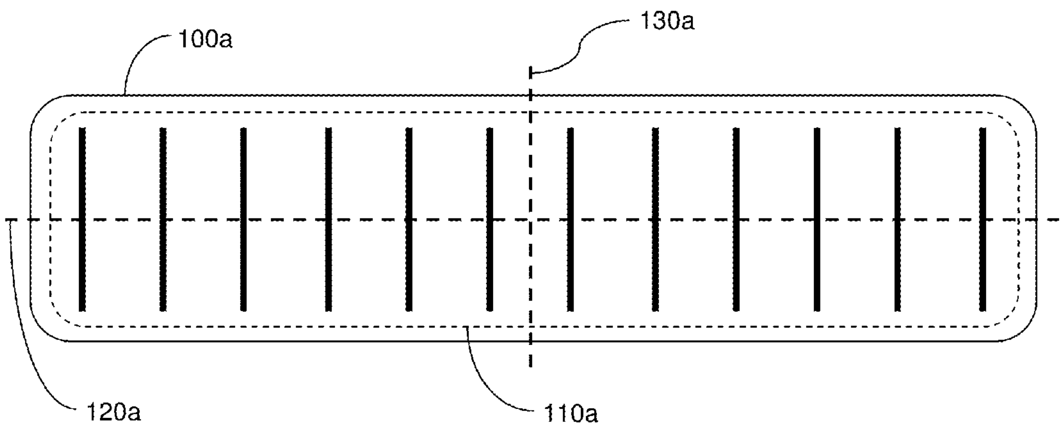
FIG. 1A shows an apparatus including at least one component in a first position in accordance with one embodiment.

Reference will now be made in detail to embodiments of the present invention, examples of which are illustrated in the accompanying drawings. While the present invention will be discussed in conjunction with the following embodiments, it will be understood that they are not intended to limit the present invention to these embodiments alone. On the contrary, the present invention is intended to cover alternatives, modifications, and equivalents which may be included with the spirit and scope of the present invention as defined by the appended claims. Furthermore, in the following detailed description of the present invention, numerous specific details are set forth in order to provide a thorough understanding of the present invention. However, embodiments of the present invention may be practiced without these specific details. In other instances, well-known methods, procedures, components, and circuits have not been described in detail so as not to unnecessarily obscure aspects of the present invention.

NOTATION AND NOMENCLATURE

Some regions of the detailed descriptions which follow are presented in terms of procedures, logic blocks, processing and other symbolic representations of operations on data bits within a computer memory. These descriptions and representations are the means used by those skilled in the art to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "aborting," "accepting," "accessing," "activating," "adding," "adjusting," "allocating," "allowing," "analyzing," "applying," "assembling," "assigning," "authenticating," "authorizing," "balancing," "blocking," "calculating," "capturing," "causing," "changing," "charging," "combining," "comparing," "collecting," "communicating," "configuring," "controlling," "converting," "creating," "deactivating," "debugging," "decreasing," "defining," "delivering," "depicting," "detecting," "determining," "discharging," "displaying," "downloading," "enabling," "establishing," "executing," "forwarding," "flipping," "generating," "grouping," "hiding," "identifying," "increasing," "initiating," "instantiating," "interacting," "measuring," "modifying," "monitoring," "moving," "outputting," "parsing," "performing," "placing," "presenting," "processing," "programming," "providing," "provisioning," "querying," "receiving," "regulating," "removing," "rendering," "repeating," "resuming," "retaining," "sampling," "simulating," "selecting," "sending," "sorting," "storing," "subtracting," "suspending," "tracking," "transcoding," "transforming," "transmitting," "unblocking," "using," "verifying," or the like, may refer to the action and/or processes of a computer system, or similar electronic computing device, that manipulates and transforms data represented as physical (electronic) quantities within the computer system's registers and memories into other data similarly represented as physical quantities within the computer system memories or registers or other such information storage, transmission and/or display devices.

As used herein, the term "coupled with" may refer to an arrangement of objects (or components) where at least two objects (or at least two components) are in physical contact with one another (e.g., touching), where one object (or component) is disposed at least partially within another object (or component), where one object (or component) is integrated with another object (or component), where at least two objects (or at least two components) are separated by at least one other object or component (e.g., two objects or components that are coupled with one another may have at least one other object or component positioned between the two objects or components), or some combination thereof.

Embodiments

In accordance with one or more embodiments, an apparatus (or a vehicle, or at least one vehicle portion, including or implemented by the apparatus) may include at least one component allowing at least one property of the apparatus (or at least one portion thereof) to be determined, configured, altered, etc. The term "vehicle" as used herein may refer to at least one sports board (e.g., at least one snowboard, at least one ski, at least one skateboard, at least one water ski, at least one wakeboard, at least one surf board, etc.), at least one apparatus capable of being ridden by at least one person, at least one apparatus capable of carrying or supporting the weight of at least one person (e.g., who each weigh less than approximately 400 pounds), at least one apparatus other than a shoe, some combination thereof, etc. The at least one property may include resistance to bending (e.g., bending stiffness, bending rigidity, etc.), resistance to torsion (e.g., torsional stiffness, torsional rigidity, etc.), at least one vibration characteristic (e.g., vibration damping, at least one damping coefficient, at least one damped natural frequency, at least one undamped natural frequency, vibration frequency response, etc.), shape of one or more portions of the apparatus (or portion thereof), some combination thereof, etc. In one embodiment, the at least one component may allow at least one property of the apparatus (or a portion thereof) to be determined, configured, altered, etc. without affecting or significantly affecting the compression of the apparatus (or a portion thereof).

The at least one component may be configured or reconfigured during manufacturing, before use, during use, after use, some combination thereof, etc. The at least one component may be configured manually and/or automatically.

At least one property of an apparatus (or a vehicle, or at least one vehicle portion, including or implemented by the apparatus) may determined, configured, altered, etc. based on: a position (e.g., associated with or defined by a location, plane, axis, orientation, arrangement, pattern, etc.) of at least one component (e.g., 210 of FIGS. 2A through 6B, 710*a* of FIGS. 7A through 8B, 710*b* of FIGS. 7A through 8B, 1410 of FIG. 14 and/or FIG. 15, 1610 of FIG. 16, 1710 of FIG. 17, etc.) of an apparatus (e.g., as described with respect to FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14, FIG. 15, some combination thereof, etc.); a pressure of or inside the at least one component (e.g., as described with respect to FIG. 16); a state of a shape metal alloy (SMA) of at least one component; at least one property of a magnetorheological fluid of at least one component (e.g., as described with respect to FIG. 17, FIG. 18A, FIG. 18B, etc.); some combination thereof; etc. The at least one component may include any number of components or sub-components.

Figure 1B:
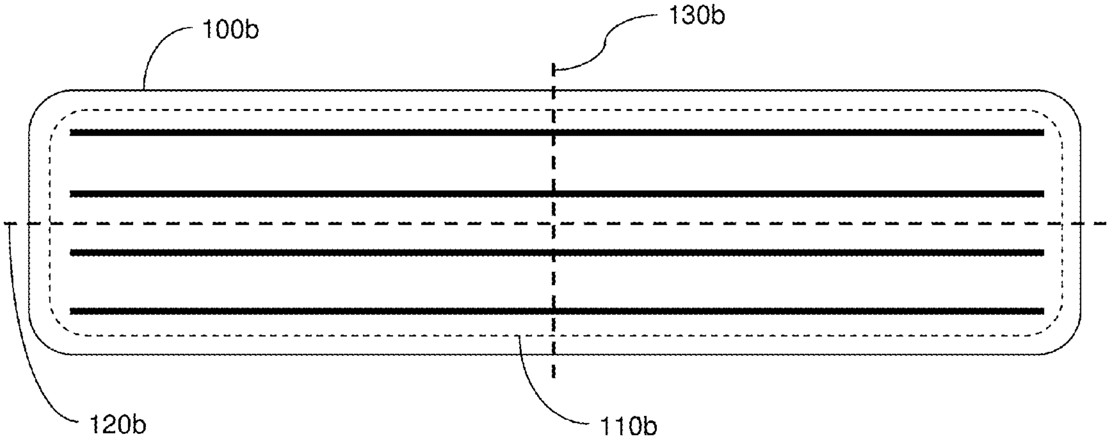
FIG. 1B shows an apparatus including at least one component in a second position in accordance with one embodiment.

FIG. 1A shows apparatus 100*a* including at least one component 110*a* in a first position in accordance with one embodiment of the present invention, whereas FIG. 1B shows apparatus 100*b* including at least one component 110*b* in a second position in accordance with one embodiment of the present invention. In one embodiment, apparatus 100*a* may be, or be used to implement, a vehicle or at least one portion of a vehicle. And in one embodiment, apparatus 100*b* may be, or be used to implement, a vehicle or at least one portion of a vehicle.

In one embodiment, different positions of components may allow different apparatus configurations and/or different alterations of at least one property of the apparatus. For example, at least one component 110*a* may be used to alter resistance to torsion of apparatus 100*a* about axis 120*a*, while at least one component 110*b* may be used to alter resistance to torsion of apparatus 100*b* about axis 130*b*. As another example, at least one component 110*a* may be used to alter resistance to bending of apparatus 100*a* around or about axis 120*a*, while at least one component 110*b* may be used to alter resistance to bending of apparatus 100*b* around or about axis 130*b*. As yet another example, at least one component 110*a* may be used to alter shape and/or at least one vibration characteristic of apparatus 100*a* in a first manner, while at least one component 110*b* may be used to alter shape and/or at least one vibration characteristic of apparatus 100*b* in a second manner.

Figure 1C:
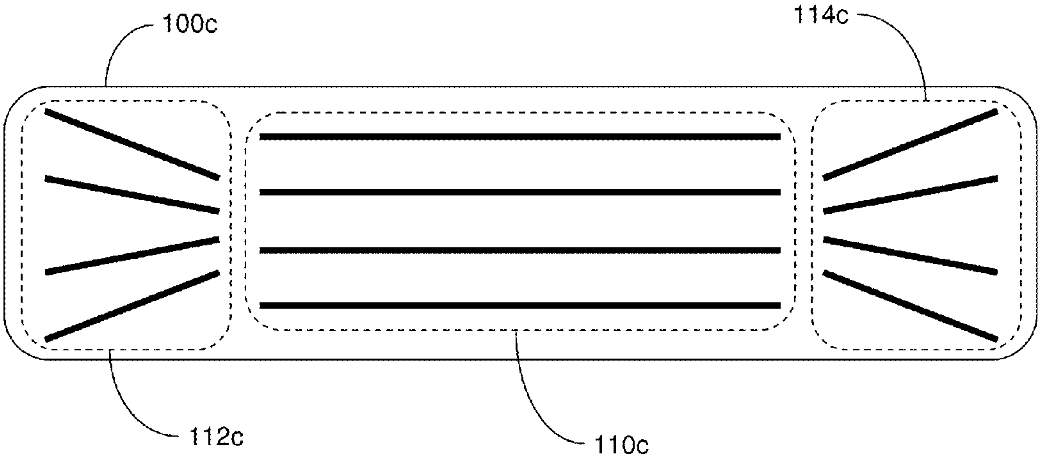
FIG. 1C shows an apparatus including a plurality of components in accordance with one embodiment.

FIG. 1C shows apparatus 100*c* including a plurality of components in accordance with one embodiment of the present invention. In one embodiment, apparatus 100*c* may be, or be used to implement, a vehicle or at least one portion of a vehicle.

As shown in FIG. 1C, apparatus 100*c* may include at least one component 110*c*, at least one component 112*c*, and at least one component 114*c*. In one embodiment, each of the components or groups of components may be positioned differently (e.g., at least one component 110*c* may be positioned differently than at least one component 112*c*, at least one component 112*c* may be positioned differently than at least one component 114*c*, at least one component 110*c* may be positioned differently than at least one component 114*c*, etc.). In this manner, each component or group of components may be advantageously used to differently configure the apparatus and/or differently alter at least one property of the apparatus. Furthermore, where each component or group of components is located in a different portion of the apparatus, each component or group of components may be advantageously used to differently configure a respective portion of the apparatus (e.g., contemporaneously, sequentially, etc.) and/or differently alter at least one respective property of a respective portion of the apparatus (e.g., contemporaneously, sequentially, etc.).

Figure 1D:
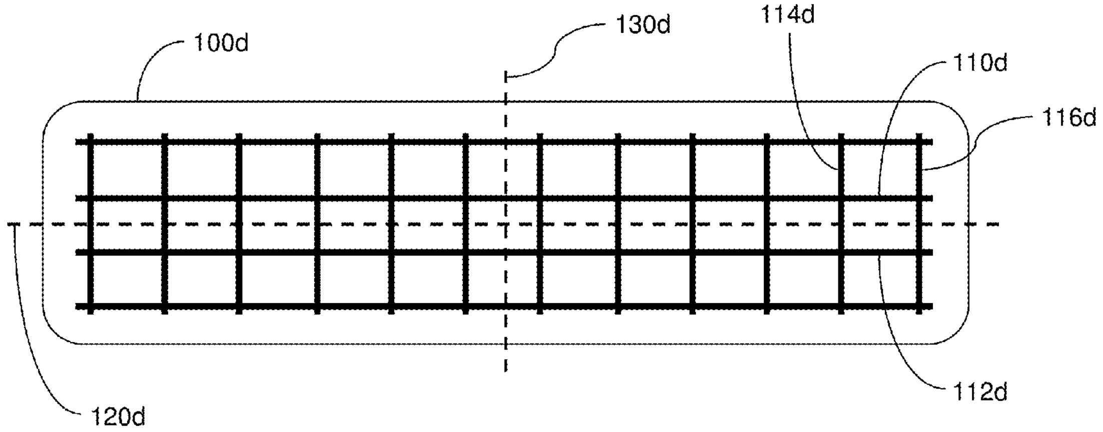
FIG. 1D shows an apparatus including a plurality of components disposed in the same portion of the apparatus in accordance with one embodiment.

FIG. 1D shows apparatus 100*d* including a plurality of components disposed in the same portion of apparatus 100*d* in accordance with one embodiment of the present invention. In one embodiment, apparatus 100*d* may be, or be used to implement, a vehicle or at least one portion of a vehicle.

As shown in FIG. 1D, at least one component (e.g., 110*d*, 112*d*, etc.) may overlap, be integrated with, or otherwise be disposed in the same portion of apparatus 100*d* as at least one other component (e.g., 114*d*, 116*d*, etc.). Accordingly, a plurality of components disposed in same portion of apparatus 100*d* may be advantageously used to alter a plurality of different properties of the portion of the apparatus. The properties may be altered contemporaneously, sequentially, etc.

For example, at least one component (e.g., 114*d*, 116*d*, etc.) may be used to alter resistance to torsion of apparatus 100*d* about axis 120*d*, while at least one component (e.g., 110*d*, 112*d*, etc.) may be used to alter resistance to torsion of apparatus 100*d* about axis 130*d*. As another example, at least one component (e.g., 114*d*, 116*d*, etc.) may be used to alter resistance to bending of apparatus 100*d* around or about axis 120*d*, while at least one component (e.g., 110*d*, 112*d*, etc.) may be used to alter resistance to bending of apparatus 100*d* around or about axis 130*d*. As yet another example, at least one component (e.g., 110*d*, 112*d*, etc.) may be used to alter shape and/or at least one vibration characteristic of apparatus 100*d* in a first manner, while at least one other component (e.g., 114*d*, 116*d*, etc.) may be used to alter shape and/or at least one vibration characteristic of apparatus 100*d* in a second manner.

In one embodiment, a plurality of components of an apparatus may be utilized to configure the same property or properties. For example, two or more components may be utilized to configure bending stiffness, torsional stiffness, at least one vibration characteristic, shape, some other property, etc. In one embodiment, at least two components may be utilized to configure different properties. For example, at least one component may be utilized to configure torsional stiffness of an apparatus, whereas at least one other component may be utilized to configure bending stiffness and/or at least one vibration characteristic of the apparatus.

It should be appreciated that each component may be utilized to configure any number of properties. For example, a first component may be utilized to configure only one property of at least a portion of an apparatus. As another example, a second component may be utilized to configure a plurality of properties of at least a portion of an apparatus.

Although the previous FIGS. (e.g., 1A, 1B, 1C, and 1D) show apparatuses with a specific number and position of components, it should be appreciated that a different number and/or position of components may be used in other embodiments. Additionally, although the previous FIGS. (e.g., 1A, 1B, 1C, and 1D) show apparatuses with a specific size and shape of components, it should be appreciated that a different size and/or shape of components may be used in other embodiments.

Figure 2A:
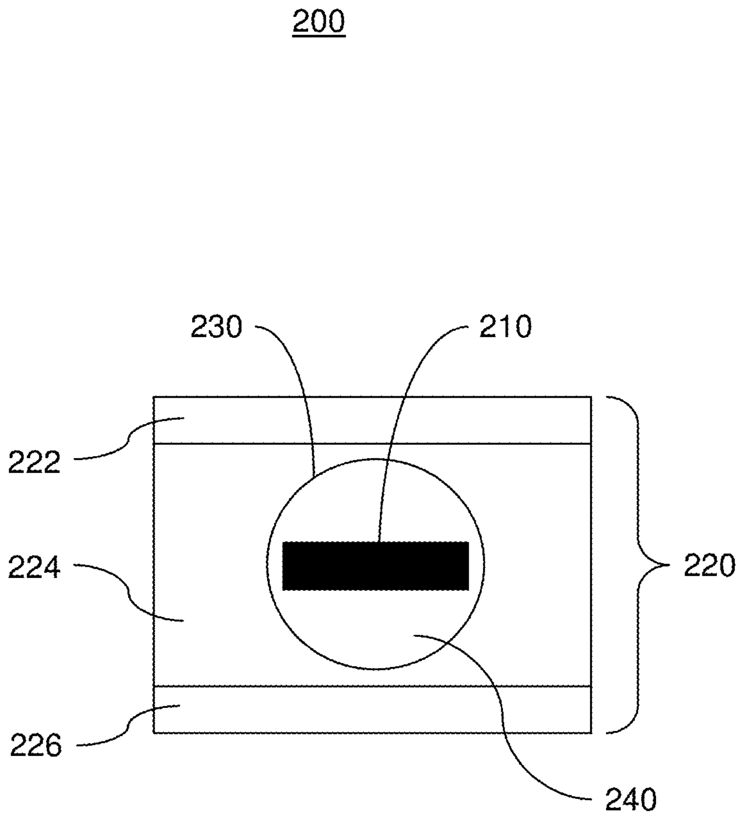
FIG. 2A shows an apparatus including at least one component in a first position in accordance with one embodiment.
Figure 2B:
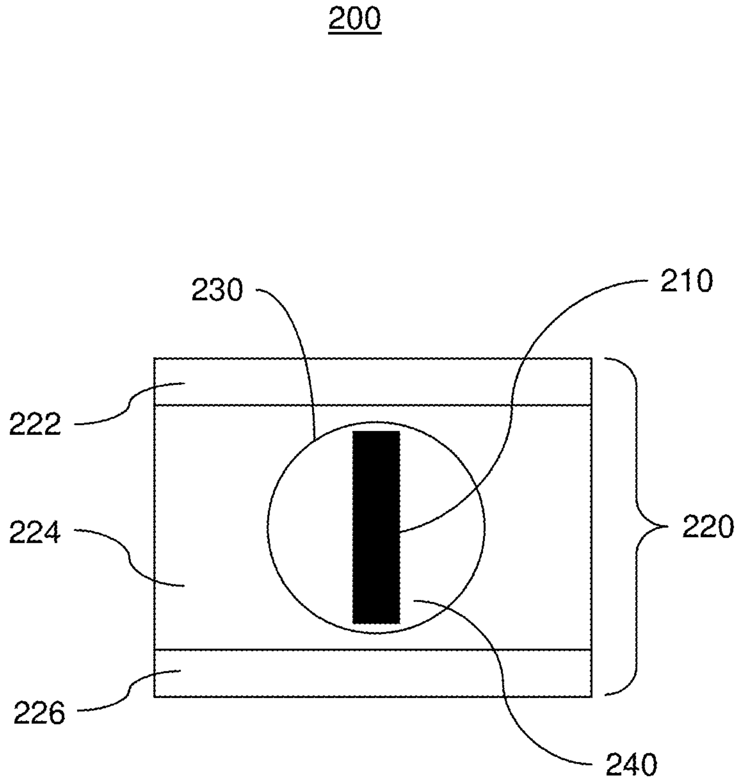
FIG. 2B shows an apparatus including at least one component in a second position in accordance with one embodiment.

FIG. 2A shows apparatus 200 including at least one component 210 in a first position in accordance with one embodiment of the present invention, whereas FIG. 2B shows apparatus 200 including at least one component 210 in a second position in accordance with one embodiment of the present invention. In one embodiment, apparatus 200 may be, or be used to implement, a vehicle or at least one portion of a vehicle. And in one embodiment, at least one component 210 may be used to implement one or more of the previously-described components (e.g., 110*a*, 110*b*, 110*c*, 112*c*, 114*c*, 110*d*, 112*d*, 114*d*, 116*d*, some combination thereof, etc.).

Each of the positions (e.g., the first position depicted in FIG. 2A, the second position depicted in FIG. 2B, another position, etc.) may be associated with or defined by a different location, plane, axis, orientation, arrangement, pattern, some combination thereof, etc. At least one component 210 may be disposed at least partially within at least one layer 220 of apparatus 200. In one embodiment, a property of apparatus 200 (or at least one portion thereof) may be determined, configured, altered, etc. by setting at least one component 210 at one or more positions. At least one component 210 may be moved between positions by mechanically articulating or actuating at least one component 210 in one embodiment. For example, moving at least one component 210 between positions (e.g., from a first position depicted in FIG. 2A to a second position depicted in FIG. 2B, from the second position to the first position, between the first position and at least one other position, between the second position and at least one other position, etc.) may vary one or more properties of apparatus 200 (or a vehicle, or at least one vehicle portion, including or implemented by apparatus 200) or a portion of apparatus 200.

At least one layer 220 may include at least one layer 222, at least one layer 224, at least one layer 226, at least one other layer, some combination thereof, etc. At least one layer 222 may be or include at least one top layer in one embodiment. At least one layer 224 may be or include at least one inner layer or and/or a core of the apparatus in one embodiment. At least one layer 226 may be or include at least one bottom layer and/or a base of the apparatus in one embodiment.

In one embodiment, layers (e.g., 222, 224, 226, some combination thereof, etc.) of apparatus 200 may slide or move with respect to one another (e.g., responsive to a movement, bending, twisting, change in shape, etc. of apparatus 200). In one embodiment, layers (e.g., 222, 224, 226, some combination thereof, etc.) of apparatus 200 may be fixed or not move with respect to one another (e.g., responsive to a movement, bending, twisting, change in shape, etc. of apparatus 200).

In one embodiment, at least one layer 222 may include at least one graphic and/or at least one design. In one embodiment, the at least one graphic and/or at least one design may include at least one image, and therefore, at least one layer 222 may be or include at least one image-bearing layer. At least one layer 222 may be made of plastic or some other material (e.g., metal, wood, carbon fiber, a composite material, etc.). In one embodiment, at least one layer 222 may be configured to interface with at least one binding (e.g., for accepting a boot, foot, etc.), at least one boot, at least one shoe, at least one foot, etc. And in one embodiment, at least one layer 222 may: include a first surface (e.g., a top surface, another surface, etc.) defining at least one feature for increasing friction between the first surface and another object (e.g., a binding, a boot, a shoe, a user's foot, etc.); be configured to interface with grip tape or some other material for roughening or patterning of the first surface; etc.

In one embodiment, at least one layer 226 may include at least one graphic and/or at least one design. In one embodiment, the at least one graphic and/or at least one design may include an image, and therefore, at least one layer 226 may be or include at least one image-bearing layer. At least one layer 226 may be made of plastic or some other material (e.g., metal, wood, carbon fiber, a composite material, etc.). At least one layer 226 may include a second surface (e.g., a bottom surface, another surface, etc.) configured to glide or move across a fluid (e.g., water, another liquid or fluid, etc.) or another surface (e.g., snow, the ground, dirt, rocks, pavement, asphalt, etc.) in one embodiment. At least one layer 226 may be configured to interface with an apparatus (e.g., a truck of a skateboard, a fin, an apparatus including at least one wheel, etc.) in one embodiment.

In one embodiment, at least one layer 226 may include or be configured to interface with a metal edge and/or rail. And in one embodiment, the metal edge and/or rail may be coupled with at least one layer 226 and/or at least one other portion of apparatus 200.

As shown in FIGS. 2A and 2B, at least one component 210 may be disposed at least partially within opening or channel 230. Opening or channel 230 may be defined by at least one layer 224 and/or at least one other layer (e.g., of at least one layer 220). In one embodiment, at least one component 210 may be at least partially surrounded or enclosed by element 240. Element 240 may be capable of holding at least one component 210 in place, reducing contact or limiting movement between at least one component 210 and at least one layer 220 (e.g., a surface or portion of at least one layer 220 defining opening or channel 230), allowing rotation or movement of at least one component 210 with respect to at least one layer 220 (e.g., from a first position depicted in FIG. 2A to a second position depicted in FIG. 2B, from the second position to the first position, between the first position and at least one other position, between the second position and at least one other position, etc.), reducing vibration and/or rattling of at least one component 210, distributing or conveying loads to at least one component 210, distributing or conveying vibration to at least one component 210, some combination thereof, etc.

Figure 3A:
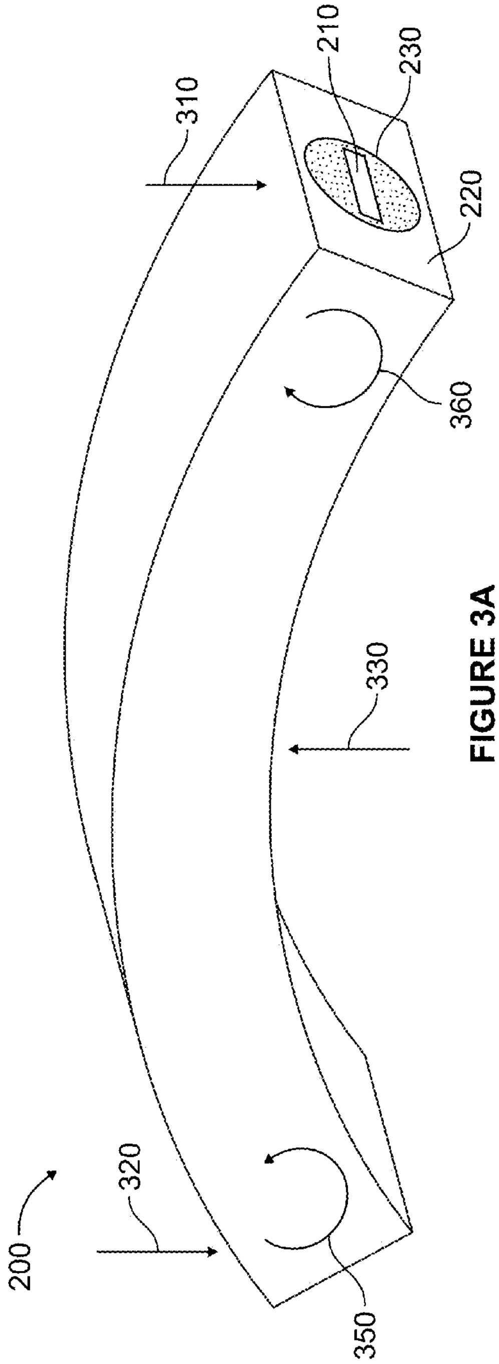
FIG. 3A shows a first view of a bending of an apparatus including at least one component in a first position in accordance with one embodiment.
Figure 3B:
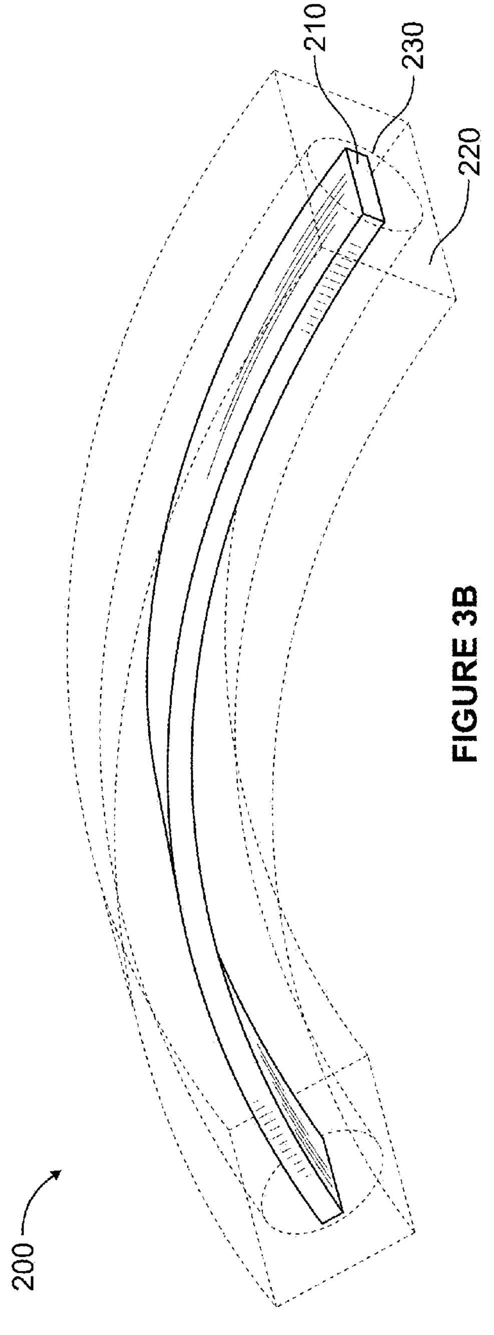
FIG. 3B shows a second view of a bending of an apparatus including at least one component in a first position in accordance with one embodiment.

FIG. 3A shows a first view of a bending of apparatus 200 including at least one component 210 in a first position (e.g., as depicted in FIG. 2A) in accordance with one embodiment of the present invention, whereas FIG. 3B shows a second view of a bending of apparatus 200 including at least one component 210 in a first position (e.g., as depicted in FIG.

Figure 4A:
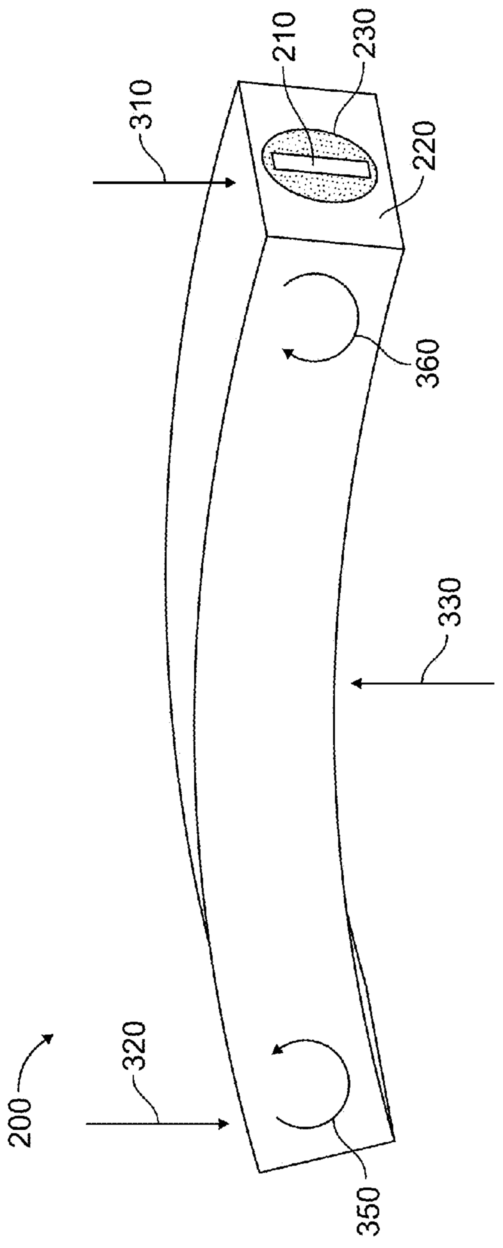
FIG. 4A shows a first view of a bending of an apparatus including at least one component in a second position in accordance with one embodiment.

2A) in accordance with one embodiment of the present invention. FIG. 4A shows a first view of a bending of apparatus 200 including at least one component 210 in a second position (e.g., as depicted in FIG. 2B) in accordance with one embodiment of the present invention, whereas FIG. 4B shows a second view of a bending of apparatus 200 including at least one component 210 in a second position (e.g., as depicted in FIG. 2B) in accordance with one embodiment of the present invention.

Figure 4B:
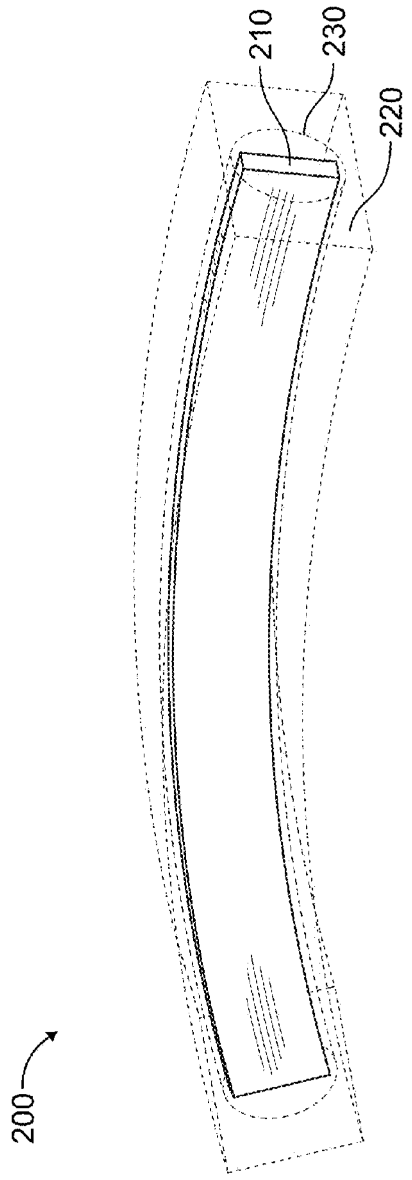
FIG. 4B shows a second view of a bending of an apparatus including at least one component in a second position in accordance with one embodiment.

In one embodiment, apparatus 200 may be more easily bent, for example, when at least one component 210 is in the first position (e.g., as shown in FIGS. 3A and 3B) than the second position (e.g., as shown in FIGS. 4A and 4B). Accordingly, where the same bending load is applied to the apparatus (e.g., 200) when at least one component 210 is in the first position and the second position, the apparatus (e.g., 200) may undergo more strain or movement (e.g., responsive to the bending load) when at least one component 220 is in the first position (e.g., as depicted in FIGS. 3A and 3B) as opposed to the second position (e.g., as depicted in FIGS. 4A and 4B).

In one embodiment, the bending of apparatus 200 and/or at least one component 210 may be caused by one or more external forces or moments acting on apparatus 200 and/or at least one component 210. For example, the bending (e.g., depicted in FIGS. 3A, 3B, 4A, 4B, etc.) may be caused by forces acting downward (e.g., represented by arrows 310 and 320 as shown in FIGS. 3A and 4A) and at least one force acting upward (e.g., represented by arrow 330 as shown in FIGS. 3A and 4A). As another example, the bending (e.g., depicted in FIGS. 3A, 3B, 4A, 4B, etc.) may be caused by at least one moment in a first direction (e.g., represented by arrow 350 as shown in FIGS. 3A and 4A) and/or at least one moment in a second direction (e.g., represented by arrow 360 as shown in FIGS. 3A and 4A). In one embodiment, the bending may be caused by one or more external forces or moments acting on the apparatus (e.g., 200) and/or at least one component in conjunction with one or more internal forces or moments (e.g., caused by the at least one component itself as discussed below with respect to FIGS. 7A, 7B, 8A, 8B, 9A, 9B, 10A, 10B, 11A, 11B, 12, etc.).

Figure 5A:
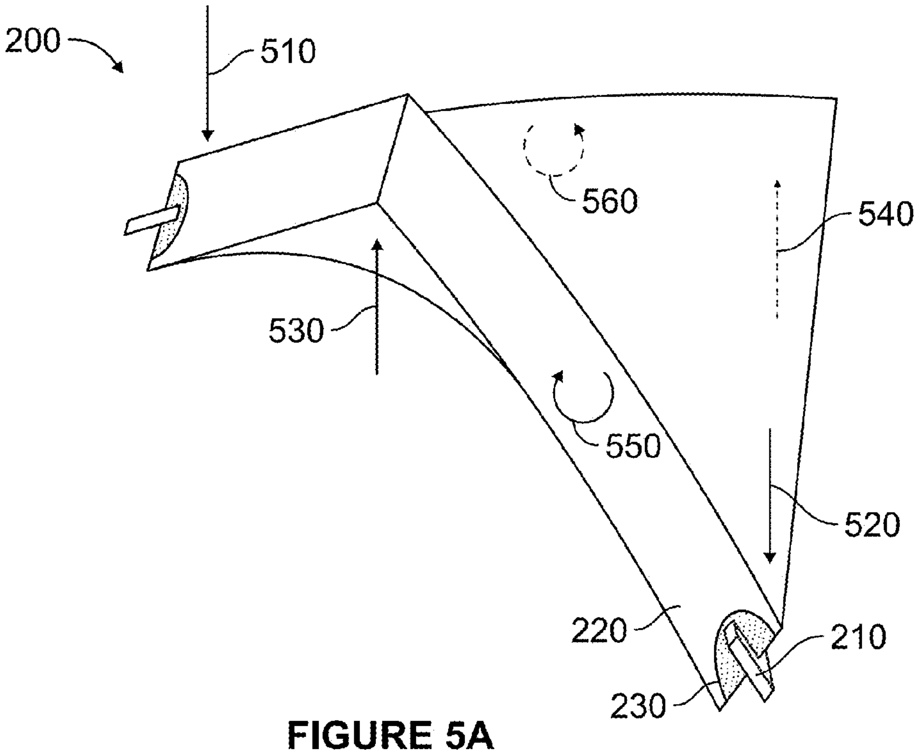
FIG. 5A shows a first view of a twisting of apparatus including at least one component in a first position in accordance with one embodiment.
Figure 5B:
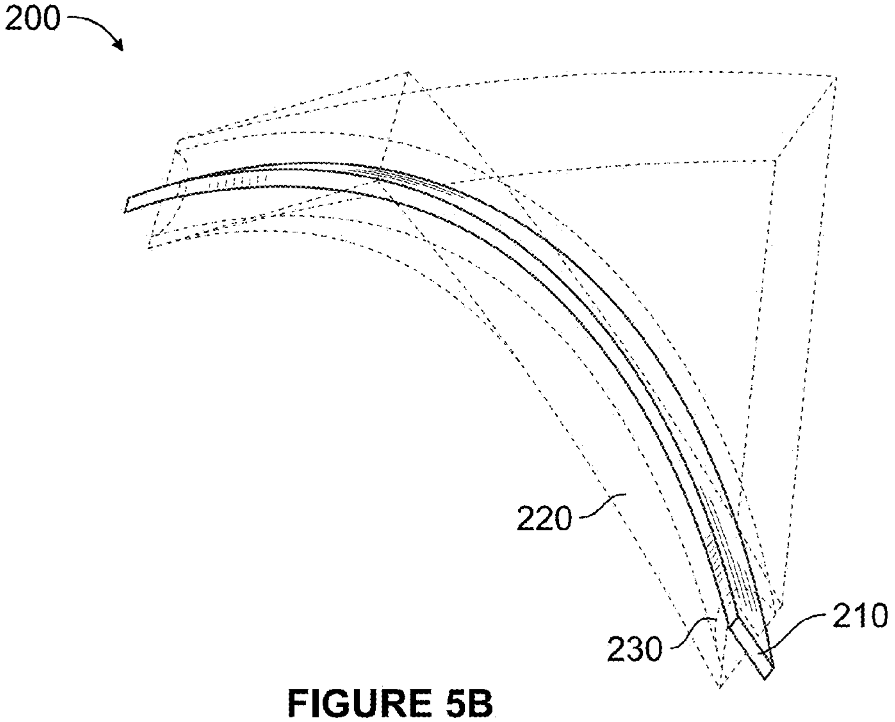
FIG. 5B shows a second view of a twisting of an apparatus including at least one component in a first position in accordance with one embodiment.
Figure 6A:
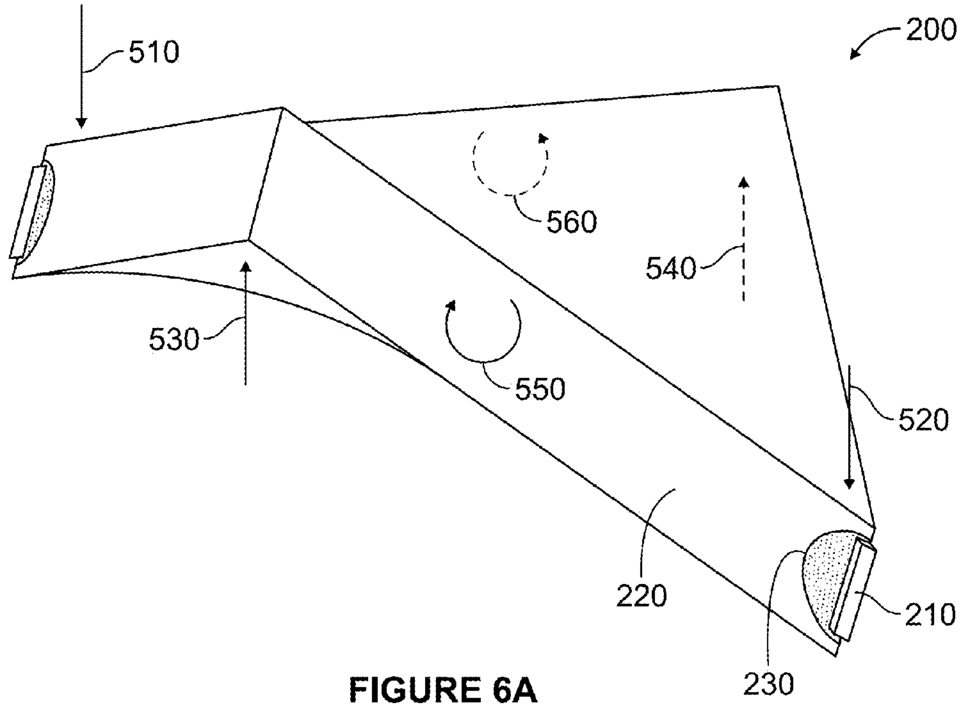
FIG. 6A shows a first view of a twisting of an apparatus including at least one component in a second position in accordance with one embodiment.

FIG. 5A shows a first view of a twisting of apparatus 200 including at least one component 210 in a first position (e.g., as depicted in FIG. 2A) in accordance with one embodiment of the present invention, whereas FIG. 5B shows a second view of a twisting of apparatus 200 including at least one component 210 in a first position (e.g., as depicted in FIG. 2A) in accordance with one embodiment of the present invention. FIG. 6A shows a first view of a twisting of apparatus 200 including at least one component 210 in a second position (e.g., as depicted in FIG. 2B) in accordance with one embodiment of the present invention, whereas FIG. 6B shows a second view of a twisting of apparatus 200 including at least one component 210 in a second position (e.g., as depicted in FIG. 2B) in accordance with one embodiment of the present invention.

Figure 6B:
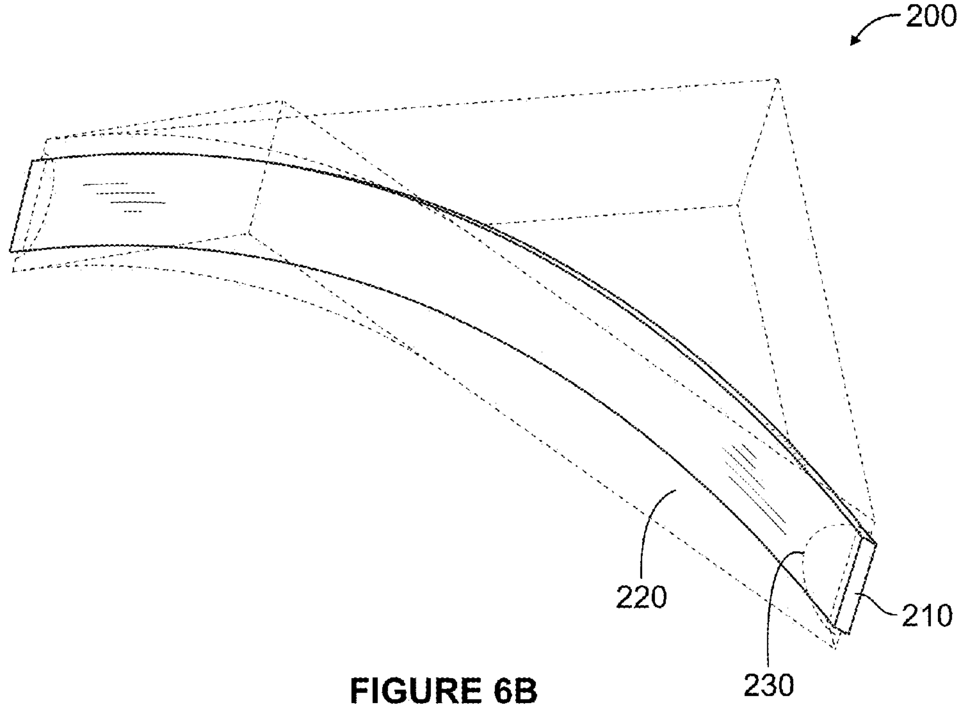
FIG. 6B shows a second view of a twisting of an apparatus including at least one component in a second position in accordance with one embodiment.

In one embodiment, the apparatus (e.g., 200) may be more easily twisted, for example, when at least one component 210 is in the first position (e.g., as shown in FIGS. 5A and 5B) than the second position (e.g., as shown in FIGS. 6A and 6B). Accordingly, where the same torsional load is applied to the apparatus (e.g., 200) when at least one component 210 is in the first position and the second position, the apparatus (e.g., 200) may undergo more strain or movement (e.g., responsive to the torsional load) when at least one component 220 is in the first position (e.g., as depicted in FIGS. 5A and 5B) as opposed to the second position (e.g., as depicted in FIGS. 6A and 6B).

In one embodiment, the twisting of apparatus 200 and/or at least one component 210 may be caused by one or more external forces or moments acting on apparatus 200 and/or at least one component 210. For example, the twisting (e.g., depicted in FIGS. 5A, 5B, 6A, 6B, etc.) may be caused by at least one force acting downward (e.g., represented by arrows 510 and 520 as shown in FIGS. 5A and 6A) and at least one force acting upward (e.g., represented by arrows 530 and 540 as shown in FIGS. 5A and 6A). As another example, the twisting (e.g., depicted in FIGS. 5A, 5B, 6A, 6B, etc.) may be caused by at least one moment in a first direction (e.g., represented by arrow 550 as shown FIGS. 5A and 6A) and/or at least one moment in a second direction (e.g., represented by arrow 560 as shown in FIGS. 5A and 6A). In one embodiment, the twisting may be caused by one or more external forces or moments acting on the apparatus (e.g., 200) and/or at least one component in conjunction with one or more internal forces or moments (e.g., caused by the at least one component itself as discussed below with respect to FIGS. 7A, 7B, 8A, 8B, 9A, 9B, 10A, 10B, 11A, 11B, 12, etc.).

In one embodiment, different positions (e.g., associated with or defined by different locations, planes, axes, orientations, arrangements, patterns, some combination thereof, etc.) of at least one component (e.g., 210) may provide different vibration characteristics (e.g., vibration damping, at least one damping coefficient, at least one damped natural frequency, at least one undamped natural frequency, vibration frequency response, etc.) for apparatus (e.g., 200). For example, vibration damping may be different when in the second position (e.g., as depicted in FIG. 2B, 4A, 4B, 6A, 6B, etc.) than the first position (e.g., as depicted in FIG. 2A, 3A, 3B, 5A, 5B, etc.). As another example, the first position may provide the apparatus (e.g., 200) with a first vibration characteristic (e.g., a first damping coefficient, a first damped natural frequency, a first undamped natural frequency, a first vibration frequency response, etc.), whereas the second position may provide the apparatus (e.g., 200) with a second vibration characteristic (e.g., a second damping coefficient, a second damped natural frequency, a second undamped natural frequency, a second vibration frequency response, etc.). In this manner, at least one vibration characteristic of apparatus 200 (or a vehicle, or at least one vehicle portion, including or implemented by apparatus 200) may be configured, determined, altered, etc. based on the position of at least one component.

Figure 7A:
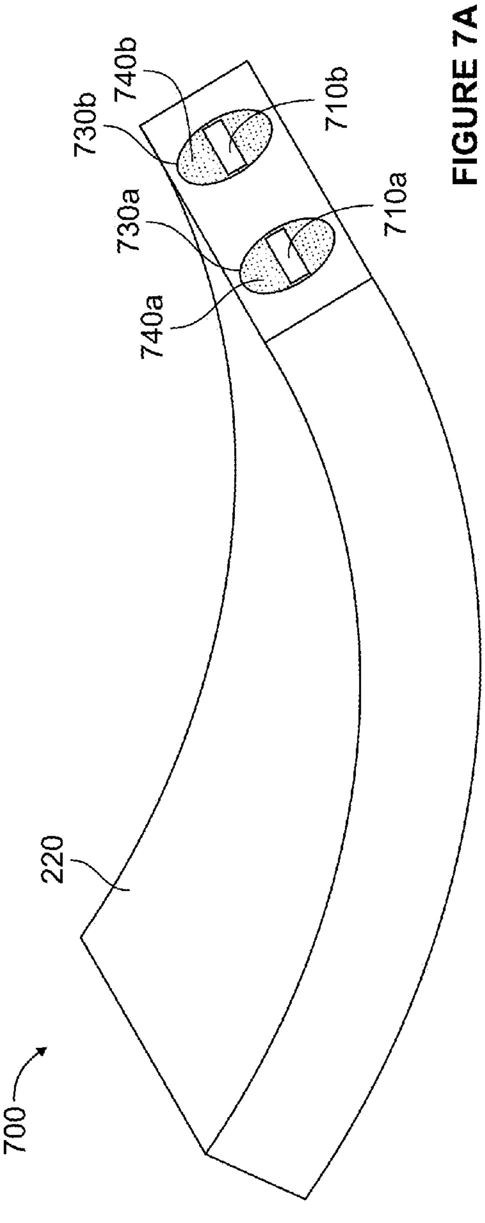
FIG. 7A shows a first view of an apparatus with a first shape in accordance with one embodiment.
Figure 7B:
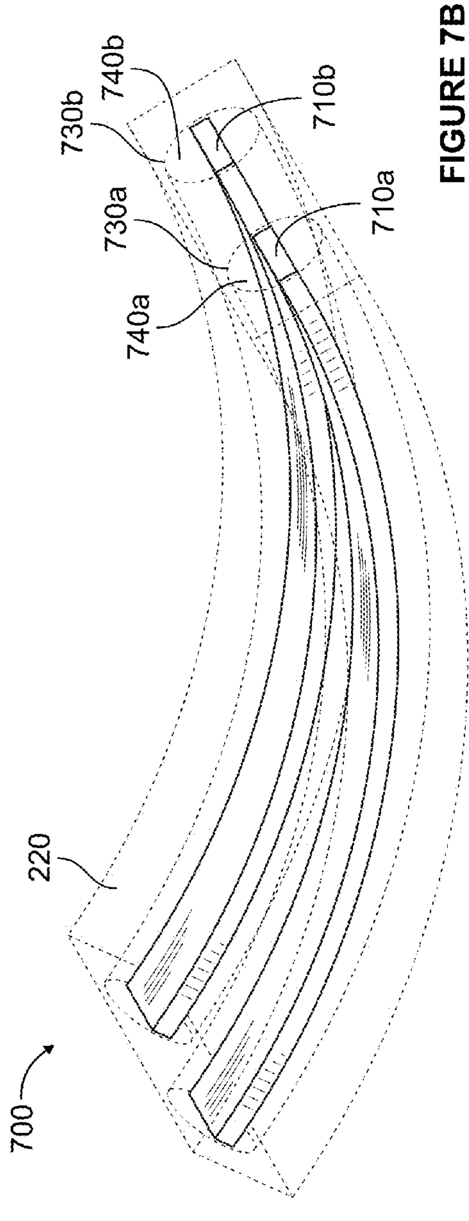
FIG. 7B shows a second view of an apparatus with the first shape in accordance with one embodiment.
Figure 8A:
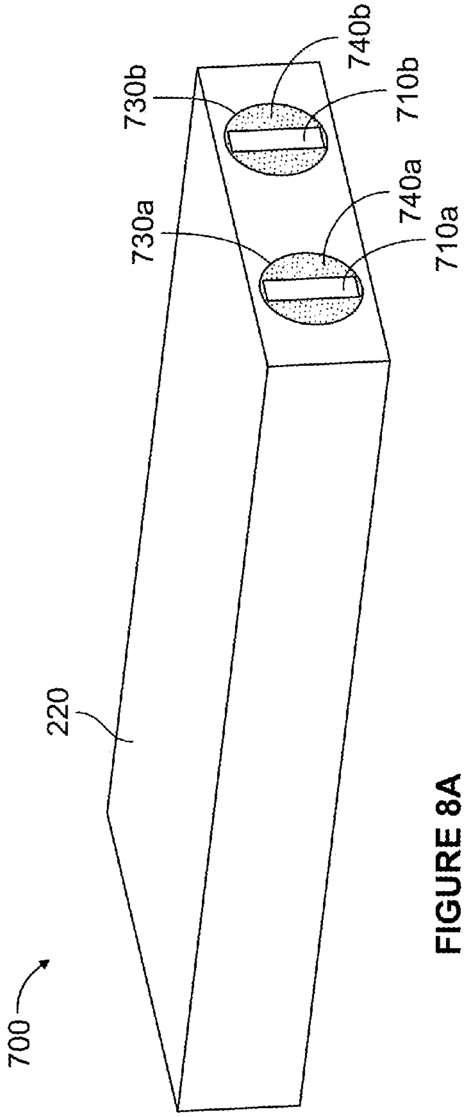
FIG. 8A shows a first view of an apparatus with a second shape in accordance with one embodiment.
Figure 8B:
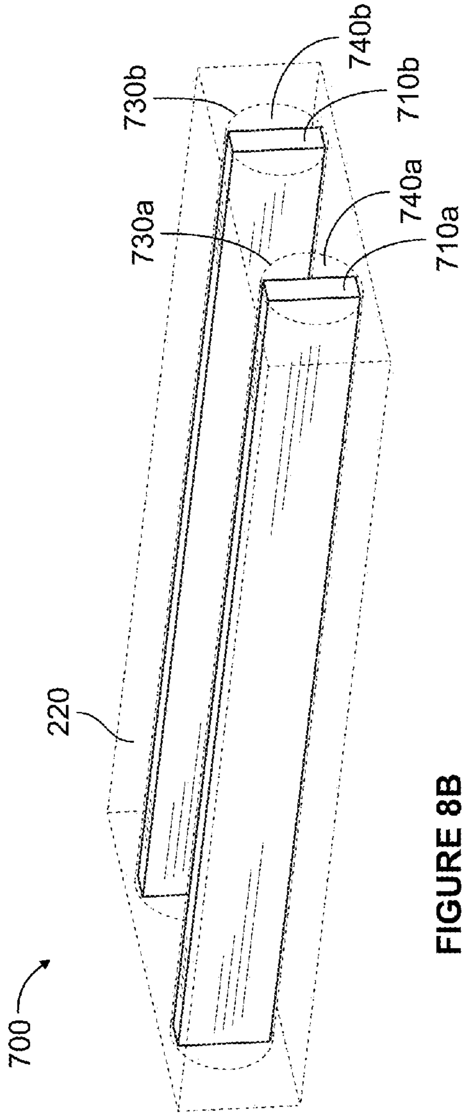
FIG. 8B shows a second view of an apparatus with the second shape in accordance with one embodiment.

In one embodiment, different positions (e.g., associated with or defined by different locations, planes, axes, orientations, arrangements, patterns, some combination thereof, etc.) of at least one component may result in different shapes of an apparatus (e.g., 200). For example, an apparatus (e.g., 200) may be bent or shaped into an arc (or another shape) responsive to configuring or setting at least one component (e.g., 710*a* of FIGS. 7A through 8B, 710*b* of FIGS. 7A through 8B, etc.) in a first position (e.g., as shown in FIGS. 7A and 7B), whereas the apparatus (e.g., 200) may be flattened responsive to configuring or setting the at least one component (e.g., 710*a*, 710*b*, etc.) in a second position (e.g., as shown in FIGS. 8A and 8B). In this manner, the shape of apparatus 200 (or a vehicle, or at least one vehicle portion, including or implemented by apparatus 200) may be configured, determined, altered, etc. based on the position of at least one component.

FIG. 7A shows a first view of apparatus 700 with a first shape in accordance with one embodiment of the present invention, whereas FIG. 7B shows a second view of apparatus 700 with the first shape in accordance with one embodiment of the present invention. FIG. 8A shows a first view of apparatus 700 with a second shape in accordance with one embodiment of the present invention, whereas FIG. 8B shows a second view of apparatus 700 with the second shape in accordance with one embodiment of the present invention. In one embodiment, apparatus 700 may be, or be used to implement, a vehicle or at least one portion of a vehicle.

As shown in FIGS. 7A, 7B, 8A, and 8B, component 710*a* and/or component 710*b* may be implemented using and/or operate similarly to component 210. For example, component 710*a* may be disposed within opening or channel 730*a* defined at least partially within at least one layer 220. At least one component 710*a* may be at least partially surrounded or enclosed by element 740*a* in one embodiment, where element 740*a* may be implemented using and/or operate similarly to element 240 in one embodiment. As another example, component 710*b* may be disposed within opening or channel 730*b* defined at least partially within at least one layer 220. At least one component 710*b* may be at least partially surrounded or enclosed by element 740*b* in one embodiment, where element 740*b* may be implemented using and/or operate similarly to element 240 in one embodiment.

In one embodiment, the at least one component (e.g., 710*a*, 710*b*, etc.) may have the shape of an arc (e.g., similar to the shape shown in FIGS. 7A and 7B, with a different radius or diameter, etc.), or be alternatively shaped, in its natural or relaxed state (e.g., as a result of manufacturing or forming the at least one component in an arc or other shape). As such, the apparatus (e.g., 700) may be bent or shaped into an arc responsive to configuring or positioning at least one component in the first position (e.g., as shown in FIGS. 7A and 7B). In this manner, the shape of the apparatus (e.g., 700) may be changed or determined by internal forces or moments (e.g., acting on one or more layers of the apparatus, acting on other components of the apparatus, etc.) caused by the at least one component itself. In one embodiment, the shape of the apparatus (e.g., 700) may also be caused or influenced by one or more external forces or moments acting on the apparatus and/or at least one component (e.g., 210, 710*a*, 710*b*, 1410 of FIG. 14 and/or FIG. 15, 1610 of FIG. 16, 1710 of FIG. 17, etc.), and therefore, the shape of the apparatus (e.g., 700) may be caused by one or more external forces or moments (e.g., caused by the weight of the rider of the apparatus, caused by a fluid or matter in contact with the apparatus, caused by another surface or object, etc.) acting on the apparatus (e.g., 700) and/or at least one component (e.g., 710*a*, 710*b*, etc.) in conjunction with one or more internal forces or moments (e.g., caused by the at least one component itself).

In one embodiment, placing the at least one component (e.g., 710*a*, 710*b*, etc.) in the second position (e.g., as shown in FIGS. 8A and 8B) may cause the respective internal forces or moments of each component to cancel or counteract one another. The internal forces or moments may be caused by the internal stresses of the at least component when straightened as shown in FIGS. 8A and 8B. As such, the bending of the at least one component may be reduced (e.g., responsive to placing the at least one component in the second position as depicted in FIGS. 8A and 8B), thereby reducing the bending or alternative change in shape of the apparatus (e.g., 700) including the at least one component. In one embodiment, placing the at least one component in the second position (e.g., as shown in FIGS. 8A and 8B) may cause the apparatus (e.g., 700) to assume a flat or substantially flat shape.

In one embodiment, layers of apparatus 700 may slide or move with respect to one another (e.g., responsive to a movement, bending, twisting, change in shape, etc. of apparatus 700). In one embodiment, layers of apparatus 700 may be fixed or not move with respect to one another (e.g., responsive to a movement, bending, twisting, change in shape, etc. of apparatus 700).

In one embodiment, a plurality of components (e.g., 210, 710*a*, 710*b*, 1410 of FIG. 14 and/or FIG. 15, 1610 of FIG. 16, 1710 of FIG. 17, etc.) of an apparatus (e.g., 100*b*, 100*c*, 100*d*, 200, 700, 900, 1200, 1400, 1500, 1600, 1700, 1800, 1900, 2000, 2100, 2200, 2300, etc.) may be configured contemporaneously (e.g., using the same mechanism, the same magnet or set of magnets, etc.). In this manner, at least one property (e.g., e.g., bending stiffness or rigidity, torsional stiffness or rigidity, at least one vibration characteristic, shape, etc.) of an apparatus (or a vehicle, or at least one vehicle portion, including or implemented by the apparatus) may be set or changed more efficiently (e.g., since a plurality of components can be configured contemporaneously and each component need not be individually configured) and the overall cost of the apparatus (or a vehicle, or at least one vehicle portion, including or implemented by the apparatus) can be reduced (e.g., by reducing the number of mechanisms or components used to configure the plurality of components).

Alternatively, one or more components (e.g., 210, 710*a*, 710*b*, 1410 of FIG. 14 and/or FIG. 15, 1610 of FIG. 16, 1710 of FIG. 17, etc.) may be configured, controlled, adjusted, etc. independently or individually (e.g., using at least one respective mechanism or component to configure each component or set of components). In this manner, the configurability of the apparatus (or at least one portion thereof) may be increased by allowing, for example, one portion of the apparatus to be configured independently of another portion of the apparatus. And in one embodiment, a plurality of components may be configured contemporaneously (e.g., using the same mechanism or component) while at least one other component may be configured independently (e.g., using another mechanism or component) from the plurality of components.

Figure 9A:
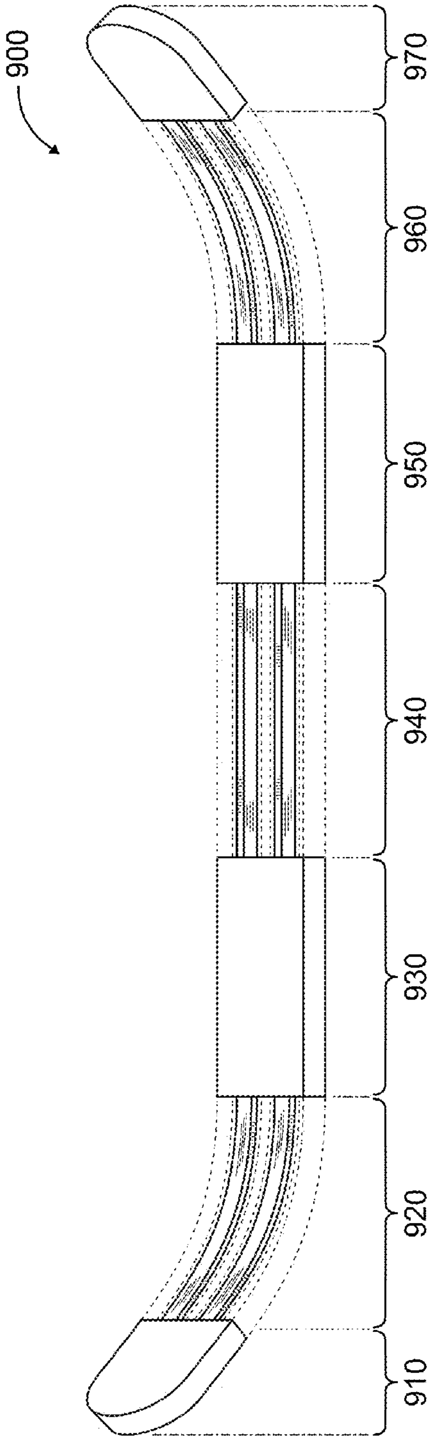
FIG. 9A shows a first view of a first configuration of an apparatus in accordance with one embodiment.
Figure 9B:
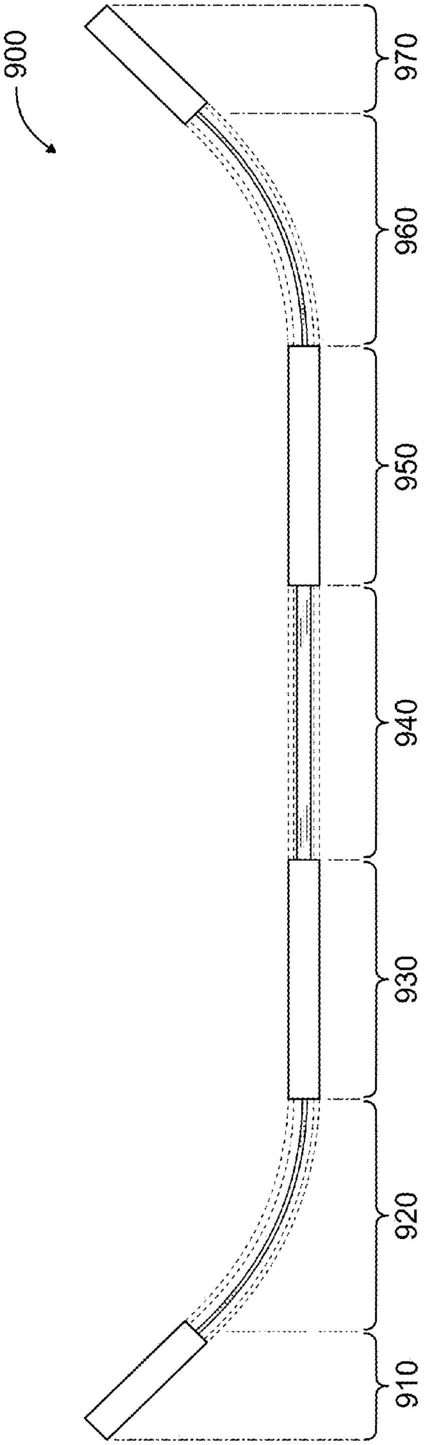
FIG. 9B shows a second view of a first configuration of an apparatus in accordance with one embodiment.

FIG. 9A shows a first view of a first configuration of apparatus 900 in accordance with one embodiment of the present invention, whereas FIG. 9B shows a second view of a first configuration of apparatus 900 in accordance with one embodiment of the present invention. In one embodiment, apparatus 900 may be, or be used to implement, a vehicle or at least one portion of a vehicle.

As shown in FIGS. 9A and 9B, apparatus 900 includes portion 910, portion 920, portion 930, portion 940, portion 950, portion 960, and portion 970. In one embodiment, at least one portion of apparatus 900 (e.g., portion 920, portion 940, portion 960, etc.) may include at least one component (e.g., 210, 710*a*, 710*b*, 1410 of FIG. 14 and/or FIG. 15, 1610 of FIG. 16, 1710 of FIG. 17, etc.) allowing at least one property (e.g., resistance to bending, resistance to torsion, at least one vibration characteristic, shape, some combination thereof, etc.) of the at least one portion to be determined, configured, altered, etc. And in one embodiment, at least one portion of apparatus 900 (e.g., portion 920, portion 940, portion 960, etc.) may include or be implemented using at least one apparatus (e.g., 100*a*, 100*b*, 100*c*, 100*d*, 200, 700, 1200 of FIG. 12, 1400 of FIG. 14, 1500 of FIG. 15, 1600 of FIG. 16, 1700 of FIG. 17, 1800 of FIG. 18, 1900 of FIG. 19, 2000 of FIG. 20, 2100 of FIG. 21, 2200 of FIG. 22, 2300 of FIG. 23, etc.).

As shown in FIGS. 9A and 9B, at least one respective component of portions 920 and 960 of apparatus 900 may provide portions 920 and 960 with a concave-up shape or a "rocker" configuration. In one embodiment, the concave-up shape or "rocker" configuration may be provided or implemented by placing the at least one respective component of portions 920 and 960 in a first position (e.g., as depicted in FIG. 2A, 3A, 3B, 5A, 5B, 7A, 7B, etc.).

At least one component of portion 940 of apparatus 900 may provide portion 940 with a flat or substantially flat shape. In one embodiment, the flat or substantially flat shape may be provided or implemented by placing the at least one component of portion 940 in a second position (e.g., as depicted in FIG. 2B, 4A, 4B, 6A, 6B, 8A, 8B, etc.).

In one embodiment, layers of apparatus 900 may slide or move with respect to one another (e.g., responsive to a movement, bending, twisting, change in shape, etc. of apparatus 900). In one embodiment, layers of apparatus 900 may be fixed or not move with respect to one another (e.g., responsive to a movement, bending, twisting, change in shape, etc. of apparatus 900).

Figure 10A:
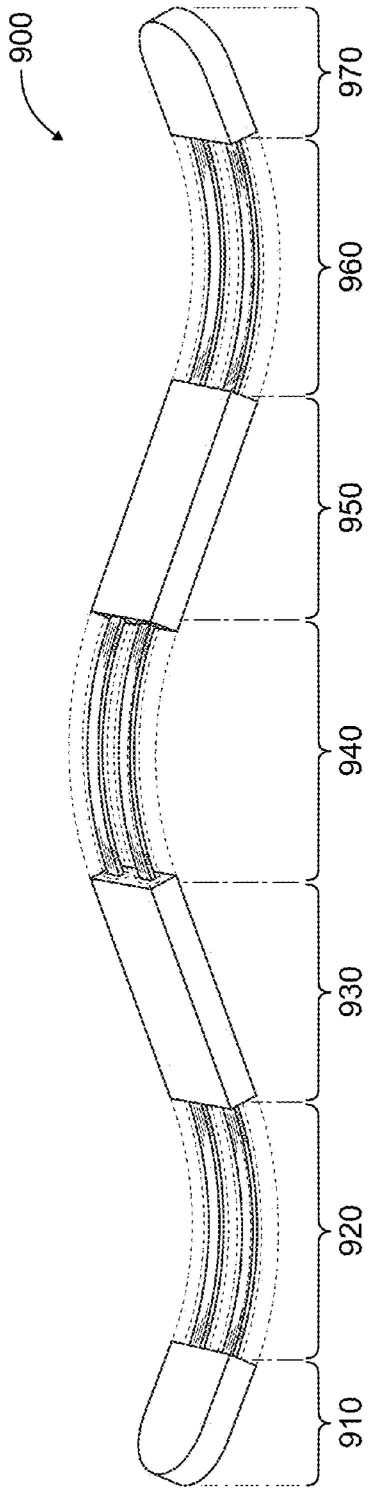
FIG. 10A shows a first view of a second configuration of an apparatus in accordance with one embodiment.
Figure 10B:
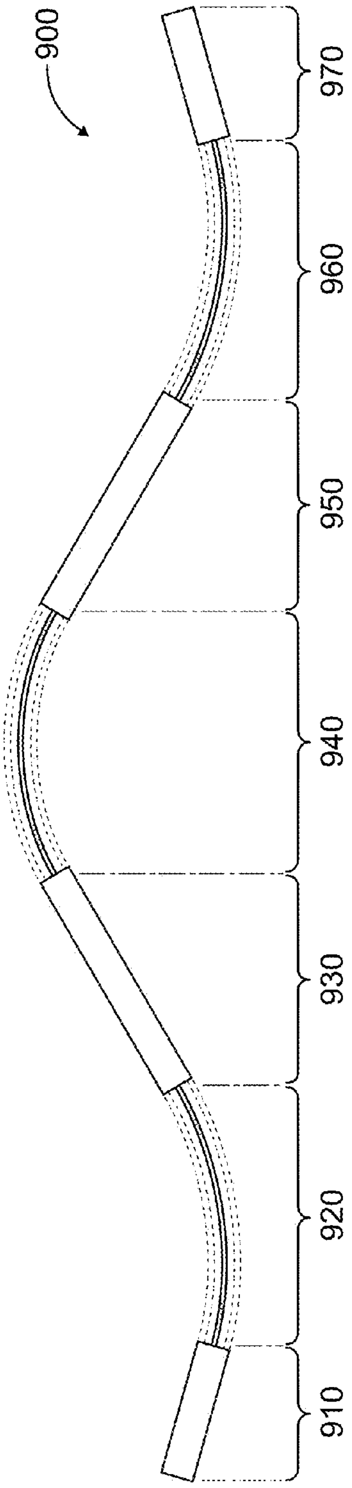
FIG. 10B shows a second view of a second configuration of an apparatus in accordance with one embodiment.

FIG. 10A shows a first view of a second configuration of apparatus 900 in accordance with one embodiment of the present invention, whereas FIG. 10B shows a second view of a second configuration of apparatus 900 in accordance with one embodiment of the present invention. As shown in FIGS. 10A and 10B, at least one respective component of portions 920 and 960 of apparatus 900 may provide portions 920 and 960 with a concave-up shape or a "rocker" configuration. In one embodiment, the concave-up shape or "rocker" configuration may be provided or implemented by placing the at least one respective component of portions 920 and 960 in a first position (e.g., as depicted in FIG. 2A, 3A, 3B, 5A, 5B, 7A, 7B, etc.).

At least one component of portion 940 of apparatus 900 may provide portion 940 with a concave-down shape or a "camber" configuration. In one embodiment, the concave-down shape or "camber" configuration may be provided or implemented by placing the at least one component of portion 940 in a third position (e.g., similar to the first position as depicted in FIG. 2B, 4A, 4B, 6A, 6B, 8A, 8B, etc., but rotated approximately 180 degrees).

Figure 11A:
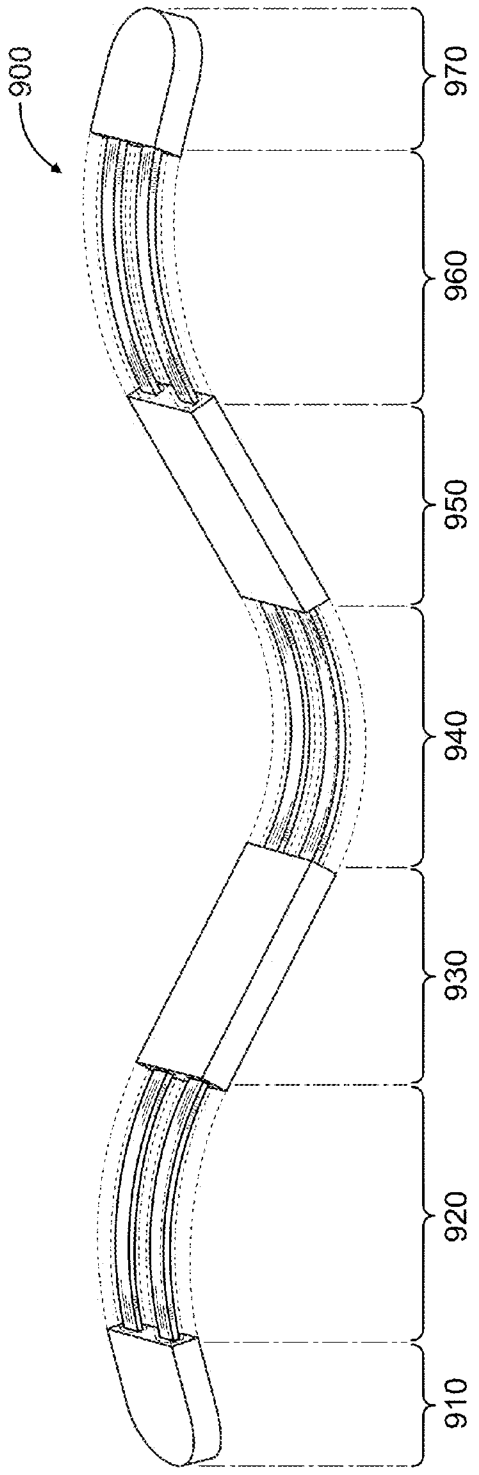
FIG. 11A shows a first view of a third configuration of an apparatus in accordance with one embodiment.
Figure 11B:
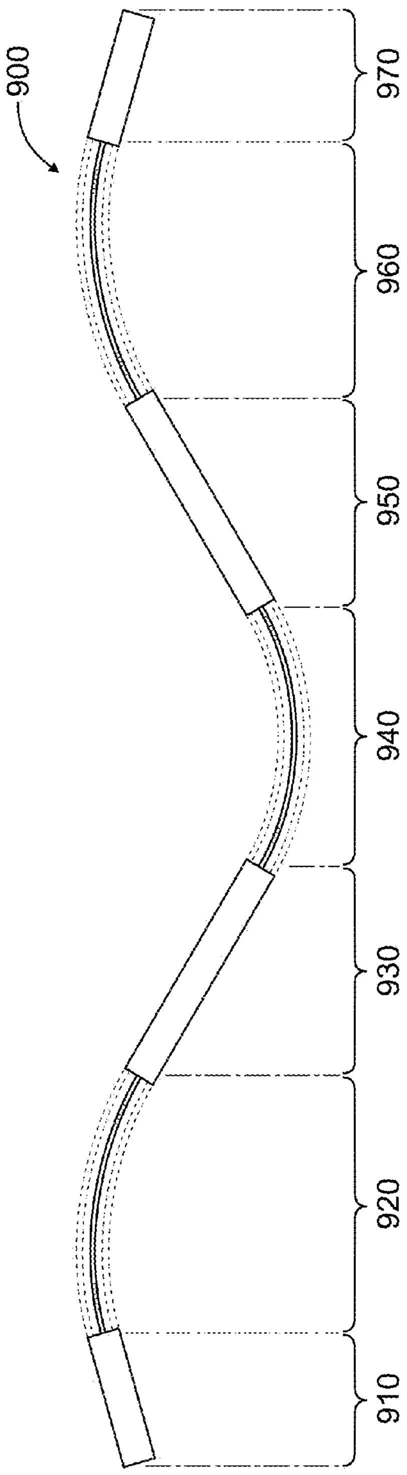
FIG. 11B shows a second view of a third configuration of an apparatus in accordance with one embodiment.

FIG. 11A shows a first view of a third configuration of apparatus 900 in accordance with one embodiment of the present invention, whereas FIG. 11B shows a second view of a third configuration of apparatus 900 in accordance with one embodiment of the present invention. As shown in FIGS. 11A and 11B, at least one respective component of portions 920 and 960 of apparatus 900 may provide portions 920 and 960 with a concave-down shape or a "camber" configuration. In one embodiment, the concave-down shape or "camber" configuration may be provided or implemented by placing the at least one respective component of portions 920 and 960 in a third position (e.g., similar to the first position as depicted in FIG. 2B, 4A, 4B, 6A, 6B, 8A, 8B, etc., but rotated approximately 180 degrees).

At least one component of portion 940 of apparatus 900 may provide portion 940 with a concave-up shape or a "rocker" configuration. In one embodiment, the concave-up shape or "rocker" configuration may be provided or implemented by placing the at least one component of portion 940 in a first position (e.g., as depicted in FIG. 2A, 3A, 3B, 5A, 5B, 7A, 7B, etc.).

In one embodiment, FIGS. 9A, 9B, 10A, 10B, 11A and/or 11C may depict a cross-section of apparatus 900 taken using a plane extending along the length of apparatus 900. In one embodiment, FIGS. 9A, 9B, 10A, 10B, 11A and/or 11C may depict a cross-section of apparatus 900 taken using a plane extending along the width of apparatus 900. And in one embodiment, FIGS. 9A, 9B, 10A, 10B, 11A and/or 11C may depict a cross-section of apparatus 900 taken using a plane that alternatively intersects apparatus 900.

In one embodiment, at least two portions of apparatus 900 may be discrete. For example, at least two portions (e.g., 910, 920, 930, 940, 950, 960, 970, some combination thereof, etc.) may be manufactured separately and then joined to form apparatus 900.

Alternatively, at least two portions of apparatus 900 may be integrated. For example, at least one layer of apparatus 900 may include the at least two portions, where the at least two portions can be distinguished from one another by one or more features (e.g., each portion includes a different component or set of components, one portion is configured to accept a binding or boot whereas another portion is not, the respective properties of each portion can be individually or independently configured, etc.). As another example, portions of apparatus 900 that were manufactured separately may be integrated during manufacture or assembly of apparatus 900 (e.g., by applying at least one layer or other object over two or more portions so that they appear or function as one portion, etc.). As yet another example, portions of apparatus 900 that were manufactured separately may be integrated during manufacture or assembly of the apparatus by coupling at least one other object (e.g., a metal edge or rail, at least one other layer, a graphic or design, etc.) to the portions. In one embodiment, a metal edge or rail may be applied or coupled with a plurality of portions (e.g., 910, 920, 930, 940, 950, 960, 970, some combination thereof, etc.) of the apparatus 900, where the metal edge or rail may extend continuously along the plurality of portions.

In one embodiment, at least one layer of apparatus 900 (e.g., of one or more portions of apparatus 900 that include at least one component, coupled with or overlapping one or more portions of apparatus 900 that include at least one component, etc.) may include at least one graphic and/or at least one design. In one embodiment, the at least one graphic and/or at least one design may include at least one image, and therefore, the at least one layer of apparatus 900 may be or include at least one image-bearing layer. The at least one layer of apparatus 900 may be made of plastic or some other material (e.g., metal, wood, carbon fiber, a composite material, etc.).

In one embodiment, at least one layer of apparatus 900 (e.g., of one or more portions of apparatus 900 that include at least one component, coupled with or overlapping one or more portions of apparatus 900 that include at least one component, etc.) may be configured to interface with at least one binding (e.g., for accepting a boot, foot, etc.), at least one boot, at least one shoe, at least one foot, etc. In one embodiment, the at least one layer of apparatus 900 may: include a first surface (e.g., a top surface, another surface, etc.) defining at least one feature for increasing friction between the first surface and another object (e.g., a binding, a boot, a shoe, a user's foot, etc.); be configured to interface with grip tape or some other material for roughening or patterning of the first surface; etc.

In one embodiment, at least one layer of apparatus 900 (e.g., of one or more portions of apparatus 900 that include at least one component, coupled with or overlapping one or more portions of apparatus 900 that include at least one component, etc.) may include a second surface (e.g., a bottom surface, another surface, etc.) configured to glide or move across a fluid (e.g., water, another liquid or fluid, etc.) or another surface (e.g., snow, the ground, dirt, rocks, pavement, asphalt, etc.). The at least one layer of apparatus 900 may be configured to interface with an apparatus (e.g., a truck of a skateboard, a fin, an apparatus including at least one wheel, etc.) in one embodiment.

Figure 12:
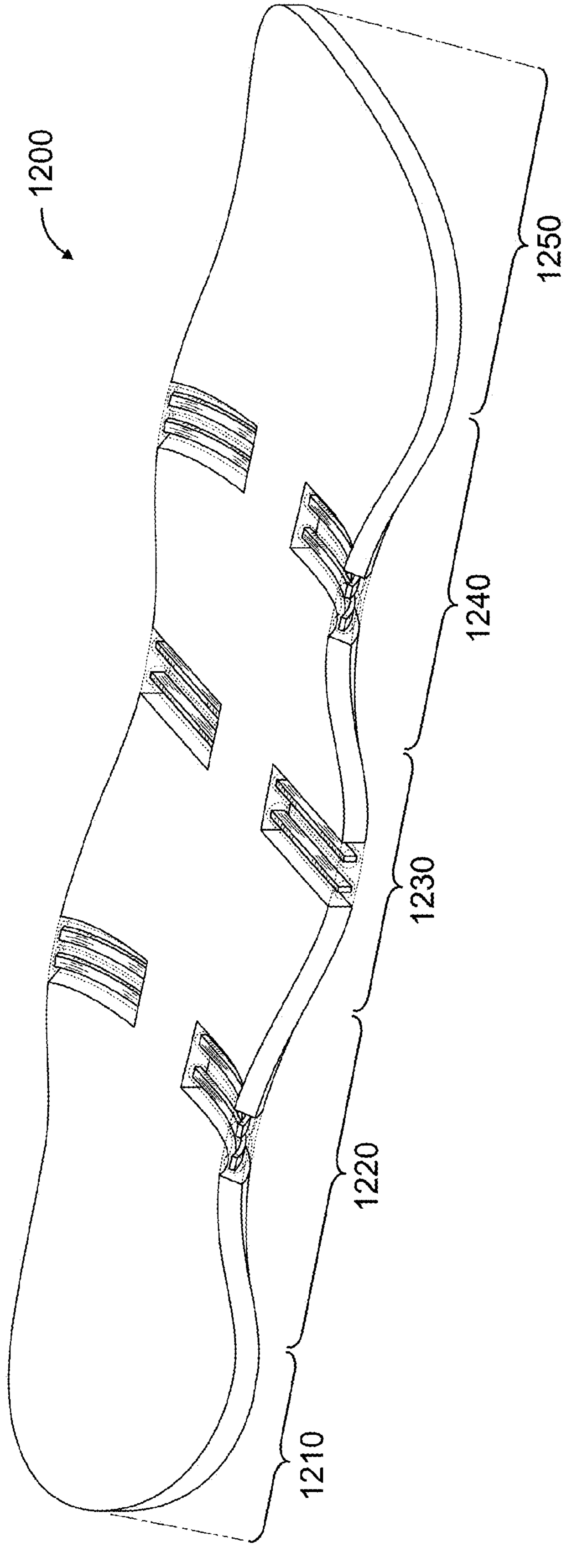
FIG. 12 shows an exemplary apparatus including a plurality of components in accordance with one embodiment.

FIG. 12 shows exemplary apparatus 1200 including a plurality of components in accordance with one embodiment of the present invention. In one embodiment, apparatus 1200 may be, or be used to implement, a vehicle or at least one portion of a vehicle.

As shown in FIG. 12, apparatus 1200 may include portions 1210, portion 1220, portion 1230, portion 1240, and portion 1250. In one embodiment, at least one portion of apparatus 1200 (e.g., portion 1220, portion 1230, portion 1240, etc.) may include at least one component (e.g., 210, 710*a*, 710*b*, 1410 of FIG. 14 and/or FIG. 15, 1610 of FIG. 16, 1710 of FIG. 17, etc.) allowing at least one property (e.g., resistance to bending, resistance to torsion, at least one vibration characteristic, shape, some combination thereof, etc.) of the at least one portion to be determined, configured, altered, etc. And in one embodiment, at least one portion of apparatus 1200 (e.g., portion 1220, portion 1230, portion 1240, etc.) may include or be implemented using at least one apparatus (e.g., 100*a*, 100*b*, 100*c*, 100*d*, 200, 700, 900, 1400 of FIG. 14, 1500 of FIG. 15, 1600 of FIG. 16, 1700 of FIG. 17, 1800 of FIG. 18, 1900 of FIG. 19, 2000 of FIG. 20, 2100 of FIG. 21, 2200 of FIG. 22, 2300 of FIG. 23, etc.).

At least one respective component of portions 1220 and 1240 may provide portions 1220 and 1240 with a concave-up shape and/or raise the edges of portions 1220 and 1240. In one embodiment, the concave-up shape and/or the raised edges may be provided or implemented by setting the at least one respective component of portions 1220 and 1240 in a first position (e.g., as depicted in FIG. 2A, 3A, 3B, 5A, 5B, 7A, 7B, etc.).

At least one component of portion 1230 of apparatus 1200 may provide portion 1230 with a flat shape (or substantially flat shape) and/or offset the edges of portion 1230 from the edges of at least one other portion of apparatus 1200 (e.g., portion 1220, portion 1240, etc.). In one embodiment, the flat or substantially flat shape and/or the offset edges may be provided or implemented by setting the at least one component of portion 1230 in a second position (e.g., as depicted in FIG. 2B, 4A, 4B, 6A, 6B, 8A, 8B, etc.).

Although FIG. 12 shows the apparatus with a particular shape created by a particular configuration of components, it should be appreciated that the components may be alternatively configured to change the shape of the apparatus. For example, the components of portions 1220 and/or 1240 may be set in the second position (e.g., as depicted in FIG. 2B, 4A, 4B, 6A, 6B, 8A, 8B, etc.) to provide portions 1220 and/or 1240 with a flat shape (or substantially flat shape) and/or lower the edges of portions 1220 and/or 1240. As another example, at least one component of portion 1230 may be set in the first position (e.g., as depicted in FIG. 2A, 3A, 3B, 5A, 5B, 7A, 7B, etc.) to provide portion 1230 with a concave-up shape and/or raise the edges of portion 1230. As yet another example, one or more of the components (e.g., of portion 1220, of portion 1230, of portion 1240, some combination thereof, etc.) may be placed in a third position (e.g., similar to the first position as depicted in FIG. 2B, 4A, 4B, 6A, 6B, 8A, 8B, etc., but rotated approximately 180 degrees) to provide one or more portions of apparatus 1200 with a concave-down shape and/or further lower the edges of apparatus 1200 in one embodiment.

In one embodiment, at least two portions of apparatus 1200 may be discrete. For example, at least two portions (e.g., 1210, 1220, 1230, 1240, 1250, some combination thereof, etc.) may be manufactured separately and then joined to form apparatus 1200 (or a portion thereof).

Alternatively, at least two portions of apparatus 1200 may be integrated. For example, at least one layer of apparatus 1200 may include the at least two portions, where the at least two portions can be distinguished from one another by one or more features (e.g., each portion includes a different component or set of components, one portion is configured to accept a binding or boot whereas another portion is not, the respective properties of each portion can be individually or independently configured, etc.). As another example, portions of apparatus 1200 that were manufactured separately may be integrated during manufacture or assembly of apparatus 1200 (e.g., by applying at least one layer or other object over two or more portions so that they appear or function as one portion, etc.). As yet another example, portions of apparatus 1200 that were manufactured separately may be integrated during manufacture or assembly of the apparatus by coupling at least one other object (e.g., a metal edge or rail, another layer, a graphic or design, etc.) to the portions. In one embodiment, a metal edge or rail may be applied or coupled with a plurality of portions (e.g., 1210, 1220, 1230, 1240, 1250, some combination thereof, etc.) of the apparatus 1200, where the metal edge or rail may extend continuously along the plurality of portions.

In one embodiment, at least one layer of apparatus 1200 (e.g., of one or more portions of apparatus 1200 that include at least one component, coupled with or overlapping one or more portions of apparatus 1200 that include at least one component, etc.) may include at least one graphic and/or at least one design. In one embodiment, the at least one graphic and/or at least one design may include at least one image, and therefore, the at least one layer of apparatus 1200 may be or include at least one image-bearing layer. The at least one layer of apparatus 1200 may be made of plastic or some other material (e.g., metal, wood, carbon fiber, a composite material, etc.).

In one embodiment, at least one layer of apparatus 1200 (e.g., of one or more portions of apparatus 1200 that include at least one component, coupled with or overlapping one or more portions of apparatus 1200 that include at least one component, etc.) may be configured to interface with at least one binding (e.g., for accepting a boot, foot, etc.), at least one boot, at least one shoe, at least one foot, etc. In one embodiment, the at least one layer of apparatus 1200 may: include a first surface (e.g., a top surface, another surface, etc.) defining at least one feature for increasing friction between the first surface and another object (e.g., a binding, a boot, a shoe, a user's foot, etc.); be configured to interface with grip tape or some other material for roughening or patterning of the first surface; etc.

In one embodiment, at least one layer of apparatus 1200 (e.g., of one or more portions of apparatus 1200 that include at least one component, coupled with or overlapping one or more portions of apparatus 1200 that include at least one component, etc.) may include a second surface (e.g., a bottom surface, another surface, etc.) configured to glide or move across a fluid (e.g., water, another liquid or fluid, etc.) or another surface (e.g., snow, the ground, dirt, rocks, pavement, asphalt, etc.). The at least one layer of apparatus 1200 may be configured to interface with an apparatus (e.g., a truck of a skateboard, a fin, an apparatus including at least one wheel, etc.) in one embodiment.

In one embodiment, layers of apparatus 1200 may slide or move with respect to one another (e.g., responsive to a movement, bending, twisting, change in shape, etc. of apparatus 1200). In one embodiment, layers of apparatus 1200 may be fixed or not move with respect to one another (e.g., responsive to a movement, bending, twisting, change in shape, etc. of apparatus 1200).

Although one or more of the preceding Figures depict components, structures, etc. of an apparatus (e.g., 100*a*, 100*b*, 100*c*, 100*d*, 200, 700, 900, 1200, etc.) with certain shapes and sizes, it should be appreciated that the components, structures, etc. are exemplary and the components, structures, etc. may be of any shape and/or size in other embodiments. For example, at least one component may have a different cross-sectional shape such as an I-beam, a C-channel, a T-beam, a tube, another shape, etc. Additionally, although one or more components have been described with respect to a specific number of positions (e.g., two, three, etc.) allowing configuration, determination, alteration, etc. of at least one property of an apparatus (or at least one portion thereof), it should be appreciated that any number of positions may be utilized to allow configuration, determination, alteration, etc. of any number of properties.

Figure 13:
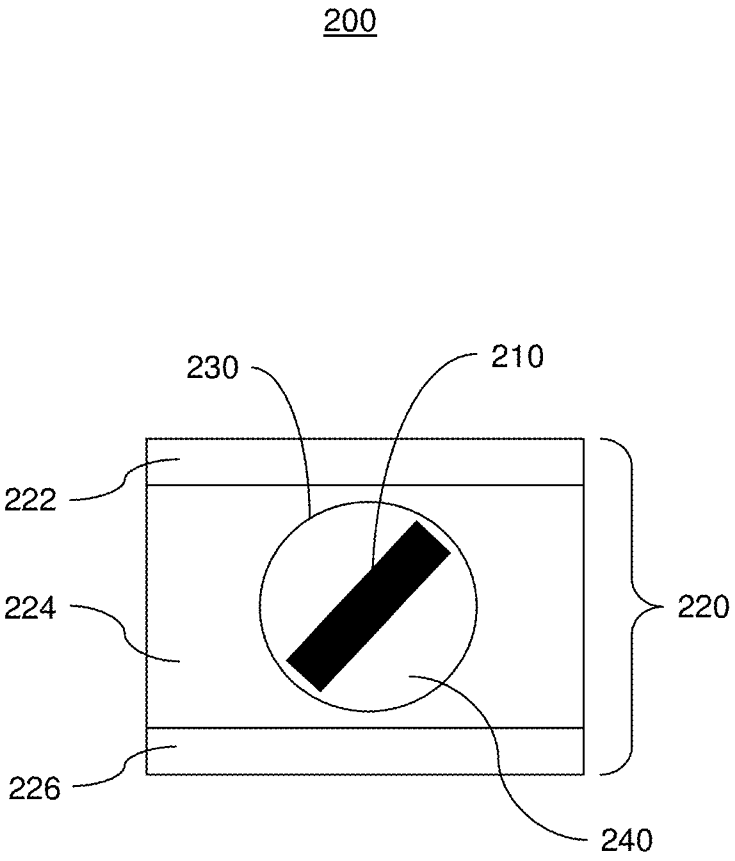
FIG. 13 shows an apparatus including at least one component in an intermediate position in accordance with one embodiment.

FIG. 13 shows apparatus 200 including at least one component 210 in an intermediate position in accordance with one embodiment of the present invention. The intermediate position (or at least one other position) may provide apparatus 200 (and/or any vehicle or vehicle portion including or implemented using apparatus 200) with at least one value of at least one property (e.g., resistance to bending, resistance to torsion, at least one vibration characteristic, shape, some combination thereof, etc.) that is different from at least one value of at least one property associated with another position (e.g., the first position depicted in FIG. 2A, the second position depicted in FIG. 2B, etc.). For example, Table 1 shows an exemplary listing of respective property values for a first position (e.g., as depicted in FIG. 2A, 3A, 3B, 5A, 5B, 7A, 7B, etc.), a second position (e.g., as depicted in FIG. 2B, 4A, 4B, 6A, 6B, 8A, 8B, etc.), and an intermediate position (e.g., as depicted in FIG. 13).

TABLE 1

| Property | Position 1 | Position 2 | Intermediate Position |
|---|---|---|---|
| Bending | High | Low | Medium |
| Torsion | High | Low | Medium |
| Vibration Damping | Low | High | Medium |
| Shape | Arc | Flat | Slight Arc |

It should be appreciated that the information depicted in Table 1 is merely exemplary, and therefore, may be different in other embodiments. For example, a different number, type, combination of types, etc. of properties may be included in Table 1 in other embodiments. As another example, a different number, type, combination of types, etc. of attributes (e.g., at least one attribute other than position such as pressure, temperature, a property of an applied magnetic field, some combination thereof, etc.) may be included in Table 1 in other embodiments. As yet another example, although the values are depicted as levels (e.g., low, medium, high, etc.) and using words (e.g., arc, flat, slight arc, etc.) in Table 1, the values may be expressed as numbers (e.g., a range, specific numbers, etc.), percentages, some combination thereof, etc. in other embodiments.

Although one or more of the preceding Figures depict a specific number and/or arrangement of components, structures, etc. of an apparatus (e.g., 100*a*, 100*b*, 100*c*, 100*d*, 200, 700, 900, 1200, etc.), it should be appreciated that the number and/or arrangement of the components, structures, etc. are exemplary and the number and/or arrangement components, structures, etc. may be different in other embodiments. For example, apparatus 200 and/or apparatus 700 may include any number and/or arrangement of components (e.g., 210, 710*a*, 710*b*, 1410 of FIG. 14 and/or FIG. 15, 1610 of FIG. 16, 1710 of FIG. 17, etc.) in other embodiments. As another example, apparatus 900 and/or apparatus 1200 may include any number and/or arrangement of components (e.g., 210, 710*a*, 710*b*, 1410 of FIG. 14 and/or FIG. 15, 1610 of FIG. 16, 1710 of FIG. 17, etc.), any number and/or arrangement of apparatuses (e.g., 100*a*, 100*b*, 100*c*, 100*d*, 200, 700, etc.), etc. in other embodiments.

Although one or more components, structures, etc. of an apparatus (e.g., 100*a*, 100*b*, 100*c*, 100*d*, 200, 700, 900, 1200, etc.) are described with specific features, it should be appreciated that the components, structures, etc. are exemplary and that the components, structures, etc. may have different features in other embodiments. For example, at least one apparatus (e.g., 200, 700, etc.) may include at least one component (e.g., 210, 710*a*, 710*b*, etc.) without a corresponding element (e.g., 240, 740*a*, 740*b*, etc.), and therefore, each component of the at least one component (e.g., 210, 710*a*, 710*b*, etc.) may be disposed in a respective opening or channel (e.g., 230, 730*a*, 730*b*, etc.) without a respective element (e.g., 240, 740*a*, 740*b*, etc.) in one embodiment. As another example, one or more of the apparatuses (e.g., 100*a*, 100*b*, 100*c*, 100*d*, 200, 700, 900, 1200, etc.) may include at least one component (e.g., 210, 710*a*, 710*b*, 1410 of FIG. 14 and/or FIG. 15, 1610 of FIG. 16, 1710 of FIG. 17, etc.) that can be configured by adjusting or setting one or more types of attributes (e.g., a position, a pressure, a temperature, a property of a magnetic field, a current, a voltage, a duty cycle, a property of a pulse-width modulated signal, some combination thereof, etc.) in other embodiments.

In one embodiment, one or more of the apparatuses (e.g., 100*a*, 100*b*, 100*c*, 100*d*, 200, 700, 900, 1200, etc.) may include a different number and/or arrangement of portions including at least one component in other embodiments. For example, apparatus 900 may include more or less than three portions (e.g., 920, 940, 960, etc.) that include at least one respective component (e.g., 210, 710*a*, 710*b*, 1410 of FIG. 14 and/or FIG. 15, 1610 of FIG. 16, 1710 of FIG. 17, etc.) in other embodiments. As another example, apparatus 1200 may include more or less than three portions (e.g., 1220, 1230, 1240, etc.) that include at least one respective component (e.g., 210, 710*a*, 710*b*, 1410 of FIG. 14 and/or FIG. 15, 1610 of FIG. 16, 1710 of FIG. 17, etc.) in other embodiments. As a further example, apparatus 1200 may include at least one component (e.g., 210, 710*a*, 710*b*, 1410 of FIG. 14 and/or FIG. 15, 1610 of FIG. 16, 1710 of FIG. 17, similar to that of portion 920 of apparatus 900, similar to that of portion 940 of apparatus 900, similar to that of portion 960 of apparatus 900, etc.) that is capable of changing or setting the shape of at least one portion of apparatus 1200 (e.g., to provide at least one portion of apparatus 1200 with a rocker shape or configuration, a camber shape or configuration, some combination thereof, etc.) and/or capable of changing or setting at least one other property (e.g., bending stiffness, torsional stiffness, at least one vibration characteristic, some other property, etc.) of at least one portion of apparatus 1200 in other embodiments.

Figure 14:
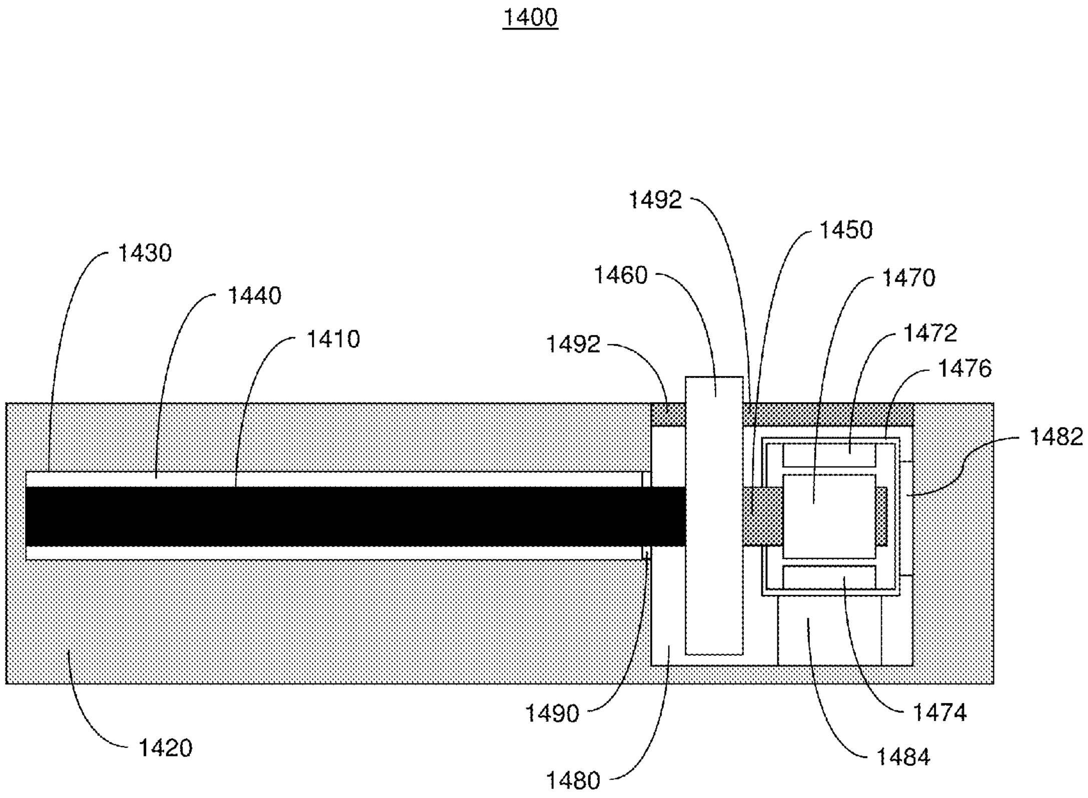
FIG. 14 shows an apparatus for positioning at least one component in accordance with one embodiment.

FIG. 14 shows apparatus 1400 for positioning at least one component in accordance with one embodiment of the present invention. In one embodiment, apparatus 1400 may be, or be used to implement, a vehicle or at least one portion of a vehicle.

As shown in FIG. 14, at least one component 1410 and/or element 1440 may be disposed at least partially within opening or channel 1430, where the at least one component 1410 and/or element 1440 may be coupled with shaft 1450 and/or knob 1460. Opening or channel 1430 may be defined in or by at least one layer 1420. In one embodiment, knob 1460 may couple at least one component 1410 with shaft 1450. In one embodiment, shaft 1450 may be coupled with at least one rotor 1470, where at least one rotor 1470 and at least one stator (e.g., 1472, 1474, etc.) may form a motor (e.g., a stepper motor, a servo motor, a motor including at least one brush, a brushless motor, some combination thereof, etc.). In this manner, at least one component 1410 and/or element 1440 may be positioned (or repositioned) by rotating or otherwise changing the position of knob 1460 (e.g., manually, automatically, some combination thereof, etc.), by rotating or otherwise changing the position of shaft 1450 (e.g., using at least one rotor 1470 and/or at least one stator 1472, using at least one rotor 1470 and/or at least one stator 1474, by powering or activating the motor, etc.).

In one embodiment, at least one component 1410 may be implemented by at least one component 210, at least one component 710*a*, at least one component 710*b*, some combination thereof, etc. At least one layer 1420 may be implemented by at least one layer 220 in one embodiment. In one embodiment, opening or channel 1430 may be similar to or implemented by opening or channel 230, opening or channel 730*a*, opening or channel 730*b*, some combination thereof, etc. And in one embodiment, element 1440 may be implemented by element 240, element 740*a*, element 740*b*, some combination thereof, etc.

In one embodiment, layers of apparatus 1400 may slide or move with respect to one another (e.g., responsive to a movement, bending, twisting, change in shape, etc. of apparatus 1400). In one embodiment, layers of apparatus 1400 may be fixed or not move with respect to one another (e.g., responsive to a movement, bending, twisting, change in shape, etc. of apparatus 1400).

Knob 1460 may allow manual positioning or articulation of at least one component 1410 and/or element 1440 in one embodiment. For example, knob 1460 may be rotated by a tool, a user's hand, fingers, palm, glove, foot, boot, etc.

Shaft 1450 may allow automated and/or manual positioning or articulation of at least one component 1410 and/or element 1440 in one embodiment. For example, the position of shaft 1450 may be controlled automatically by at least one other component (e.g., a control system including hardware and/or software capable of activating or powering the motor, a feedback or monitoring component indicating the current position and/or at least one other attribute of shaft 1450, some combination thereof, etc.), thereby allowing at least one component 1410 and/or element 1440 to be automatically positioned, automatically repositioned, etc. As another example, the position of shaft 1450 may be controlled manually using the motor and at least one other component (e.g., a user interface including hardware and/or software for allowing a user to control the position of shaft 1450 by activating or powering the motor), thereby allowing manual positioning and/or repositioning of at least one component 1410 and/or element 1440 via the motor.

At least one rotor 1470 and at least one stator (e.g., 1472, 1474, etc.) may be at least partially disposed in housing 1476. Housing 1476 may include at least one additional component (e.g., circuitry, brushes, bearings, some combination thereof, etc.) in one embodiment. Shaft 1450 may extend from housing 1476 in one embodiment. Housing 1476 may be secured to one or more surfaces or portions of at least one layer 1420 (e.g., at least partially within cavity 1480) using one or more mounting provisions (e.g., 1482, 1484, some combination thereof, etc.).

The one or more mounting provisions (e.g., 1482, 1484, etc.) may be separate from housing 1476 in one embodiment. The one or more mounting provisions (e.g., 1482, 1484, etc.) may be integrated with housing 1476 in one embodiment. And in one embodiment, the one or more mounting provisions (e.g., 1482, 1484, etc.) may be integrated with at least one layer 1420.

One or more seals or covers may be used to control dirt, moisture, contamination, etc. For example, seal 1490 may be used to reduce dirt, moisture, contamination, etc. in opening or channel 1430 that at least partially encloses at least one component 1410 and/or element 1440. As another example, cover 1492 may be placed over cavity 1480 (e.g., to at least partially enclose the motor, knob 1460, etc.), where cover 1492 may act as a seal to reduce dirt, moisture, contamination, etc. in cavity 1480. Cover 1492 may define an opening, where knob 1460 may extend at least partially through the opening, thereby allowing the position of at least one component 1410 and/or element 1440 to be manually adjusted while cover 1492 is in place (e.g., positioned over cavity 1480).

In one embodiment, apparatus 1400 of FIG. 14 may be assembled by first inserting at least one component 1410 and/or element 1440 into opening or channel 1430 through cavity 1480. After at least one component 1410 and/or element 1440 is in place, seal 1490 may be put into place. Knob 1460 may be placed on and secured to at least one component 1410. The motor may be lowered into cavity 1480 such that shaft 1450 is inserted in and secured to knob 1460. Housing 1476 of the motor may be secured to at least one layer 1420 via mounting provision 1482 and/or mounting provision 1484, where mounting provision 1482 and/or mounting provision 1484 may include at least one threaded insert, at least one fastener, a clip, a portion defining an opening such that housing 1476 may be strapped to at least one surface of at least one layer 1420 (e.g., in cavity 1480), etc. The motor may be electrically coupled to at least one other component (e.g., by electrically coupling a cable to the motor, by inserting a plug into a socket, etc.). Cover 1492 may then be placed over cavity 1480 and secured (e.g., using at least one fastener, a latch mechanism, at least one snap, some other mechanism capable of securing cover 1492 over cavity 1480, etc.).

Figure 15:
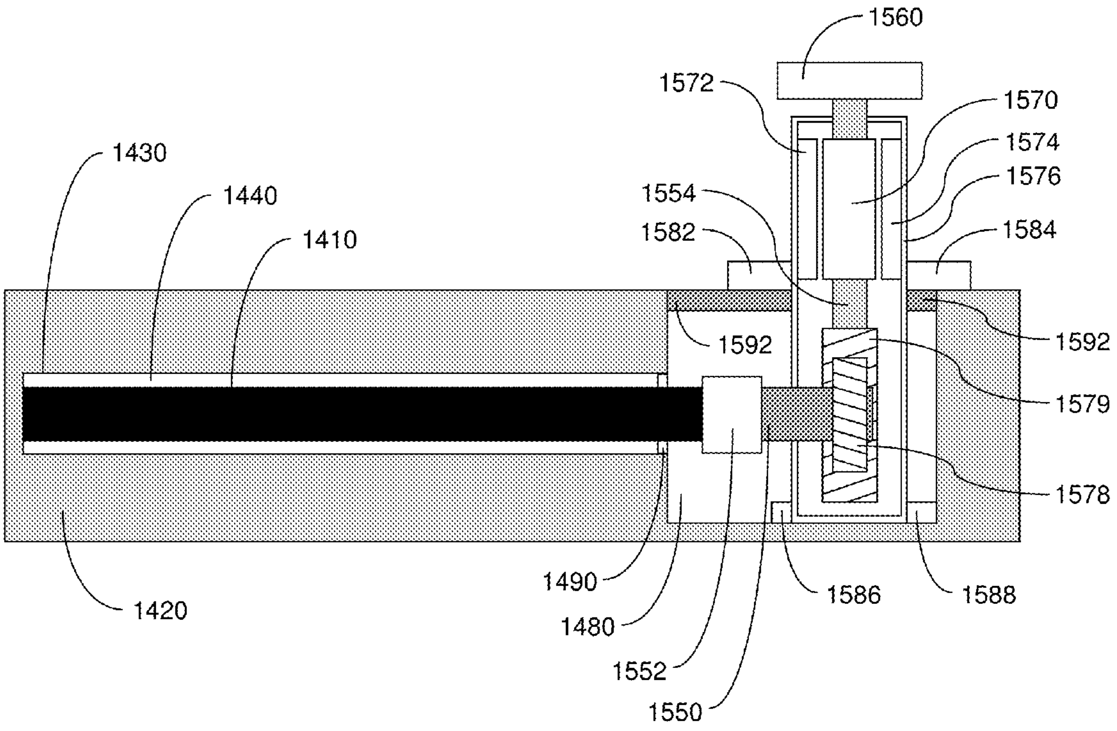
FIG. 15 shows an apparatus for positioning at least one component using at least one gear in accordance with one embodiment.

FIG. 15 shows apparatus 1500 for positioning at least one component using at least one gear in accordance with one embodiment of the present invention. In one embodiment, apparatus 1500 may be, or be used to implement, a vehicle or at least one portion of a vehicle.

Apparatus 1500 may operate similarly to apparatus 1400 of FIG. 14, except that a different motor may be used. Apparatus 1500 may include a gear assembly (e.g., including gear 1578, gear 1579, etc.) allowing shaft 1550 (coupled with at least one component 1410 via coupler 1552) and shaft 1554 (coupled with at least one rotor 1570 and/or knob 1560) to rotate about different axes (e.g., disposed at approximately 90 degrees to one another, disposed at a different angle with respect to one another, etc.). In this manner, at least one component 1410 and/or element 1440 may be positioned (or repositioned) by rotating or otherwise changing the position of knob 1560 (e.g., manually, automatically, some combination thereof, etc.), by rotating or otherwise changing the position of shaft 1550 and/or shaft 1554 (e.g., using at least one rotor 1570 and/or at least one stator 1572, using at least one rotor 1570 and/or at least one stator 1574, by powering or activating the motor, etc.).

The gear assembly (e.g., including gear 1578, gear 1579, etc.) may be or form a worm gear assembly, a bevel gear assembly, another type of gear assembly, etc. In one embodiment, the gear assembly (e.g., including gear 1578, gear 1579, etc.) may be disposed within housing 1576, and therefore, may be part of the motor. In this case, shafts 1550 and 1554 may extend from housing 1576. Alternatively, the gear assembly may be separate from and/or disposed outside of housing 1576 (e.g., in a separate housing or gear box). In this case, shaft 1554 may extend between housing 1576 and a separate housing or gearbox (e.g., that includes gear 1578 and/or gear 1579), whereas shaft 1550 may extend from the separate housing or gearbox (e.g., that includes gear 1578 and/or gear 1579).

At least one rotor 1570 and at least one stator (e.g., 1572, 1574, etc.) may be at least partially disposed in housing 1576. Housing 1576 may include at least one additional component (e.g., circuitry, brushes, bearings, some combination thereof, etc.) in one embodiment. Shaft 1550 may extend from housing 1576 in one embodiment. Housing 1576 may be secured to one or more surfaces or portions of at least one layer 1420 (e.g., at least partially within cavity 1480) using one or more mounting provisions (e.g., 1582, 1584, 1586, 1588, some combination thereof, etc.).

The one or more mounting provisions (e.g., 1582, 1584, 1586, 1588, some combination thereof, etc.) may be separate from housing 1576 in one embodiment. The one or more mounting provisions (e.g., 1582, 1584, 1586, 1588, some combination thereof, etc.) may be integrated with housing 1576 in one embodiment. And in one embodiment, the one or more mounting provisions (e.g., 1582, 1584, 1586, 1588, some combination thereof, etc.) may be integrated with at least one layer 1420.

In one embodiment, cover 1592 may have defined therein an opening allowing housing 1576 to protrude from cavity 1480. In other embodiments, housing 1576 may be contained within cavity 1480 similar to housing 1476 of FIG. 14, and therefore, shaft 1554 and/or knob 1560 may extend through cover 1592 to allow knob 1560 to be manually adjusted while cover 1592 is in place (e.g., positioned over cavity 1480).

In one embodiment, layers of apparatus 1500 may slide or move with respect to one another (e.g., responsive to a movement, bending, twisting, change in shape, etc. of apparatus 1500). In one embodiment, layers of apparatus 1500 may be fixed or not move with respect to one another (e.g., responsive to a movement, bending, twisting, change in shape, etc. of apparatus 1500).

Although FIGS. 14 and 15 depict particular mechanisms for articulating at least one component 1410 (e.g., one or more shafts, a coupler, at least one gear, a knob, etc.), it should be appreciated that at least one component 1410 and/or element 1440 may be positioned or repositioned using another type of mechanism in other embodiments. For example, a mechanism including at least one cable and/or at least one pulley may be used to change the position of at least one component 1410 and/or element 1440, a mechanism capable of translating rotational movement into linear movement may be used to change the position of at least one component 1410 and/or element 1440, etc.

In one embodiment, the position of more than one component (e.g., of at least one component 1410, similar to at least one component 1410, etc.) may be controlled using the same actuating mechanism. For example, a plurality of components may be coupled with one another via a linkage, cable, gear train, etc., thereby allowing the position of a plurality of components to be determined or changed contemporaneously using the same actuating mechanism (e.g., a knob and/or motor similar to that shown in FIG. 14, a knob and/or motor similar to that shown in FIG. 15, etc.). In this manner, properties of an apparatus (or a vehicle, or at least one vehicle portion, including or implemented by the apparatus) may be set or changed more efficiently (e.g., since a plurality of components can be configured contemporaneously and each component need not be individually configured) and the overall cost of the apparatus (or a vehicle, or at least one vehicle portion, including or implemented by the apparatus) can be reduced (e.g., by reducing the number of actuating mechanisms).

Alternatively, one or more components (e.g., of at least one component 1410, similar to at least one component 1410, etc.) may be configured, controlled, adjusted, etc. independently or individually (e.g., using at least one respective actuating mechanism for each component or set of components). In this manner, the configurability of the apparatus (or at least one portion thereof) may be increased by allowing, for example, one portion of the apparatus to be configured independently of another portion of the apparatus. And in one embodiment, a plurality of components may be configured contemporaneously (e.g., using the same mechanism) while at least one other component may be configured independently (e.g., using another mechanism) from the plurality of components.

Although FIGS. 14 and 15 show components with particular shapes and sizes, it should be appreciated that components of different shapes and/or sizes may be used in other embodiments. Additionally, although FIGS. 14 and 15 show particular arrangements and configurations of components, it should be appreciated that the arrangements and/or configurations of the components may be different in other embodiments.

In one embodiment, properties of at least one component (e.g., 210, 710*a*, 710*b*, 1410, 1610 of FIG. 16, 1710 of FIG. 17, etc.) may be set or varied by setting or changing the pressure in a cavity of or defined by the at least one component. For example, a higher pressure within the cavity may result in a component that is stiffer, thereby increasing the bending stiffness and/or torsional stiffness of the apparatus (or a vehicle, or at least one vehicle portion, including or implemented by the apparatus) that includes the component. As another example, a lower pressure within the cavity may result in a component that is more able to absorb vibrations and/or provide vibration isolation, thereby increasing the vibration damping (or changing another vibration characteristic such as the damping coefficient, at least one damped natural frequency, at least one undamped natural frequency, vibration frequency response, etc.) of the apparatus (or a vehicle, or at least one vehicle portion, including or implemented by the apparatus) that includes the component.

In one embodiment, the shape of a portion of an apparatus (or a vehicle, or at least one vehicle portion, including or implemented by the apparatus) that includes the at least one component (e.g., 210, 710*a*, 710*b*, 1410, 1610 of FIG. 16, 1710 of FIG. 17, etc.) may be changed by changing the pressure within the cavity of the at least one component. For example, where a component has a bent shape responsive to a lower pressure within a cavity of the component, the shape of the component may be changed (e.g., the radius of the bend may be increased, the component may be flattened, etc.) by increasing the pressure within the cavity. Accordingly, since the shape of the apparatus (or a vehicle, or at least one vehicle portion, including or implemented by the apparatus) that includes the component can be changed by changing the shape of the component, the shape of the apparatus (or a vehicle, or at least one vehicle portion, including or implemented by the apparatus) that includes the component can be changed by changing the pressure within the cavity of the component.

Figure 16:
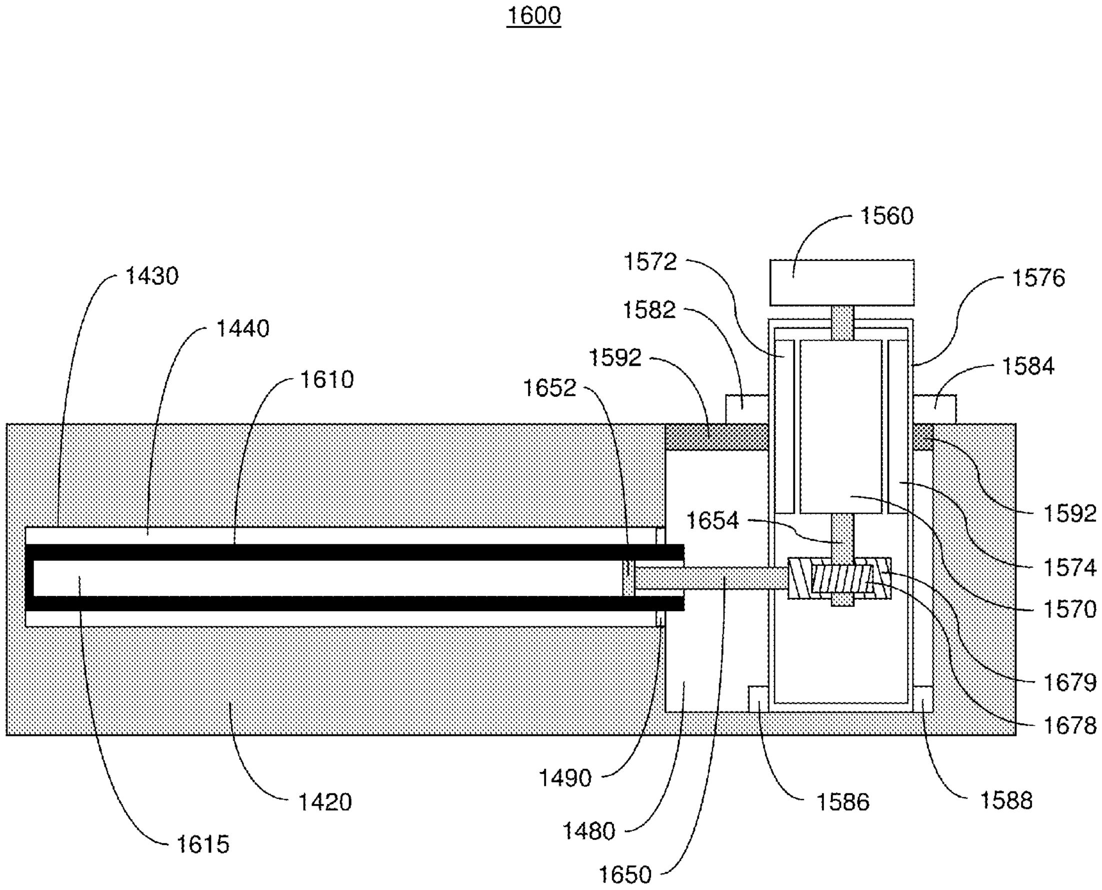
FIG. 16 shows an apparatus allowing a pressure inside of at least one component to be set or varied in accordance with one embodiment.

FIG. 16 shows apparatus 1600 allowing a pressure inside of at least one component to be set or varied in accordance with one embodiment of the present invention. In one embodiment, apparatus 1600 may be, or be used to implement, a vehicle or at least one portion of a vehicle.

As shown in FIG. 16, piston 1652 may be moved inside of cavity 1615 (e.g., defined in or by at least one component 1610) to change the pressure within cavity 1615. In one embodiment, the volume within cavity 1615 may change responsive to a change in the position of piston 1652 within cavity 1615. For example, responsive to piston 1652 being moved into cavity 1615 (e.g., away from seal 1490), the pressure may be increased and/or the volume may be decreased. As another example, responsive to piston 1652 being moved toward the outside of cavity 1615 (e.g., toward seal 1490), the pressure may be decreased and/or the volume may be increased.

In one embodiment, piston 1652 may be actuated by a rotation of component 1678. For example, piston 1652 may be coupled with component 1679 via connecting member 1650, where component 1679 may include elements capable of engaging, interfacing with, meshing with, etc. elements of component 1678. As such, component 1678 (and therefore connecting member 1650 and piston 1652) may be moved in one direction responsive to a rotation of component 1679 in a first direction (e.g., clockwise, counterclockwise, etc.), whereas component 1678 (and therefore connecting member 1650 and piston 1652) may be moved in another direction responsive to a rotation of component 1679 in a second direction (e.g., clockwise, counterclockwise, etc.). In this manner, a rotation of component 1678 may result in a linear actuation of piston 1652 via connecting member 1650.

In one embodiment, component 1678 may include protruding elements (e.g., teeth, posts, tabs, grooves, etc.) that can engage, interface with, mesh with, etc. elements (e.g., teeth, grooves, holes, etc.) of component 1679. In one embodiment, component 1678 may include other types of elements (e.g., grooves, holes, etc.) that can engage, interface with, mesh with, etc. elements (e.g., teeth, posts, tabs, grooves, etc.) of component 1679. And in one embodiment, component 1678 and/or component 1679 may be or include at least one gear.

In one embodiment, component 1678 may be rotated using knob 1560. For example, component 1678 and knob 1560 may be coupled with shaft 1654. Knob 1560 may be rotated by a tool, a user's hand, fingers, palm, glove, foot, boot, etc. In this manner, knob 1560 may be used to manually adjust the position of piston 1652 in cavity 1615 of the component, thereby allowing manual adjustment of the pressure inside cavity 1615 of at least one component 1610.

In one embodiment, component 1678 may be rotated using at least one rotor 1570 and/or at least one stator (e.g., 1572, 1574, etc.). For example, component 1678 and at least one rotor 1570 may be coupled with shaft 1654, where at least one rotor 1570 and the at least one stator (e.g., 1572, 1574, etc.) may form a motor (e.g., a stepper motor, a servo motor, a motor including at least one brush, a brushless motor, some combination thereof, etc.). In this manner, piston 1652 may be moved or positioned (or repositioned) inside cavity 1615 (e.g., of at least one component 1610) by rotating or otherwise changing the position of shaft 1654 (e.g., using at least one rotor 1650 and/or stator 1572, using at least one rotor 1650 and/or stator 1574, by powering or activating the motor, etc.), thereby allowing automatic or motorized adjustment of the pressure inside cavity 1615 of at least one component 1610.

Component 1678 and/or component 1679 may be disposed within housing 1576, and therefore, may be part of the motor. In this case, shaft 1654 and connecting member 1650 may extend from housing 1576. Alternatively, component 1678 and/or component 1679 may be separate from and/or disposed outside of housing 1576 (e.g., in a separate housing or gear box). In this case, shaft 1654 may extend between housing 1576 and a separate housing or gearbox (e.g., that includes component 1678 and/or component 1679), whereas connecting member 1650 may extend from the separate housing or gearbox (e.g., that includes component 1678 and/or component 1679).

It should be appreciated that at least one rotor 1570 and/or the at least one stator (e.g., 1572, 1574, etc.) may be used to manually and/or automatically adjust the pressure inside cavity 1615 of at least one component 1610. For example, the position of shaft 1654 may be controlled automatically by at least one other component (e.g., a control system including hardware and/or software capable of activating or powering the motor, a feedback or monitoring component indicating the current position and/or at least one other attribute of shaft 1654, some combination thereof, etc.), thereby allowing the position of piston 1652 to be controlled automatically. As another example, the position of shaft 1654 may be controlled manually using the motor and at least one other component (e.g., a user interface including hardware and/or software for allowing a user to manually control the position of the shaft by activating or powering the motor), thereby allowing manual positioning and/or repositioning of piston 1652 via the motor.

In one embodiment, piston 1652 may be rotatably coupled with connecting member 1650. As such, piston 1652 may be actuated (e.g., with reduced binding, friction, etc.) despite changes in angle between connecting member 1650 and piston 1652. For example, the angle between connecting member 1650 and piston 1652 may change as apparatus 1600 and/or at least one component 1610 is bent, twisted, or otherwise subjected to a change in shape. Thus, piston 1652 may be actuated despite changes in the shape of apparatus 1600 and/or at least one component 1610.

In one embodiment, cavity 1615 may be filled with one or more fluids (e.g., air, water, oil, a gas, etc.). The one or more fluids may be in one or more states (e.g., gas, liquid, solid, etc.).

In one embodiment, at least one property of an apparatus (or a vehicle, or at least one vehicle portion, including or implemented by the apparatus) may determined, configured, altered, etc. based on: a position of at least one component (e.g., as described with respect to FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14, FIG. 15, some combination thereof, etc.); a pressure inside of the at least one component (e.g., as described with respect to FIG. 16); some combination thereof; etc. In one embodiment, an assembly for adjusting the position of at least one component and/or element (e.g., as shown in FIG. 14, FIG. 15, etc.) may be disposed in a cavity (e.g., 1410) of an apparatus (e.g., 1400, 1500, 1600, etc.) along with an assembly for adjusting the pressure inside at least one component (e.g., as shown in FIG. 16). For example, the assembly for adjusting the pressure inside of at least one component (e.g., as shown in FIG. 16) may be disposed to the right of the assembly for adjusting the position of at least one component and/or element (e.g., as shown in FIG. 14, FIG. 15, etc.), where the components coupling the motor with the at least one component (e.g., housing 1476, knob 1460, shaft 1450, housing 1576, shaft 1550, coupler 1552, etc.) may be hollow to allow the connecting member (e.g., 1650) and/or the piston (e.g., 1652) to pass inside and/or through the components. In this manner, the pressure inside of at least one component and the position of the at least one component can be contemporaneously adjusted (e.g., manually, automatically, etc.).

In one embodiment, layers of apparatus 1600 may slide or move with respect to one another (e.g., responsive to a movement, bending, twisting, change in shape, etc. of apparatus 1600). In one embodiment, layers of apparatus 1600 may be fixed or not move with respect to one another (e.g., responsive to a movement, bending, twisting, change in shape, etc. of apparatus 1600).

Although FIG. 16 depicts a particular mechanism for articulating piston 1652 (e.g., connecting member 1650, component 1678, component 1679, etc.), it should be appreciated that piston 1652 may be positioned or repositioned using another type of mechanism in other embodiments. For example, a mechanism including at least one cable and/or at least one pulley may be used to change the position of piston 1652, a mechanism capable of translating rotational movement into linear movement may be used to change the position of piston 1652, etc.

In one embodiment, the position of more than one piston may be controlled using the same actuating mechanism. For example, a plurality of pistons and/or connecting members may be coupled with one another via a linkage, cable, gear train, etc., thereby allowing the position of a plurality of pistons to be determined or changed contemporaneously using the same actuating mechanism (e.g., a knob and/or motor similar to that shown in FIG. 16). In one embodiment, each piston of the plurality of pistons may be disposed in a respective cavity (e.g., similar to cavity 1615) of a respective component (e.g., 1610. In this manner, at least one property (e.g., e.g., bending stiffness or rigidity, torsional stiffness or rigidity, at least one vibration characteristic, shape, etc.) of an apparatus (or a vehicle, or at least one vehicle portion, including or implemented by the apparatus) may be set or changed more efficiently (e.g., since a plurality of components can be configured contemporaneously and each component need not be individually configured) and the overall cost of the apparatus (or a vehicle, or at least one vehicle portion, including or implemented by the apparatus) can be reduced (e.g., by reducing the number of actuating mechanisms).

Alternatively, one or more components (e.g., of at least one component 1610, similar to at least one component 1610, etc.) may be configured, controlled, adjusted, etc. independently or individually (e.g., using at least one respective actuating mechanism for each component or set of components). In this manner, the configurability of the apparatus (or at least one portion thereof) may be increased by allowing, for example, one portion of the apparatus to be configured independently of another portion of the apparatus. And in one embodiment, a plurality of components may be configured contemporaneously (e.g., using the same mechanism) while at least one other component may be configured independently (e.g., using another mechanism) from the plurality of components.

In one embodiment, pressure inside at least one component 1610 may be set or changed by changing a temperature of the apparatus 1600 and/or the at least one component 1610. The temperature may be set, changed, regulated, etc. using a resistive heating device, a heat exchanger, thermoelectric cooler, another device capable of transferring heat to at least one component 1610, another device capable of transferring heat from at least one component 1610, some combination thereof, etc. In this manner, at least one property (e.g., e.g., bending stiffness or rigidity, torsional stiffness or rigidity, at least one vibration characteristic, shape, etc.) of an apparatus (or a vehicle, or at least one vehicle portion, including or implemented by the apparatus) may be determined, configured, changed, etc. by changing the temperature of the apparatus (or a vehicle, or at least one vehicle portion, including or implemented by the apparatus) and/or at least one component of the apparatus.

Although FIG. 16 shows components and/or elements with particular shapes and sizes, it should be appreciated that components and/or elements of different shapes and/or sizes may be used in other embodiments. Additionally, although FIG. 16 shows particular arrangements and configurations of components and/or elements, it should be appreciated that the arrangements and/or configurations of the components and/or elements may be different in other embodiments.

In one embodiment, the at least one component (e.g., 210, 710*a*, 710*b*, 1410, 1610, 1710 of FIG. 17, as described with respect to FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14, FIG. 15, FIG. 16, FIG. 17, some combination thereof, etc.) may be made from a shape metal alloy (SMA) such as nickel-titanium (Nitinol), copper-aluminum-nickel, copper-zinc-aluminum, nickel-aluminum, some combination thereof, etc. At least one property (e.g., bending stiffness or rigidity, torsional stiffness or rigidity, at least one vibration characteristic, shape, etc.) of an apparatus (or a vehicle, or at least one vehicle portion, including or implemented by the apparatus) may be determined, configured, adjusted, etc. based on the state of the SMA of the at least one component. The state of the SMA may be configured, determined, altered, etc. by changing or setting the temperature of the at least one component using resistive heating (e.g., by passing an electrical current through the SMA to heat the SMA), using another component (e.g., a resistive heating device, a heat exchanger, etc.) to transfer heat (e.g., via conduction, convection, radiation, some combination thereof, etc.) to the at least one component, using another component (e.g., a thermoelectric cooler, a heat exchanger, etc.) to transfer heat (e.g., via conduction, convection, radiation, some combination thereof, etc.) from the at least one component, etc.

The state of the SMA of the component may correspond to a phase or crystal structure of the SMA. In one embodiment, the SMA may be placed in a first state by inducing a martensite phase in the SMA, whereas the SMA may be placed in a second state by inducing an austenite phase in the SMA. It should be appreciated that the SMA may be associated with two states (e.g., a one-way SMA having two phases), three states (e.g., a two-way SMA having three phases), or another number of states.

For example, SMA of at least one component (e.g., 210, 710*a*, 710*b*, 1410, 1610, 1710, etc.) may be placed in a first state (e.g., associated with a first attribute or set or attributes) by adjusting the temperature of the SMA to a first value or range of values. In the first state, the SMA may be relatively flexible and/or soft, and therefore, impart a first set of properties (e.g., reduced bending stiffness, reduced torsional stiffness, increased vibration damping, a first damping coefficient, a first damped natural frequency, a first undamped natural frequency, a first vibration frequency response, etc.) to the apparatus (or a vehicle, or at least one vehicle portion, including or implemented by the apparatus) including the at least one component. However, when the at least one component is placed in a second state (e.g., associated with a second attribute or set or attributes), the SMA may be more rigid, harder, less flexible, etc. In one embodiment, the at least one component may be placed in the second state by adjusting the temperature to a second value or range of values. Therefore, the SMA may impart a second set of properties (e.g., increased bending stiffness, increased torsional stiffness, reduced vibration damping, a second damping coefficient, a second damped natural frequency, a second undamped natural frequency, a second vibration frequency response, etc.) to the apparatus including the at least one component. It should be appreciated that the SMA may be placed in one or more additional states (e.g., by changing the temperature to at least one other value or range of values), thereby allowing the SMA to impart at least one other set of properties to the apparatus including the at least one component.

As another example, the shape of an apparatus (or a vehicle, or at least one vehicle portion, including or implemented by the apparatus) including the at least one component (e.g., 210, 710*a*, 710*b*, 1410, 1610, 1710, etc.) may be determined, configured, altered, etc. based on the state of the SMA of the at least one component. In one embodiment, the apparatus may be configured into a first shape responsive to placing the SMA in a first state (e.g., associated with a first attribute or set or attributes), whereas the apparatus may be configured into a second shape responsive to placing the SMA in a second state (e.g., associated with a second attribute or set or attributes). In one embodiment, a particular state of the SMA may be a relaxed state of the SMA (e.g., associated with the SMA being more flexible and/or soft, associated with the SMA being in the martensite phase, etc.), and therefore, the shape of the apparatus including the at least one component may be determined by at least one other layer of the apparatus (or a vehicle, or at least one vehicle portion, including or implemented by the apparatus), at least one other component of the apparatus (or a vehicle, or at least one vehicle portion, including or implemented by the apparatus), etc. In one embodiment, a particular state of the SMA may be a shape-memory or non-relaxed state of the SMA (e.g., associated with the SMA being more stiff and/or hard, associated with the SMA being in the austenite phase, etc.), and therefore, the shape of the apparatus including the at least one component may be determined by the at least one component. In this case, the at least one component (e.g., including the SMA) may work against at least one other layer of the apparatus (or a vehicle, or at least one vehicle portion, including or implemented by the apparatus), at least one other component of the apparatus (or a vehicle, or at least one vehicle portion, including or implemented by the apparatus), etc.

In one embodiment, at least one property of an apparatus (or a vehicle, or at least one vehicle portion, including or implemented by the apparatus) may be determined, configured, altered, etc. based on: a state of SMA of at least one component; a position of at least one component (e.g., as described with respect to FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14, FIG. 15, some combination thereof, etc.); a pressure inside of the at least one component (e.g., as described with respect to FIG. 16); some combination thereof; etc. In this manner, embodiments of the present invention can improve control over at least one property of an apparatus (or a vehicle, or at least one vehicle portion, including or implemented by the apparatus) or a portion thereof.

In one embodiment, the actuator used to change the position of at least one component and/or adjust a pressure inside of at least one component may be a SMA actuator. For example, a linear actuator from Miga Motor Company may be used to change the position of at least one component and/or adjust a pressure inside of at least one component. As another example, a rotary actuator (e.g., using an SMA to rotate a member) may be used to change the position of at least one component and/or adjust a pressure inside of at least one component.

The properties of an apparatus (or a vehicle, or at least one vehicle portion, including or implemented by the apparatus) may be determined, configured, altered, controlled, etc. using at least one component including magnetorheological fluid in one embodiment. For example, an apparatus may include one or more magnets (e.g., capable of generating a magnetic field) in or around at least one component including magnetorheological fluid, where one or more properties of the magnetic field (e.g., strength, magnetic flux density, direction, location, shape, etc.) may be used to adjust at least one property of the magnetorheological fluid (e.g., viscosity, etc.). In one embodiment, the magnetorheological fluid may include a carrier fluid (e.g., oil, etc.) with particles (e.g., made of iron or some other material capable of being moved, oriented, or otherwise influenced by a magnetic field) dispersed therein. Setting or changing at least one property of the magnetorheological fluid (e.g., of at least one component) may be used to configure or change at least one property (e.g., bending stiffness, torsional stiffness, at least one vibration characteristic, shape, etc.) of the at least one component, where the at least one property of the at least one component may affect, determine, provide, etc. at least one property (e.g., bending stiffness, torsional stiffness, at least one vibration characteristic, shape, etc.) of at least one apparatus (e.g., including the at least one component). Accordingly, one or more properties (e.g., bending stiffness, torsional stiffness, at least one vibration characteristic, shape, etc.) of the apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) including the at least one component (e.g., 210, 710*a*, 710*b*, 1410, 1610, 1710, etc.) may be determined, configured, altered, etc. based on at least one property of a magnetic field.

In one embodiment, setting or configuring magnetorheological fluid of at least one component in a first state (e.g., subjecting the magnetorheological fluid to a magnetic field with a first property or set of properties) may result in at least one component that is stiffer, thereby increasing the bending stiffness and/or torsional stiffness of the apparatus (or a vehicle, or at least one vehicle portion, including or implemented by the apparatus) that includes the at least one component. Alternatively, configuring magnetorheological fluid of at least one component in a second state (e.g., subjecting the magnetorheological fluid to a weaker or otherwise different magnetic field than that associated with the first state, subjecting the magnetorheological fluid to no magnetic field, etc.) may result in at least one component that is less stiff, thereby reducing the bending stiffness and/or torsional stiffness of the apparatus (or a vehicle, or at least one vehicle portion, including or implemented by the apparatus) that includes the at least one component.

In one embodiment, configuring magnetorheological fluid of at least one component in a first state (e.g., subjecting the magnetorheological fluid to a magnetic field with a first property or set of properties) may result in at least one component that is less able to absorb vibrations and/or provide vibration isolation, thereby decreasing the vibration damping of an apparatus (or a vehicle, or at least one vehicle portion, including or implemented by the apparatus) that includes the at least one component. Alternatively, configuring magnetorheological fluid of at least one component in a second state (e.g., subjecting the magnetorheological fluid to a weaker or otherwise different magnetic field than that associated with the first state, subjecting the magnetorheological fluid to no magnetic field, etc.) may result in at least one component that is more able to absorb vibrations and/or provide vibration isolation, thereby increasing the vibration damping of an apparatus (or a vehicle, or at least one vehicle portion, including or implemented by the apparatus) that includes the at least one component.

Figure 17:
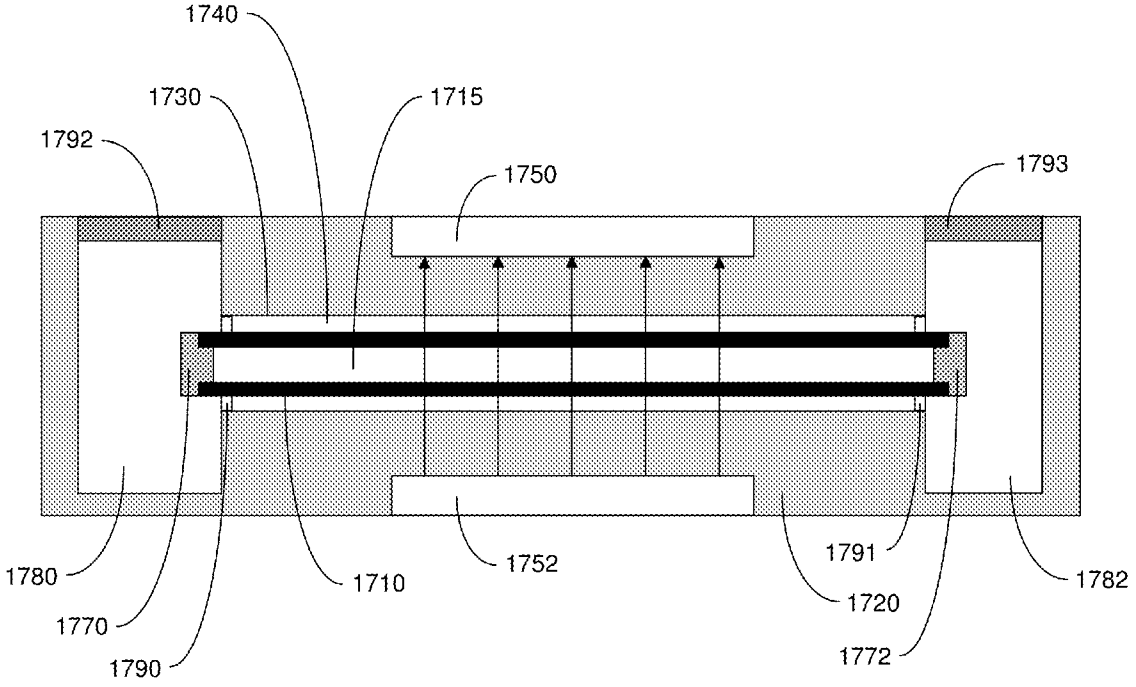
FIG. 17 shows an apparatus allowing one or more properties of a magnetorheological fluid of at least one component to be set or varied in accordance with one embodiment.

FIG. 17 shows apparatus 1700 allowing one or more properties of a magnetorheological fluid of at least one component to be set or varied in accordance with one embodiment of the present invention. In one embodiment, apparatus 1700 may be, or be used to implement, a vehicle or at least one portion of a vehicle.

As shown in FIG. 17, one or more magnets (e.g., 1750, 1752, etc.) may be disposed in proximity to at least one component 1710 including magnetorheological fluid 1715. In one embodiment, magnetorheological fluid 1715 may be contained in a cavity of at least one component 1710 by one or more plugs (e.g., 1770, 1772, etc.). The one or more magnets (e.g., 1750, 1752, etc.) may be used to create a magnetic field (e.g., represented by the arrows depicted in FIG. 17) across or in proximity to magnetorheological fluid 1715, where one or more properties of the magnetic field (e.g., strength, magnetic flux density, direction, location, shape, etc.) may be set or adjusted to set or adjust the properties of magnetorheological fluid 1715 (e.g., viscosity, etc.). Setting or changing at least one property of magnetorheological fluid 1715 (e.g., of at least one component 1710) may be used to configure or change at least one property (e.g., bending stiffness, torsional stiffness, at least one vibration characteristic, shape, etc.) of at least one component 1710, where the at least one property of at least one component 1710 may affect, determine, provide, etc. at least one property (e.g., bending stiffness, torsional stiffness, at least one vibration characteristic, shape, etc.) of at least one apparatus 1700. Accordingly, one or more properties (e.g., bending stiffness, torsional stiffness, at least one vibration characteristic, shape, etc.) of apparatus 1700 (or a vehicle, or at least one vehicle portion, including or implemented by apparatus 1700) or a portion thereof may be determined, configured, altered, etc. based on at least one property of a magnetic field (e.g., generated by magnet 1750, magnet 1752, etc.).

One or more properties of the magnetic field may be set or adjusted by determining, configuring, altering, etc. properties of the at least one magnet (e.g., 1750, 1752, etc.) in one embodiment. For example, where the at least one magnet is an electromagnet, one or more properties of the electric field may be set or adjusted by varying the current flowing through the electromagnet or by adjusting at least one other property of the electricity flowing through the electromagnet (e.g., a voltage, a duty cycle or another property of a pulse-width modulated signal, etc.). As another example, the position or orientation of the at least one magnet may be set or changed to set or change the direction of the magnetic field (e.g., reverse the magnetic field, change the angle of the magnetic field lines with respect to magnetorheological fluid 1715, etc.), the strength of the magnetic field (e.g., by causing the magnetic flux density in or around magnetorheological fluid 1715 to change, by causing the number of magnetic field lines or amount of the magnetic field in or around magnetorheological fluid 1715 to change, etc.), or some other property of the magnetic field. And as a further example, where the at least one magnet is implemented using an apparatus (e.g., 1800) that can be configured in a plurality of states and/or with at least one attribute (e.g., as described with respect to FIG. 18A and/or FIG. 18B), the state (e.g., associated with a particular attribute or set of attributes) of the apparatus (e.g., 1800) may be set or changed to determine, configure, adjust, etc. one or more properties of the magnetic field.

Cavity 1780 (e.g., located at one side of at least one component 1710) and/or cavity 1782 (e.g., located at another side of at least one component 1710) may allow servicing of magnetorheological fluid 1715 in one embodiment. For example, a plug (e.g., 1770, 1772, etc.) may be removed (e.g., after removing cover 1792 and/or cover 1793 to provide access to plug 1770 and/or plug 1772, respectively) to allow magnetorheological fluid 1715 to be drained, replaced, added to, etc. In one embodiment, plug 1770 and plug 1772 may be removed to allow magnetorheological fluid 1715 to be pumped or pulled out of at least one component 1710 (e.g., using a vacuum). It should be appreciated that the plugs (e.g., 1770, 1772, etc.) may also allow at least one component 1710 to be cleaned, rinsed, etc. In this manner, servicing of magnetorheological fluid 1715 (e.g., that has aged, that has experienced a decrease in effectiveness, that is desired to be replaced or removed, etc.) may be performed.

One or more seals or covers may be used to control dirt, moisture, contamination, etc. For example, at least one seal (e.g., 1790, 1791, etc.) may be used to reduce dirt, moisture, contamination, etc. in opening or channel 1730 that at least partially encloses at least one component 1710 and/or element 1740. As another example, cover 1792 may be placed over cavity 1780 (e.g., to at least partially enclose plug 1770, one side of at least one component 1710, etc.), where cover 1792 may act as a seal to reduce dirt, moisture, contamination, etc. in cavity 1780. As a further example, cover 1793 may be placed over cavity 1782 (e.g., to at least partially enclose plug 1772, one side of at least one component 1710, etc.), where cover 1793 may act as a seal to reduce dirt, moisture, contamination, etc. in cavity 1782.

In one embodiment, at least one component 1710 may be implemented by at least one component 210, at least one component 710*a*, at least one component 710*b*, at least one component 1410, at least one component 1610, some combination thereof, etc. At least one layer 1720 may be implemented by at least one layer 220 in one embodiment. In one embodiment, opening or channel 1730 may be similar to or implemented by opening or channel 230, opening or channel 730*a*, opening or channel 730*b*, opening or channel 1430, opening or channel 1630, some combination thereof, etc. And in one embodiment, element 1740 may be implemented by element 240, element 740*a*, element 740*b*, element 1440, element 1640, some combination thereof, etc.

In one embodiment, a plurality of components (e.g., of at least one component 1710, similar to at least one component 1710, etc.) may be contemporaneously configured (e.g., using the same magnet or set of magnets). In this manner, properties of an apparatus (or a vehicle, or at least one vehicle portion, including or implemented by the apparatus) may be set or changed more efficiently (e.g., since a plurality of components can be configured contemporaneously and each component need not be individually configured) and the overall cost of the apparatus (or a vehicle, or at least one vehicle portion, including or implemented by the apparatus) can be reduced (e.g., by reducing the number of magnets or other components used to generate a magnetic field).

Alternatively, one or more components (e.g., of at least one component 1710, similar to at least one component 1710, etc.) may be configured, controlled, adjusted, etc. independently or individually (e.g., using at least one respective magnet for each component or set of components). In this manner, the configurability of the apparatus (or at least one portion thereof) may be increased by allowing, for example, one portion of the apparatus to be configured independently of another portion of the apparatus. And in one embodiment, a plurality of components may be configured contemporaneously (e.g., using the same magnet or set of magnets) while at least one other component may be configured independently (e.g., using another magnet or set of magnets) from the plurality of components.

In one embodiment, layers of apparatus 1700 may slide or move with respect to one another (e.g., responsive to a movement, bending, twisting, change in shape, etc. of apparatus 1700). In one embodiment, layers of apparatus 1700 may be fixed or not move with respect to one another (e.g., responsive to a movement, bending, twisting, change in shape, etc. of apparatus 1700).

At least one magnet (e.g., 1750, 1752, etc.) may be coupled with an apparatus (e.g., 100*a*, 100*b*, 100*c*, 100*d*, 200, 700, 900, 1200, 1400, 1500, 1600, etc.) in one or more ways. For example, at least one magnet may fit in a recess or opening in an apparatus and secured via a press fit, an adhesive, at least one flange, at least one bracket, at least one strap, at least one snap, at least one fastener, some other mechanism, etc. As another example, at least one magnet may be disposed between at least two layers of an apparatus, where the at least one magnet may be inserted during and/or after manufacturing of the apparatus. As another example, at least one magnet may be disposed on a layer of an apparatus and secured via a press fit, an adhesive, at least one flange, at least one bracket, at least one strap, at least one snap, at least one fastener, some other mechanism, etc.

And as yet another example, at least one magnet (e.g., 1750, 1752, etc.) may be disposed in an opening or channel (e.g., 1730) of at least one component (e.g., 1710). The at least one magnet may be inserted into the opening or channel (e.g., 1730) contemporaneously with the at least one component (e.g., 1710), before the at least one component (e.g., 1710), after the at least one component (e.g., 1710), etc.

Figure 18A:
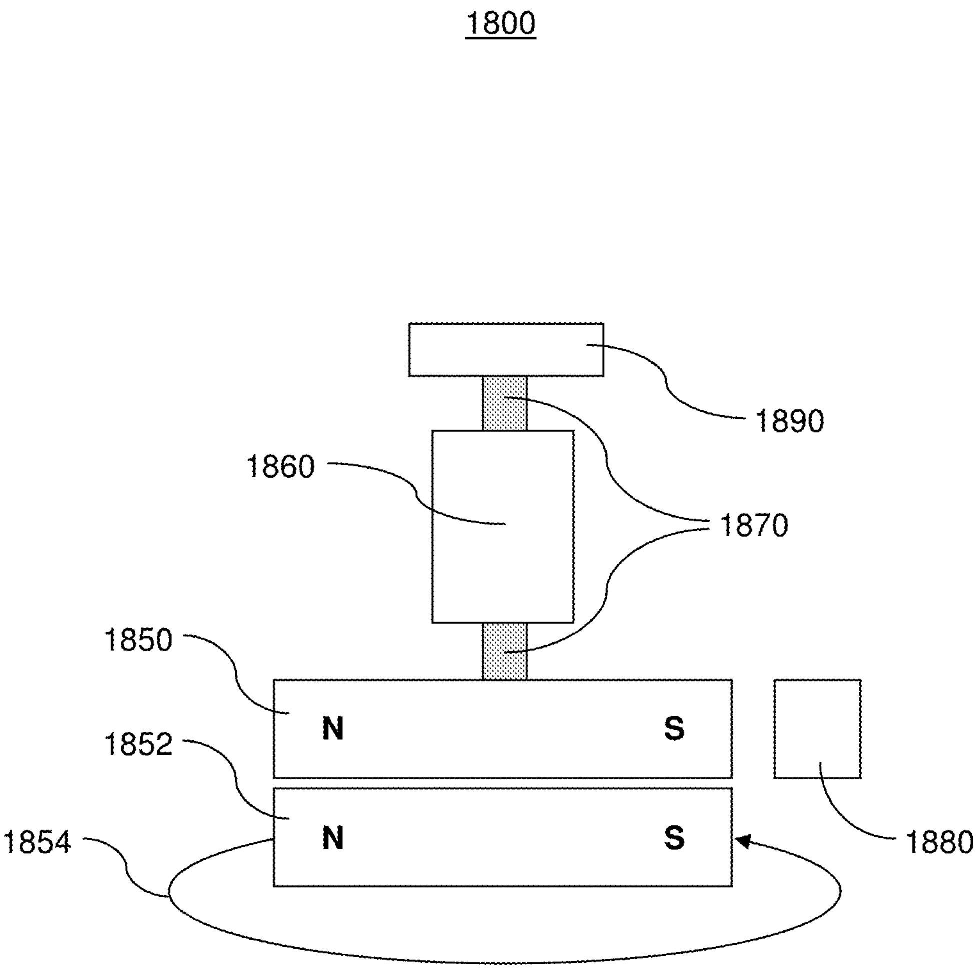
FIG. 18A shows a first state of an apparatus allowing one or more properties of a magnetic field to be set or varied in accordance with one embodiment.
Figure 18B:
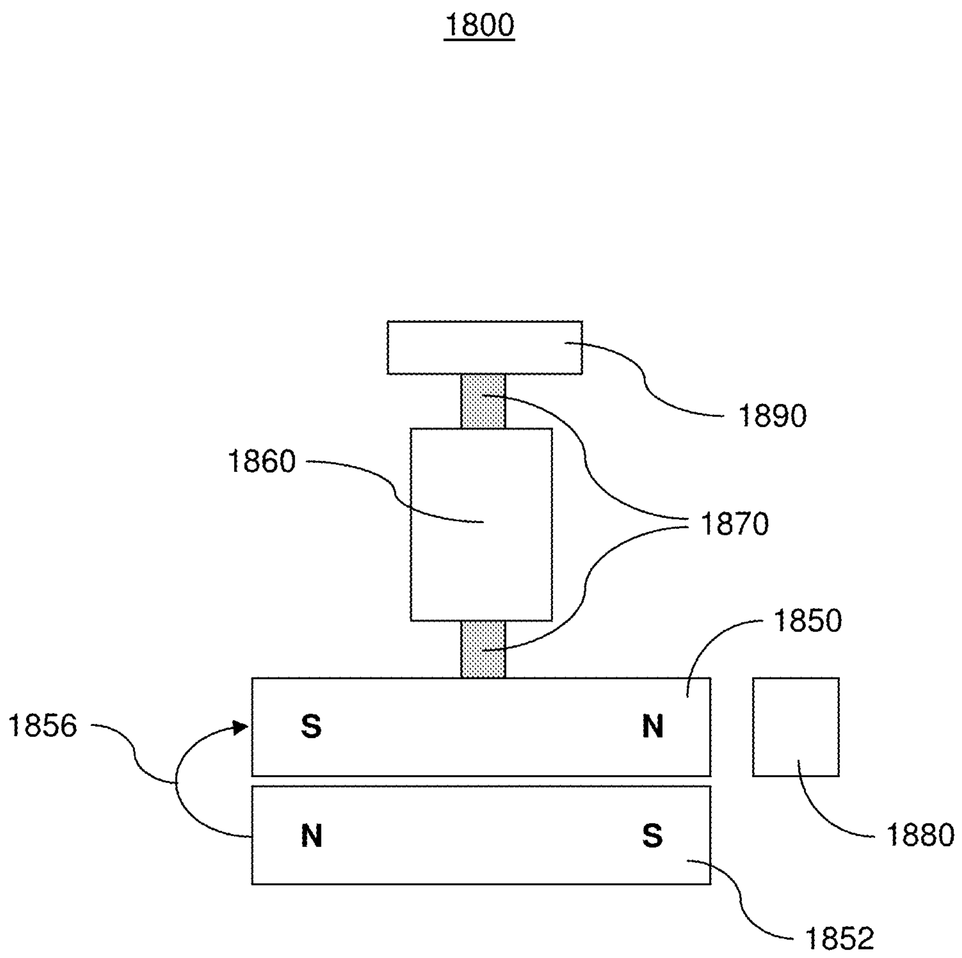
FIG. 18B shows a second state of an apparatus allowing one or more properties of a magnetic field to be set or varied in accordance with one embodiment.

FIGS. 18A and 18B show apparatus 1800 allowing one or more properties of a magnetic field to be set or varied in accordance with one embodiment of the present invention. In one embodiment, apparatus 1800 may be, or be used to implement, a vehicle or at least one portion of a vehicle. In one embodiment, magnet 1850 may be used to implement magnet 1750 of apparatus 1700. And in one embodiment, magnet 1852 may be used to implement magnet 1752 of apparatus 1700.

In a first state as shown in FIG. 18A, the respective poles of magnet 1850 and magnet 1852 may be aligned (e.g., the north pole of magnet 1850 overlapping or in proximity to the north pole of magnet 1852, the south pole of magnet 1850 overlapping or in proximity to the south pole of magnet 1852, etc.), thereby generating a magnetic field (e.g., on the side of magnet 1852 opposite magnet 1850 as depicted in FIG. 18A by at least one magnetic field line 1854, in proximity to and/or passing through magnetorheological fluid 1715 of at least one component 1710, etc.). In a second state as shown in FIG. 18B, the respective poles of magnet 1850 and magnet 1852 may be out of alignment (e.g., the north pole of magnet 1850 overlapping or in proximity to the south pole of magnet 1852, the south pole of magnet 1850 overlapping or in proximity to the north pole of magnet 1852, etc.), thereby reducing or eliminating the magnetic field (e.g., generated in the first state, on the side of magnet 1852 opposite magnet 1850 as depicted in FIG. 18A by at least one magnetic field line 1854, in proximity to and/or passing through magnetorheological fluid 1715 of at least one component 1710, etc.). In one embodiment, the magnetic field (e.g., generated in the first state, on the side of magnet 1852 opposite magnet 1850 as depicted in FIG. 18A by at least one magnetic field line 1854, in proximity to and/or passing through magnetorheological fluid 1715 of at least one component 1710, etc.) may be reduced or eliminated in the second state since at least one magnetic field line (e.g., 1856) may flow from the north pole of magnet 1852 to the south pole of magnet 1850 (e.g., following the shortest path from a north pole to a south pole as depicted by at least one magnetic field line 1856 in FIG. 18B) instead of from the north pole to the south pole of magnet 1852 (e.g., as depicted by at least one magnetic field line 1854 in FIG. 18A). As such, one or more properties of a magnetic field (e.g., strength, magnetic flux density, direction, location, shape, etc.) may be varied by changing the position of magnet 1850 with respect to magnet 1852.

In one embodiment, the relative positions of magnets 1850 and 1852 may be controlled or changed using motor 1860. For example, shaft 1870 may be coupled with magnet 1850 and at least one rotor of motor 1860. In this manner, shaft 1870 may be rotated as the at least one rotor of motor 1860 moves with respect to at least one stator of motor 1860 (e.g., responsive to applying electricity to or powering motor 1860), thereby allowing one or more properties of a magnetic field (e.g., strength, magnetic flux density, direction, location, shape, etc.) to be varied by changing the position of magnet 1850 with respect to magnet 1852 using motor 1860.

In one embodiment, the relative positions of magnets 1850 and 1852 may be controlled or changed using electromagnet 1880. For example, electricity may be applied to electromagnet 1880 to align magnet 1850 in the first position (e.g., as depicted in FIG. 18A). As another example, electricity may be applied to electromagnet 1880 to align magnet 1850 in the second position (e.g., as depicted in FIG. 18B). Electromagnet 1880 may align magnet 1850 in the second position by reversing the direction of current flow (e.g., to be opposite to the direction of current flow used to align magnet 1850 in the first position) through electromagnet 1880 to swap the poles of electromagnet 1880 (e.g., with respect to the pole arrangement used to align magnet 1850 in the first position). Accordingly, one or more properties of a magnetic field (e.g., strength, magnetic flux density, direction, location, shape, etc.) may be varied by changing the position of magnet 1850 with respect to magnet 1852 using electromagnet 1880.

In one embodiment, the relative positions of magnets 1850 and 1852 may be controlled or changed using knob 1890. Knob 1890 may be coupled with shaft 1870, thereby allowing shaft 1870 to be rotated or moved responsive to turning knob 1890. Knob 1890 may be rotated by a tool, a user's hand, fingers, palm, glove, foot, boot, etc. In this manner, one or more properties of a magnetic field (e.g., strength, magnetic flux density, direction, location, shape, etc.) may be varied by changing the position of magnet 1850 with respect to magnet 1852 using knob 1890.

The relative position of magnets 1850 and 1852 may be controlled or changed manually and/or automatically. For example, a user may rotate knob 1890 and/or control motor 1860 to rotate shaft 1870, thereby allowing the relative position of magnets 1850 and 1852 to be controlled or changed manually. As another example, the position or rotation of shaft 1870 may be automatically controlled using a control system (e.g., including hardware and/or software), where the control system may be used to control the position of shaft 1870 via motor 1860, electromagnet 1880, some combination thereof, etc.

Accordingly, one or more properties of a magnetic field (e.g., strength, magnetic flux density, direction, location, shape, etc.) may be set or varied using motor 1860, electromagnet 1880, knob 1890, some combination thereof, etc. In one embodiment, one or more properties (e.g., bending stiffness, torsional stiffness, at least one vibration characteristic, shape, etc.) of an apparatus (or a vehicle, or at least one vehicle portion, including or implemented by the apparatus) including at least one component (e.g., 1710) may be set or adjusted by configuring at least one property of magnetorheological fluid (e.g., 1715), where at least one property of magnetorheological fluid (e.g., 1715) may be adjusted or configured based on one or more properties of a magnetic field in proximity to and/or passing through the magnetorheological fluid (e.g., 1715). Thus, where a magnetic field (e.g., having or associated with at least one property that can be set or varied based on a relative position of a plurality of magnets such as magnets 1850 and 1852) is in proximity to and/or passing through magnetorheological fluid (e.g., 1715) of at least one component (e.g., 1710), one or more properties (e.g., bending stiffness, torsional stiffness, at least one vibration characteristic, shape, etc.) of an apparatus (or a vehicle, or at least one vehicle portion, including or implemented by the apparatus) including the at least one component (e.g., 1710) may be set or adjusted using motor 1860, electromagnet 1880, knob 1890, some combination thereof, etc.

Although FIGS. 18A and 18B have been discussed with respect to a first and second position, it should be appreciated that magnet 1850 may be positioned in one or more intermediate positions (e.g., using motor 1860, electromagnet 1880, another electromagnet located at a different position, knob 1890, some combination thereof, etc.) between the first and second positions in one embodiment. One or more properties of the magnetic field may be different in an intermediate position than in the first position and/or second position. In this manner, embodiments of the present invention may allow greater control over the properties of the magnetic field, and therefore, over the properties of an apparatus (or a vehicle, or at least one vehicle portion, including or implemented by the apparatus) including the magnetorheological fluid affected by the magnetic field.

In one embodiment, the position of magnet 1852 may be controlled with respect to magnet 1850. For example, shaft 1870 may extend through a hole defined in magnet 1850 such that shaft 1870 can turn without rotating magnet 1850. In this case, shaft 1870 may act as a locating pin for magnet 1850. As another example, magnet 1850 and/or magnet 1852 may be constrained on one or both ends (e.g., by a housing, by an element that does not enclose magnet 1850 and/or magnet 1852, etc.).

In one embodiment, magnet 1850 and/or magnet 1852 may be disc-shaped. In one embodiment, magnet 1850 and/or magnet 1852 may be alternatively shaped (e.g., as an elliptical prism, as an oval prism, as a triangular prism, as a square prism, as a rectangular prism, as a pentagonal prism, as a hexagonal prism, etc.). And in one embodiment, magnet 1850 and/or magnet 1852 may define one or more holes or openings.

In one embodiment, the force required to move magnet 1850 with respect to magnet 1852 may be relatively small. In one embodiment, once positioned, magnet 1850 may remain in the same position with respect to magnet 1852 without the application of any external force. Thus, embodiments of the present invention allow the power and/or electricity required to change and/or maintain the relative positioning of magnets 1850 and 1852 to be reduced.

In one embodiment, at least one property of an apparatus (or a vehicle, or at least one vehicle portion, including or implemented by the apparatus) may be determined, configured, altered, etc. based on: at least one property of a magnetorheological fluid of at least one component (e.g., as described with respect to FIG. 17, FIG. 18A, FIG. 18B, etc.); a state of SMA of at least one component, based on a position of at least one component (e.g., as described with respect to FIG. 2A, FIG. 2B, FIG. 3A, FIG. 3B, FIG. 4A, FIG. 4B, FIG. 5A, FIG. 5B, FIG. 6A, FIG. 6B, FIG. 7A, FIG. 7B, FIG. 8A, FIG. 8B, FIG. 9A, FIG. 9B, FIG. 10A, FIG. 10B, FIG. 11A, FIG. 11B, FIG. 12, FIG. 13, FIG. 14, FIG. 15, some combination thereof, etc.); a pressure inside of the at least one component (e.g., as described with respect to FIG. 16); some combination thereof; etc. In this manner, embodiments of the present invention can improve control over at least one property of an apparatus (or a vehicle, or at least one vehicle portion, including or implemented by the apparatus) or a portion thereof.

Although FIGS. 17, 18A and 18B show components and/or elements with particular shapes and sizes, it should be appreciated that components of different shapes and/or sizes may be used in other embodiments. Additionally, although FIGS. 17, 18A and 18B show particular arrangements and configurations of components and/or elements, it should be appreciated that the arrangements and/or configurations of the components may be different in other embodiments.

In one embodiment, at least one component (e.g., 210, 710*a*, 710*b*, 1410, 1610, 1710, etc.) may be made from or include a magnetic shape memory alloy (MSMA) or ferromagnetic shape memory alloy (FSMA). The at least one component including the MSMA or FSMA may be constructed and/or function similarly to at least one component including an SMA as described above. However, the state of the MSMA or FSMA may be configured or changed by configuring or changing at least one property of a magnetic field applied to or in proximity to the at least one component (e.g., 210, 710*a*, 710*b*, 1410, 1610, 1710, etc.). In one embodiment, the magnetic field may be created or applied using at least one magnet (e.g., 1750, 1752, 1850, 1852, etc.) as discussed with respect to FIG. 17, 18A, 18B, etc. In this manner, properties of an apparatus (or a vehicle, or at least one vehicle portion, including or implemented by the apparatus) including at least one component may be configured by setting or changing at least one property of a magnetic field applied to or in proximity to an MSMA or FSMA of the at least one component (e.g., 210, 710*a*, 710*b*, 1410, 1610, 1710, etc.).

Figure 19:
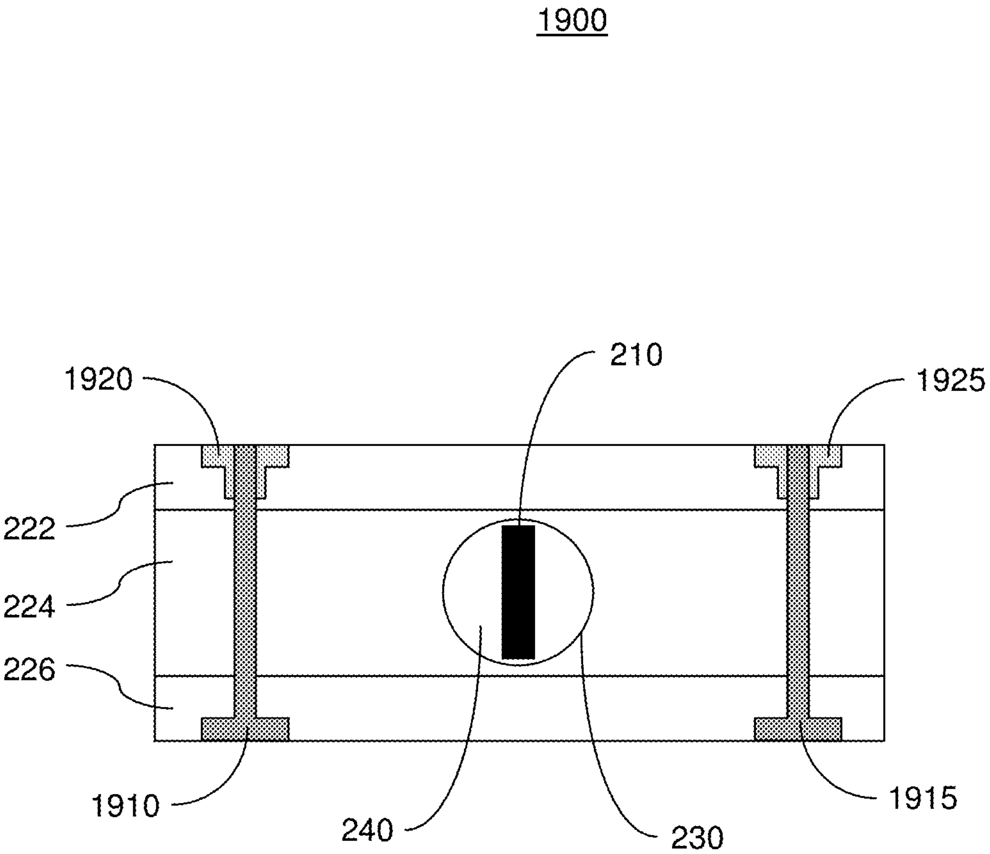
FIG. 19 shows an apparatus including at least one element for reducing delamination of layers of the apparatus in accordance with one embodiment.

FIG. 19 shows apparatus 1900 including at least one element for reducing delamination of layers of the apparatus in accordance with one embodiment of the present invention. In one embodiment, apparatus 1900 may be, or be used to implement, a vehicle or at least one portion of a vehicle.

As shown in FIG. 19, a plurality of layers (e.g., 222, 224, 226, etc.) of apparatus 1900 may be compressed and/or held together by at least one fastener (e.g., 1910, 1915, etc.) and at least one element (e.g., 1920, 1925, etc.). In one embodiment, each element of the at least one element (e.g., 1920, 1925, etc.) may include at least one respective threaded insert. A fastener (e.g., 1910, 1915, etc.) may be threaded into a threaded insert (e.g., 1920, 1925, etc.) and tightened to compress the plurality of layers (e.g., 222, 224, 226, etc.). In this manner, delamination or separation of the layers (e.g., that may otherwise occur due to bending of the apparatus, twisting of the apparatus, other changes in shape of the apparatus, forces exerted by at least one component 210, etc.) may be reduced by the compressive force generated by the at least one fastener (e.g., 1910, 1915, etc.) and/or at least one element (e.g., 1920, 1925, etc.).

In one embodiment, layers (e.g., 222, 224, 226, some combination thereof, etc.) of apparatus 1900 may slide or move with respect to one another (e.g., responsive to a movement, bending, twisting, change in shape, etc. of apparatus 1900). In one embodiment, layers (e.g., 222, 224, 226, some combination thereof, etc.) of apparatus 1900 may be fixed or not move with respect to one another (e.g., responsive to a movement, bending, twisting, change in shape, etc. of apparatus 1900).

In one embodiment, the at least one fastener (e.g., 1910, 1915, etc.) and/or at least one element (e.g., 1920, 1925, etc.) may be formed integrally with one or more layers. For example, the one or more layers (e.g., 222, 224, 226, etc.) may be formed (e.g., poured and solidified, injection molded, blow molded, etc.) around and/or with the at least one fastener (e.g., 1910, 1915, etc.) and/or at least one element (e.g., 1920, 1925, etc.). As another example, at least one layer 222 may be formed (e.g., poured and solidified, injection molded, blow molded, etc.) around and/or with the at least one element (e.g., 1920, 1925, etc.). Alternatively, the at least one fastener (e.g., 1910, 1915, etc.) and/or at least one element (e.g., 1920, 1925, etc.) may be added as a manufacturing operation after the formation of one or more layers (e.g., inserted into an opening in a layer, etc.).

In one embodiment, one or more layers may overlap or cover the at least one fastener (e.g., 1910, 1915, etc.) and/or at least one element (e.g., 1920, 1925, etc.), where the one or more layers (e.g., overlapping or covering the at least one fastener and/or at least one element) may act to at least partially conceal and/or secure the at least one fastener (e.g., 1910, 1915, etc.) and/or at least one element (e.g., 1920, 1925, etc.). For example, one or more layers may be disposed on or overlapping at least one layer 222 on the side opposite at least one layer 224. As another example, one or more layers may be disposed on or overlapping at least one layer 226 on the side opposite at least one layer 224. The at least one fastener (e.g., 1910, 1915, etc.) and/or at least one element (e.g., 1920, 1925, etc.) may be added as a manufacturing operation before applying the one or more layers (e.g., overlapping or covering the at least one fastener and/or at least one element) in one embodiment.

In one embodiment, the at least one fastener (e.g., 1910, 1915, etc.) and/or at least one element (e.g., 1920, 1925, etc.) may be held in place by the compressive force of the at least one fastener (e.g., 1910, 1915, etc.) and/or at least one element (e.g., 1920, 1925, etc.). In one embodiment, where each element of the at least one element (e.g., 1920, 1925, etc.) includes at least one respective threaded insert, a predetermined torque may be applied to the at least one fastener (e.g., 1910, 1915, etc.) that is threaded into the at least one element (e.g., 1920, 1925, etc.), etc. In one embodiment, the at least one fastener (e.g., 1910, 1915, etc.) and/or at least one element (e.g., 1920, 1925, etc.) may be secured to apparatus 1900 using an adhesive, ultrasonic welding, etc.

Although FIG. 19 shows components and/or elements with particular shapes and sizes, it should be appreciated that components and/or elements of different shapes and/or sizes may be used in other embodiments. Additionally, although FIG. 19 shows particular arrangements and configurations of components and/or elements, it should be appreciated that the arrangements and/or configurations of the components and/or elements may be different in other embodiments. For example, the at least one fastener (e.g., 1910, 1915, etc.) and/or at least one element (e.g., 1920, 1925, etc.) may be, or be used to implement, another type of mechanism (e.g., a rivet, a pin with one end flattened or mushroomed as a manufacturing operation, another element without threads such as a pin with a ball lock mechanism, etc.) in other embodiments.

Figure 20:
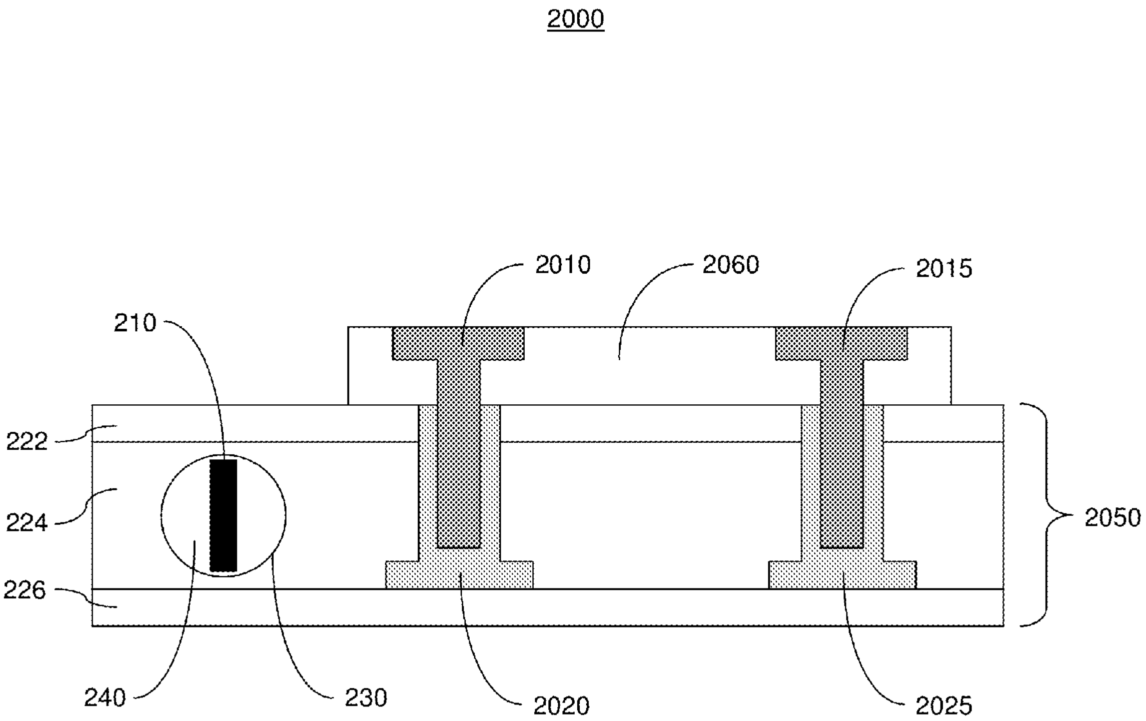
FIG. 20 shows an apparatus including at least one element allowing the coupling of another object with the apparatus in accordance with one embodiment.

FIG. 20 shows apparatus 2000 including at least one element allowing the coupling of another object with the apparatus in accordance with one embodiment of the present invention. In one embodiment, apparatus 2000 may be, or be used to implement, a vehicle or at least one portion of a vehicle.

As shown in FIG. 20, apparatus 2000 may include apparatus 2050, where apparatus 2050 may include or be coupled with at least one element (e.g., 2020, 2025, etc.). In one embodiment, each element of the at least one element (e.g., 2020, 2025, etc.) may include at least one respective threaded insert. In this case, object 2060 (e.g., a binding, a truck, another object, a component including circuitry as discussed herein, etc.) may be secured to apparatus 2050 by inserting a respective fastener (e.g., 2010, 2015, etc.) through a respective opening defined in object 2060 and into each of the threaded inserts, where a threaded engagement between the fasteners and the threaded inserts may allow the fasteners and the threaded inserts to compress object 2060 against apparatus 2050. Accordingly, object 2060 may be secured to apparatus 2050 which also includes at least one component (e.g., 210, 710*a*, 710*b*, 1410, 1610, 1710, etc.) allowing determination, configuration, adjustment, etc. of at least one property (e.g., bending stiffness, torsional stiffness, at least one vibration characteristic, shape, etc.) of apparatus 2000 (or a vehicle, or at least one vehicle portion, including or implemented by apparatus 2000) or at least one portion thereof as discussed herein.

In one embodiment, at least one element may be used to both secure an object to the apparatus (e.g., as discussed with respect to FIG. 20) and to reduce delamination of layers of the apparatus (e.g., as discussed with respect to FIG. 19). For example, where at least one element (e.g., 2020, 2025, etc.) includes at least one threaded insert, at least one fastener (e.g., 2010, 2015, etc.) and the at least one threaded insert may be used to secure an object (e.g., 2060) to the apparatus (e.g., 2000) as well as reduce delamination of one or more layers (e.g., at least one layer 222 and at least one layer 224) of the apparatus (e.g., 2000).

In one embodiment, layers (e.g., 222, 224, 226, some combination thereof, etc.) of apparatus 2000 may slide or move with respect to one another (e.g., responsive to a movement, bending, twisting, change in shape, etc. of apparatus 2000). In one embodiment, layers (e.g., 222, 224, 226, some combination thereof, etc.) of apparatus 2000 may be fixed or not move with respect to one another (e.g., responsive to a movement, bending, twisting, change in shape, etc. of apparatus 2000).

In one embodiment, at least one element (e.g., 2020, 2025, etc.) may be formed integrally with one or more layers (e.g., at least one layer 222 and/or at least one layer 224). For example, the one or more layers (e.g., 222, 224, etc.) may be formed (e.g., poured and solidified, injection molded, blow molded, etc.) around and/or with the at least one element (e.g., 2020, 2025, etc.). Alternatively, the at least one element (e.g., 2020, 2025, etc.) may be added as a manufacturing operation after the formation of one or more layers (e.g., inserted into an opening defined in at least one layer 222, inserted into an opening in at least one layer 224, etc.).

In one embodiment, one or more layers may overlap or cover the at least one element (e.g., 2020, 2025, etc.), where the one or more layers (e.g., overlapping or covering the at least one threaded insert) may act to at least partially conceal and/or secure the at least one element (e.g., 2020, 2025, etc.). For example, one or more layers may be disposed on or overlapping at least one layer 222 on the side opposite at least one layer 224. The at least one element (e.g., 2020, 2025, etc.) may be added as a manufacturing operation before applying the one or more layers (e.g., overlapping or covering the at least one element) in one embodiment.

Although FIG. 20 shows components and/or elements with particular shapes and sizes, it should be appreciated that components and/or elements of different shapes and/or sizes may be used in other embodiments. Additionally, although FIG. 20 shows particular arrangements and configurations of components and/or elements, it should be appreciated that the arrangements and/or configurations of the components and/or elements may be different in other embodiments. For example, the at least one fastener (e.g., 2010, 2015, etc.) and/or at least one element (e.g., 2020, 2025, etc.) may be, or be used to implement, another type of mechanism (e.g., a rivet, a pin with one end flattened or mushroomed as a manufacturing operation, another element without threads such as a pin with a ball lock mechanism, etc.) in other embodiments. As another example, the at least one component (e.g., 210, 710*a*, 710*b*, 1410, 1610, 1710, etc.) may be disposed in between the at least one element (e.g., 2020, 2025, etc.), on the other side of the at least one element (e.g., 2020, 2025, etc.), some combination thereof, etc. in other embodiments.

Figure 21:
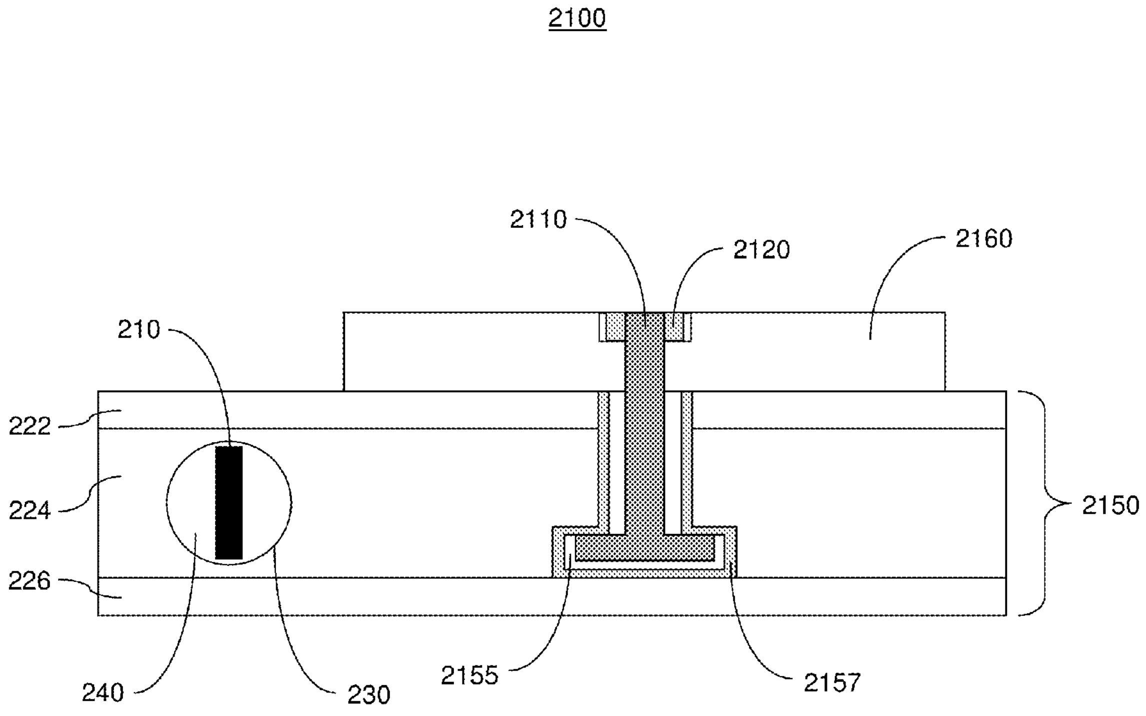
FIG. 21 shows an apparatus defining at least one channel allowing the coupling of another object with the apparatus in accordance with one embodiment.

FIG. 21 shows apparatus 2100 defining at least one channel allowing the coupling of another object with the apparatus in accordance with one embodiment of the present invention. In one embodiment, apparatus 2100 may be, or be used to implement, a vehicle or at least one portion of a vehicle.

As shown in FIG. 21, apparatus 2100 may include apparatus 2150, where apparatus 2150 (or at least one portion or at least one component thereof) may define channel 2155. Object 2160 (e.g., a binding, a truck, another object, a component including circuitry as discussed herein, etc.) may be secured to apparatus 2150 using element 2110 and element 2120 in one embodiment. Element 2110 may be inserted into channel 2155 and through an opening defined in object 2160, where an engagement between element 2110 and element 2120 may secure object 2160 against apparatus 2150 (e.g., by compressing object 2160 against apparatus 2150). In one embodiment, element 2110 may be or include at least one fastener, and element 2120 may be or include at least one nut. Accordingly, object 2160 may be secured to apparatus 2150 which also includes at least one component (e.g., 210, 710*a*, 710*b*, 1410, 1610, 1710, etc.) allowing determination, configuration, adjustment, etc. of at least one property (e.g., bending stiffness, torsional stiffness, at least one vibration characteristic, shape, etc.) of apparatus 2100 (or a vehicle, or at least one vehicle portion, including or implemented by apparatus 2100) as discussed herein.

In one embodiment, layers (e.g., 222, 224, 226, some combination thereof, etc.) of apparatus 2100 may slide or move with respect to one another (e.g., responsive to a movement, bending, twisting, change in shape, etc. of apparatus 2100). In one embodiment, layers (e.g., 222, 224, 226, some combination thereof, etc.) of apparatus 2100 may be fixed or not move with respect to one another (e.g., responsive to a movement, bending, twisting, change in shape, etc. of apparatus 2100).

In one embodiment, channel 2155 may be formed integrally with one or more layers (e.g., at least one layer 222 and/or at least one layer 224). For example, the one or more layers (e.g., 222, 224, etc.) may be formed (e.g., poured and solidified, injection molded, blow molded, etc.) around and/or with an element (e.g., 2157) defining channel 2155. Alternatively, channel 2155 may be added as a manufacturing operation after the formation of one or more layers. For example, an element (e.g., 2157) defining channel 2155 may be inserted into an opening defined by at least one layer 222 and/or at least one layer 224. As another example, channel 2155 may be formed by removing material from (e.g., via machining or another operation) at least one layer 222 and/or at least one layer 224 to form channel 2155.

In one embodiment, one or more layers may overlap or cover channel 2155 and/or element 2157, where the one or more layers (e.g., overlapping or covering channel 2155 and/or element 2157) may act to at least partially conceal and/or secure channel 2155 and/or element 2157. For example, one or more layers may be disposed on or overlapping at least one layer 222 on the side opposite at least one layer 224. Channel 2155 and/or element 2157 may be added as a manufacturing operation before applying the one or more layers (e.g., overlapping or covering channel 2155 and/or element 2157) in one embodiment.

Although FIG. 21 shows components and/or elements with particular shapes and sizes, it should be appreciated that components and/or elements of different shapes and/or sizes may be used in other embodiments. Additionally, although FIG. 21 shows particular arrangements and configurations of components and/or elements, it should be appreciated that the arrangements and/or configurations of the components and/or elements may be different in other embodiments. For example, element 2110 and/or element 2120 may be, or be used to implement, another type of mechanism (e.g., a rivet, a pin with one end flattened or mushroomed as a manufacturing operation, another element without threads such as a pin with a ball lock mechanism, etc.) in other embodiments. As another example, the at least one component (e.g., 210, 710*a*, 710*b*, 1410, 1610, 1710, etc.) may be disposed on the other side of channel 2155 and/or element 2157, on both sides of channel 2155 and/or element 2157, some combination thereof, etc. in other embodiments.

Figure 22:
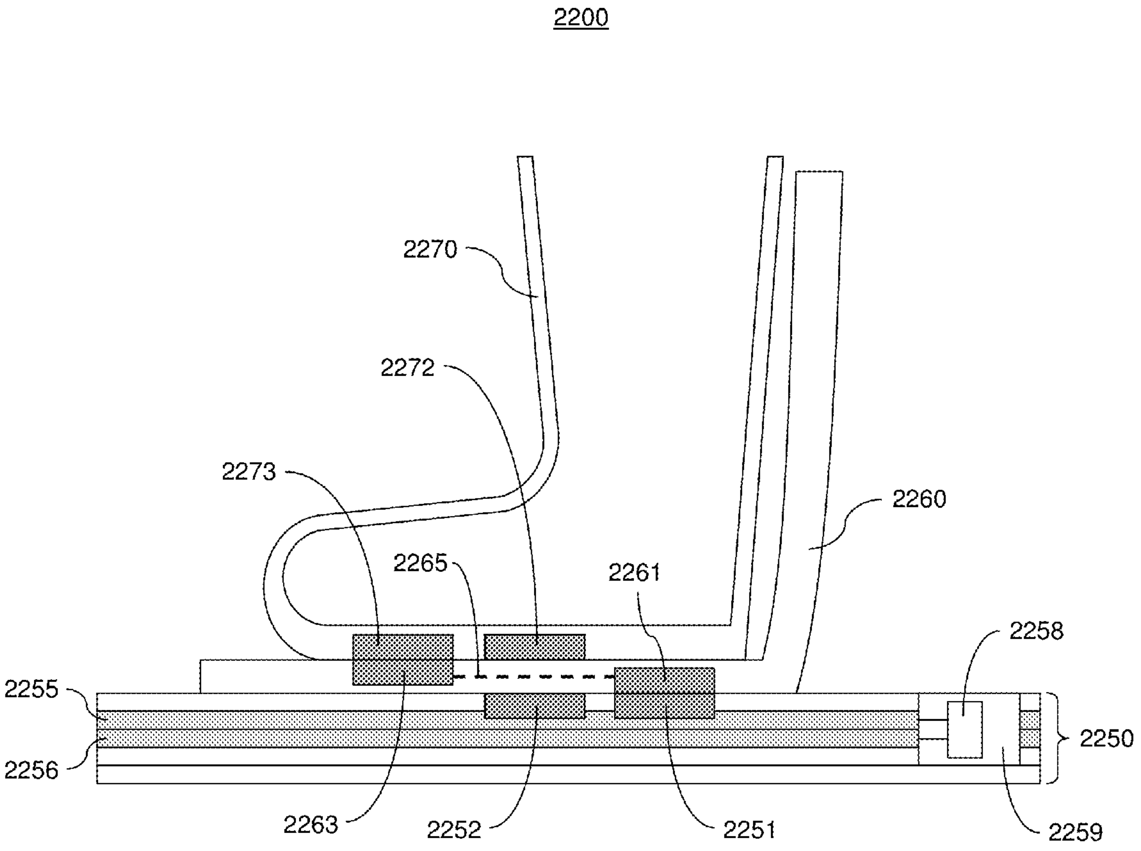
FIG. 22 shows an apparatus allowing communication of signals between an apparatus and at least one other object in accordance with one embodiment.

FIG. 22 shows apparatus 2200 allowing communication of signals between apparatus 2250 and at least one other object in accordance with one embodiment of the present invention. In one embodiment, apparatus 2200 may include apparatus 2250, object 2260, object 2270, another object, some combination thereof, etc. In one embodiment, apparatus 2250 may be, or be used to implement, a vehicle or at least one portion of a vehicle. In one embodiment, object 2260 may be a binding (e.g., including at least one base or base plate, at least one strap, at least one highback, at least one step-in binding, at least one component configured to release a boot or other object from apparatus 2250, etc.). And in one embodiment, object 2270 may be a boot, shoe, or other object designed to accept a human foot, ankle, lower leg, etc.

As shown in FIG. 22, signals may be communicated between apparatus 2250 and at least one other object (e.g., 2260, 2270, etc.) using a plurality of signal transfer components. For example, signal transfer component 2261 (e.g., of object 2260, coupled with object 2260, disposed at least partially within object 2260, etc.) and signal transfer component 2251 (e.g., of apparatus 2250, coupled with apparatus 2250, disposed at least partially within apparatus 2250, disposed in or between layers of apparatus 2250, etc.) may be used to communicate signals (e.g., power signals, data signals, clock signals, etc.) between the object 2260 and apparatus 2250. As another example, signal transfer component 2272 (e.g., of object 2270, coupled with object 2270, disposed at least partially within object 2270, etc.) and signal transfer component 2252 (e.g., of apparatus 2250, coupled with apparatus 2250, disposed at least partially within apparatus 2250, disposed in or between layers of apparatus 2250, etc.) may be used to communicate signals (e.g., power signals, data signals, clock signals, etc.) between object 2270 and apparatus 2250. And as a further example, signal transfer component 2273 (e.g., of object 2270, coupled with object 2270, disposed at least partially within object 2270, etc.) and signal transfer component 2263 (e.g., of object 2260, coupled with object 2260, disposed at least partially within object 2260, etc.) may be used to communicate signals (e.g., power signals, data signals, clock signals, etc.) between object 2270 and object 2260.

In one embodiment, signals may be communicated (e.g., between objects, between apparatuses, between at least one object and at least one apparatus, some combination thereof, etc.) using more than two signal transfer components. For example, signals may be communicated between object 2270 and apparatus 2250 using signal transfer components 2273 and 2263 (e.g., to transfer signals between object 2270 and object 2260) as well as using signal transfer components 2261 and 2251 (e.g., to transfer signals between object 2260 and apparatus 2250).

In one embodiment, respective signal transfer components of each object (e.g., 2260, 2270, etc.) and/or each apparatus (e.g., 2250) may be electrically coupled to one another. For example, signals transfer components 2261 and 2263 may be electrically coupled to one another by at least one interface 2265 of object 2260, thereby allowing signal communication between object 2270 and apparatus 2250 via at least one interface 2265.

In one embodiment, signal transfer components (e.g., 2261, 2251, 2272, 2252, 2273, 2263, some combination thereof, etc.) may include electrical contacts that are capable of implementing a wired interface for transferring signals responsive to physical contact between the electrical contacts of the signal transfer components. For example, electrical contacts may be brought into physical contact with one another responsive to object 2260 being disposed on or secured to apparatus 2250 (e.g., where signal transfer components 2251 and 2261 include electrical contacts). As another example, electrical contacts may be brought into physical contact with one another responsive to object 2270 being disposed on or secured to object 2260 (e.g., where signal transfer components 2263 and 2273 include electrical contacts).

In one embodiment, signal transfer components (e.g., 2261, 2251, 2272, 2252, 2273, 2263, some combination thereof, etc.) may be capable of implementing an inductive interface for transferring signals responsive to bringing the signal transfer components into alignment and/or proximity with one another. For example, where a first signal transfer component (e.g., 2261, 2251, 2272, 2252, 2273, 2263, some combination thereof, etc.) is capable of creating a magnetic field, signals may be transferred over an inductive interface formed responsive to at least one other signal transfer component (e.g., 2261, 2251, 2272, 2252, 2273, 2263, some combination thereof, etc.) being disposed at least partially within the magnetic field (e.g., created by the first signal transfer component). In one embodiment, each of the signal transfer components capable of implementing the inductive interface may include at least one respective coil. In this manner, signals may be transferred using signal transfer components even though the signal transfer components may not be in physical contact and/or electrical contact with one another.

As an example, signal transfer components 2252 and 2272 may include at least one respective coil and/or otherwise be capable of implementing an inductive interface for transferring signals. As such, responsive to signal transfer components 2252 and 2272 being brought into alignment and/or proximity with one another (e.g., responsive to object 2270 being disposed on or secured to object 2260, etc.), signals may be communicated between object 2270 and apparatus 2250 (e.g., even though signal transfer components 2252 and 2272 may not be in physical contact and/or electrical contact with one another).

In one embodiment, the inductive interface between two or more signal transfer components may be used to charge a component (e.g., a battery, a capacitor, an ultracapacitor, another type of component or device capable of storing energy, etc.) and communicate signals. For example, signal transfer components 2252 and 2272 may be capable of implementing an inductive interface used to communicate signals between apparatus 2250 and object 2270 as well as charge a component of either apparatus 2250 or object 2270. In one embodiment, charging may be performed using an energy source of or electrically coupled to apparatus 2250 that is capable of supplying energy or electricity (e.g., via the inductive interface implemented by signal transfer components 2252 and 2272) to at least one component of object 2270. Alternatively, charging may be performed in one embodiment using an energy source of or electrically coupled to object 2270 that is capable of supplying energy or electricity (e.g., via the inductive interface implemented by signal transfer components 2252 and 2272) to at least one component of apparatus 2250.

In one embodiment, signal transfer components (e.g., 2261, 2251, 2272, 2252, 2273, 2263, some combination thereof, etc.) may be capable of implementing a wireless interface for transferring signals responsive to bringing the signal transfer components into alignment and/or proximity with one another. For example, one signal transfer component (e.g., 2261, 2251, 2272, 2252, 2273, 2263, some combination thereof, etc.) may convert an electrical signal into a wireless signal for transmission to at least one other signal transfer component (e.g., 2261, 2251, 2272, 2252, 2273, 2263, some combination thereof, etc.), where the at least one other signal transfer component may receive the wireless signal and convert it back into an electrical signal. The wireless signals communicated between signal transfer components may include radio waves, microwaves, infrared waves, visible light waves, ultraviolet waves, x-rays, gamma rays, some combination thereof, etc. In this manner, signals may be transferred using signal transfer components even though the signal transfer components may not be in physical contact and/or electrical contact with one another.

In one embodiment, signals may be communicated through or using at least one layer of apparatus 2250. For example, one or more layers (e.g., 2255, 2256, etc.) may include respective traces and/or wires for electrically coupling one or more components (e.g., 2258, of apparatus 2300 of FIG. 23, etc.). In one embodiment, a plurality of overlapping layers (e.g., 2255, 2256, etc.) may include traces and/or wires (e.g., where the respective traces and/or wires may or may not overlap or come into contact with one another) allowing respective signals to be communicated through each layer and/or from one layer to another. In one embodiment, the traces and/or wires may be created after manufacture of at least one layer (e.g., etching a trench and physically inserting the traces and/or wires in the at least one layer, etching a copper layer or other metal layer to form traces, etc.), formed integrally with the at least one layer (e.g., the material forming the at least one layer may be formed or molded around the traces and/or wires), etc.

In one embodiment, at least one trace may be formed using a conductive polymer. The conductive polymer may be added to at least one layer (e.g., 2255, 2256, etc.) during or after manufacture, formed integrally with at least one layer, etc. In one embodiment, the conductive polymer of one or more traces may be electrically isolated (e.g., using a non-conductive polymer or other material) from another trace and/or wire. And in one embodiment, other materials (e.g., a metal, another conductive material, etc.) may be used for the traces and/or wires.

In one embodiment, the traces and/or wires of one or more layers (e.g., 2255, 2256, etc.) may be used to communicate signals between at least one signal transfer component and at least one other electrical component. For example, where at least one component 2258 (e.g., including circuitry) is disposed in cavity 2259 of apparatus 2250, signals may be communicated between at least one signal transfer component (e.g., 2261, 2251, 2272, 2252, 2273, 2263, some combination thereof, etc.) and at least one component 2258 via at least one layer (e.g., 2255, 2256, etc.) of apparatus 2250. In this case, the at least one signal transfer component (e.g., 2261, 2251, 2272, 2252, 2273, 2263, some combination thereof, etc.) may be electrically coupled to traces and/or wires of the at least one layer (e.g., 2255, 2256, etc.).

In one embodiment, layers of apparatus 2200 and/or apparatus 2250 may slide or move with respect to one another (e.g., responsive to a movement, bending, twisting, change in shape, etc. of apparatus 2200 and/or apparatus 2250). In one embodiment, layers of apparatus 2200 and/or apparatus 2250 may be fixed or not move with respect to one another (e.g., responsive to a movement, bending, twisting, change in shape, etc. of apparatus 2200 and/or apparatus 2250).

Figure 23:
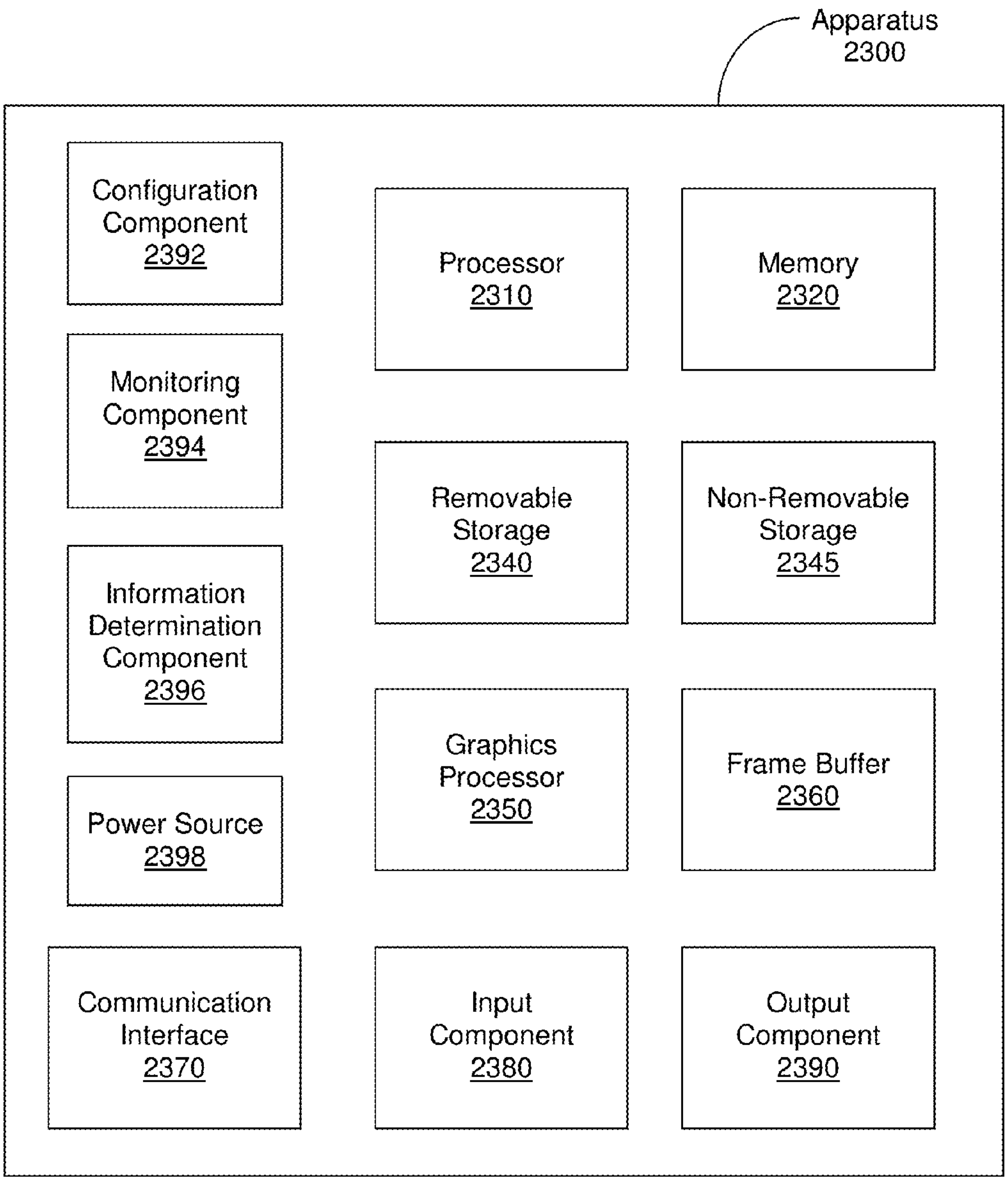
FIG. 23 is a block diagram of an apparatus in accordance with one embodiment.

FIG. 23 is a block diagram of apparatus 2300 in accordance with one embodiment of the present invention. As shown in FIG. 23, apparatus 2300 may include processor 2310, memory 2320, removable storage 2340, non-removable storage 2345, graphics processor 2350, frame buffer 2360, communication interface 2370, input component 2380, output component 2390, configuration component 2392, monitoring component 2394, information determination component 2396, power source 2398, at least one other component, some combination thereof, etc.

In one embodiment, apparatus 2300 may be a general-purpose computer system, an embedded computer system, a laptop computer system, a hand-held computer system, a portable computer system and/or portable electronic device, a stand-alone computer system, a computer system within or associated with a vehicle or other type of apparatus, etc. In one embodiment, apparatus 2300 may be used to implement one or more portions of at least one other apparatus (e.g., 100*a*, 100*b*, 100*c*, 100*d*, 200, 700, 900, 1200, 1400, 1500, 1600, 1700, 1800, 1900, 2000, 2100, 2200, etc.).

In one embodiment, one or more components (e.g., 2310, 2320, 2340, 2345, 2350, 2360, 2370, 2380, 2390, 2392, 2394, 2396, 2398, etc.) of apparatus 2300 may be disposed at least partially within and/or coupled with one or more portions of at least one other apparatus (e.g., 100*a*, 100*b*, 100*c*, 100*d*, 200, 700, 900, 1200, 1400, 1500, 1600, 1700, 1800, 1900, 2000, 2100, 2200, etc.). In one embodiment, one or more components (e.g., 2310, 2320, 2340, 2345, 2350, 2360, 2370, 2380, 2390, 2392, 2394, 2396, 2398, etc.) of apparatus 2300 may be disposed in a cavity (e.g., 1480, 1780, 1782, 2259, etc.) of an apparatus (e.g., 1400, 1500, 1600, 1700, 2200, etc.), where access to the one or more components (e.g., 2310, 2320, 2340, 2345, 2350, 2360, 2370, 2380, 2390, 2392, 2394, 2396, 2398, etc.) may be gained by opening or removing a cover (e.g., 1492, 1592, 1792, 1793, etc.) to the cavity (e.g., 1480, 1780, 1782, 2259, etc.). And in one embodiment, one or more components (e.g., 2310, 2320, 2340, 2345, 2350, 2360, 2370, 2380, 2390, 2392, 2394, 2396, 2398, etc.) of apparatus 2300 may be, or be used to implement, at least one component 2258 of FIG. 22.

As shown in FIG. 23, processor 2310 may be a central processing unit (CPU), a graphics processing unit (GPU), a microprocessor, another type of processor, etc. Memory 2320 may be a volatile memory (e.g., RAM), non-volatile memory (e.g., ROM, flash memory, etc.), some combination thereof, etc. Additionally, memory 2320 may be removable, non-removable, etc.

Apparatus 2300 may also include additional storage (e.g., removable storage 2340, non-removable storage 2345, etc.). Removable storage 2340 and/or non-removable storage 2345 may include volatile memory, non-volatile memory, some combination thereof, etc. Additionally, removable storage 2340 and/or non-removable storage 2345 may include CD-ROM, digital versatile disks (DVD), other optical storage, magnetic cassettes, magnetic tape, magnetic disk storage, other magnetic storage devices, or any other medium which can be used to store information for access by one or more components of apparatus 2300.

In one embodiment, a memory of apparatus 2300 (e.g., memory 2320, removable storage 2340, non-removable storage 2345, etc.) may be a computer-readable medium (or computer-usable medium, or computer-readable storage medium, etc.) and may include instructions for implementing (e.g., responsive to an execution thereof by processor 2310) a method of configuring an apparatus (e.g., in accordance with process 2700 of FIG. 27), some other method, etc. And in one embodiment, a memory of apparatus 2300 (e.g., memory 2320, removable storage 2340, non-removable storage 2345, etc.) may be implemented in and/or using at least one die of at least one integrated circuit (e.g., at least one application-specific integrated circuit (ASIC), at least one system-on-a-chip (SOC), at least one programmable system-on-a-chip (PSOC), at least one programmable logic device (PLD), another type of integrated circuit, etc.).

As shown in FIG. 23, configuration component 2392 may be used to configure (e.g., determine, set, adjust, change, etc.) at least one component (e.g., 210, 710*a*, 710*b*, 1410, 1610, 1710, etc.) of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). Configuration of at least one component may be performed by configuration component 2392 in combination with processor 2310 and/or in combination with at least one other component of apparatus 2300 in one embodiment. In one embodiment, configuration of at least one component may allow at least one property (e.g., bending stiffness or rigidity, torsional stiffness or rigidity, at least one vibration characteristic, shape, etc.) of the at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) to be determined, configured, adjusted, etc.

For example, configuration component 2392 may be used to set or change a position (e.g., associated with or defined by a location, plane, axis, orientation, arrangement, pattern, etc.) of at least one component (e.g., 210, 710*a*, 710*b*, 1410, 1610, 1710, etc.) by activating or powering a motor (e.g., of apparatus 1400, apparatus 1500, apparatus 1600, apparatus 1800, etc.), a linear actuator, changing the state of a switch, etc. As another example, configuration component 2392 may be used to set or change a pressure associated with at least one component (e.g., 210, 710*a*, 710*b*, 1410, 1610, 1710, etc.) by moving a piston (e.g., 1652) within the at least one component, changing the temperature of the at least one component (e.g., by causing an electric current to flow through or around the at least one component, using a resistive heating device, using a heat exchanger, using a thermoelectric cooler, using another device capable of transferring heat to the at least one component, using another device capable of transferring heat from the at least one component, some combination thereof, etc.), etc.

As another example, configuration component 2392 may be used to set or change a temperature of at least one component (e.g., 210, 710*a*, 710*b*, 1410, 1610, 1710, etc.) by causing an electric current to flow through the at least one component (e.g., including an SMA, MSMA, FSMA etc.), by causing an electric current to flow around the at least one component, using a resistive heating device, using a heat exchanger, using a thermoelectric cooler, using another device capable of transferring heat to the at least one component, using another device capable of transferring heat from the at least one component, some combination thereof, etc. And as yet another example, configuration component 2392 may be used to set or change at least one property (e.g., strength, magnetic flux density, direction, location, shape, etc.) of a magnetic field applied to (e.g., through, across, in proximity to, etc.) at least one component by activating and/or changing a state of one or more magnets aligned with and/or disposed in proximity to: at least one component (e.g., 1710) including a magnetorheological fluid (e.g., 1715); at least one component (e.g., 210, 710*a*, 710*b*, 1410, 1610, 1710, etc.) including a MSMA or FSM; some combination thereof; etc.

At least one component (e.g., 210, 710*a*, 710*b*, 1410, 1610, 1710, etc.) may be configured (e.g., determined, set, adjusted, changed, etc.) at one or more times. For example, at least one component of an apparatus may be configured during manufacture, thereby allowing the apparatus to be pre-configured by a manufacturer before use. As another example, at least one component of an apparatus may be configured (e.g., automatically and/or manually) before and/or after use. As yet another example, at least one component of an apparatus may be configured (e.g., automatically and/or manually) during use (e.g., dynamically or "on-the-fly"). The term "use" as used in these examples, or as otherwise used herein, may involve a user being coupled with the apparatus (e.g., while the apparatus is stationary or moving), a user standing on the apparatus (e.g., while the apparatus is stationary or moving), a movement of the apparatus (e.g., bending, flexing, twisting, movement of the apparatus with respect to another surface or object, etc.), some combination thereof, etc.

As shown in FIG. 23, monitoring component 2394 may be used to monitor a configuration (e.g., defined by and/or associated with at least one attribute and/or at least one value of at least one attribute) of at least one component (e.g., 210, 710*a*, 710*b*, 1410, 1610, 1710, etc.) of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). In one embodiment, monitoring of a configuration of at least one component may be performed by monitoring component 2394 in combination with processor 2310 and/or in combination with at least one other component of apparatus 2300.

For example, monitoring component 2394 may be used to monitor a position (e.g., associated with or defined by a location, plane, axis, orientation, arrangement, pattern, etc.) or change in position of at least one component (e.g., 210, 710*a*, 710*b*, 1410, 1610, 1710, etc.). As another example, monitoring component 2394 may be used to monitor a position of at least one other component of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), where the at least one other component may include a shaft, a rotor, a stator, a gear, an element (e.g., 240, 740*a*, 740*b*, 1440, 1740, etc.), a magnet (e.g., 1750, 1752, 1850, 1852, etc.), another component, some combination thereof, etc.

As another example, monitoring component 2394 may be used to monitor a pressure or change in pressure within at least one component (e.g., 210, 710*a*, 710*b*, 1410, 1610, 1710, etc.). In one embodiment, the pressure or change in pressure within the at least one component may be directly measured by monitoring component 2394. In one embodiment, the pressure or change in pressure within the at least one component may be measured or determined by monitoring at least one attribute (e.g., a position, an internal pressure, a temperature, a property of an applied magnetic field, some combination thereof, etc.) of another component associated with a pressure or change in pressure within at least one component. For example, monitoring component 2394 may be used to monitor the position of a piston (e.g., 1652) used to set or change the pressure within at least one component (e.g., 1610), the position or state (e.g., associated with one or more attributes) of another component (e.g., shaft 1650, component 1678, component 1679, shaft 1654, at least one rotor 1570, at least one stator 1572, at least one stator 1574, knob 1560, etc.) associated with a pressure or change in pressure within the at least one component, etc.

As another example, monitoring component 2394 may be used to monitor a temperature or change in temperature associated with at least one component (e.g., 210, 710*a*, 710*b*, 1410, 1610, 1710, etc.). In one embodiment, monitoring component 2394 may be used to directly measure a temperature or change in temperature of the at least one component or another component (e.g., a resistive heating device, a heat exchanger, a thermoelectric cooler, another device capable of transferring heat to the at least one component, another device capable of transferring heat from the at least one component, some combination thereof, etc.) used to set or change the temperature of the at least one component. In one embodiment, monitoring component 2394 may be used to monitor another property or attribute (e.g., of the at least one component) associated with a temperature or change in temperature of the at least one component. For example, where temperature of the at least one component is proportional to a current flowing through the at least one component (e.g., where the electric current is used to heat or otherwise change the temperature of the at least one component), monitoring component 2394 may monitor the temperature of the at least one component by monitoring the current (or another electrical property or attribute such as voltage, etc.) flowing through the at least one component.

As another example, monitoring component 2394 may be used to monitor a magnetic field applied to (e.g., through, across, in proximity to, etc.) at least one component (e.g., 210, 710*a*, 710*b*, 1410, 1610, 1710, etc.). In one embodiment, monitoring component 2394 may be used to directly measure at least one property (e.g., strength, magnetic flux density, direction, location, shape, etc.) of a magnetic field. In one embodiment, monitoring component 2394 may be used to monitor at least one attribute (e.g., a position, an internal pressure, a temperature, a property of an applied magnetic field, some combination thereof, etc.) of another component associated with at least one property of a magnetic field. For example, where at least one property (e.g., strength, magnetic flux density, direction, location, shape, etc.) of a magnetic field is a function of a position of a magnet (e.g., 1752), monitoring component 2394 may monitor at least one property of the magnetic field by monitoring: the position of a magnet (e.g., 1750, 1752, 1850, 1852, etc.); a relative position of a plurality of magnets (e.g., 1750 and 1752, 1850 and 1852, etc.); a relative position of a magnet (e.g., 1750, 1752, 1850, 1852, etc.) and another object (e.g., electromagnet 1880, another component of an apparatus, etc.); etc.

Monitoring component 2394 may monitor at least one position using at least one switch, at least one rotary encoder, at least one other electromechanical device, at least one inductive sensor, at least one capacitive sensor, at least one other electrical position detection component, at least one optical position detection component, etc. Monitoring component 2394 may monitor or directly measure at least one pressure (e.g., inside and/or associated with at least one component, associated with another component or device, ambient pressure, etc.) using at least one manometer, at least one mechanical pressure gauge or measurement device, at least one pressure transducer, etc. Monitoring component 2394 may monitor at least one temperature using at least one thermocouple, at least one thermistor, at least one ultrasonic thermometer, at least one infrared thermometer or pyrometer, at least one laser thermometer or pyrometer, a current meter (e.g., where temperature of at least one component is a function of current through the at least one component), etc. Monitoring component 2394 may monitor one or more properties of a magnetic field (e.g., applied to at least one component) using at least one magnetic field strength meter, at least one magnetic flux density meter, at least one hall effect sensor, at least one single-axis magnetic field measurement component, at least one multi-axis magnetic field measurement component, etc.

In one embodiment, monitoring component 2394 may be used to monitor at least one attribute (e.g., at least one position, at least one pressure, at least one temperature, at least one property of an applied magnetic field, some combination thereof, etc.) of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). For example, the position of one portion of an apparatus with respect to at least one other portion of the apparatus may be measured or determined using monitoring component 2394. As another example, an amount of bending, an amount of torsional deformation, at least one vibration characteristic (e.g., vibration damping, damping coefficient, at least one damped natural frequency, at least one undamped natural frequency, vibration frequency response, etc.), the shape, etc. of an apparatus (or a vehicle, or at least one vehicle portion, including or implemented by the apparatus) or at least one portion thereof may be measured or determined using monitoring component 2394.

In one embodiment, at least one attribute of an apparatus (or a vehicle, or at least one vehicle portion, including or implemented by the apparatus) may be measured or determined (e.g., by monitoring component 2394) using at least one stress gauge, at least one strain gauge, at least one optical detection component (e.g., able to detect an amount of deformation of the apparatus that can then be used to determine an amount of bending, torsional deformation, change in shape, etc.), at least one vibration measurement component, etc. And in one embodiment, at least one attribute may be monitored using the same or similar components or devices used to monitor at least one attribute (e.g., a position, a pressure, a temperature, a property of an applied magnetic field, some combination thereof, etc.) of at least one component.

In one embodiment, monitoring component 2394 may be used to measure or determine at least one property (e.g., bending stiffness or rigidity, torsional stiffness or rigidity, vibration characteristic, shape, some combination thereof, etc.) of an apparatus (or a vehicle, or at least one vehicle portion, including or implemented by the apparatus). In one embodiment, one or more properties (e.g., of the apparatus or at least one portion thereof) may be determined based on at least one attribute of at least one component (e.g., 210, 710*a*, 710*b*, 1410, 1610, 1710, etc.) and/or at least one attribute of the apparatus. In this case, the at least one property of the apparatus (or a vehicle, or at least one vehicle portion, including or implemented by the apparatus) may be determined based on the relationship between at least one attribute (e.g., of the at least one component, of the apparatus, etc.) and the at least one property. Accordingly, at least one property of an apparatus (or at least one portion thereof) may be advantageously determined using one or more elements of the apparatus (e.g., without the use of separate equipment or machines), thereby allowing at least one property of an apparatus (or a vehicle, or at least one vehicle portion, including or implemented by the apparatus) to be monitored or determined in one or more conditions (e.g., when the apparatus is moving, when the apparatus is stationary, when the apparatus is in a remote location away from equipment or machines that could otherwise be used to determine a property of the apparatus, etc.).

In one embodiment, monitoring component 2394 may be used to monitor at least one attribute (e.g., of at least one component and/or of at least one apparatus) and/or at least one property (e.g., of at least one component and/or of at least one apparatus) at one or more times. In this manner, at least one attribute and/or at least one property may be determined at a particular instant and/or tracked over time (e.g., using measurements or samples taken at a plurality of times or instants).

In one embodiment, configuration component 2392 and/or monitoring component 2394 (e.g., alone or in combination with processor 2310 and/or at least one other component of apparatus 2300) may be used to control at least one component based on at least one attribute (e.g., associated with at least one component and/or at least one apparatus). For example, monitoring component 2394 may be used to monitor a first attribute or first plurality of attributes associated with at least one component and/or at least one apparatus. Configuration component 2392 may be used to adjust or control the at least one component (e.g., 210, 710*a*, 710*b*, 1410, 1610, 1710, etc.) and/or at least one other component (e.g., shaft 1450, at least one rotor 1470, at least one stator 1472, at least one stator 1474, shaft 1550, coupler 1552, object 1578, object 1579, shaft 1554, at least one rotor 1570, at least one stator 1572, at least one stator 1574, piston 1652, shaft 1650, object 1678, object 1679, shaft 1654, magnet 1750, magnet 1752, magnet 1850, magnet 1852, etc.) to implement a second attribute or second plurality of attributes (e.g., associated with the at least one component and/or at least one apparatus). The adjustment performed by configuration component 2392 may be based on feedback or information (e.g., associated with the first attribute or first plurality of attributes) from monitoring component 2394 in one embodiment. In this manner, a control system may be implemented to regulate or otherwise control at least one attribute of at least one component and/or at least one apparatus.

In one embodiment, a control system may be implemented (e.g., using configuration component 2392, monitoring component 2394, processor 2310, at least one other component of apparatus 2300, etc.) to regulate or otherwise control at least one property (e.g., of an apparatus). For example, at least one property may be implemented (e.g., set, adjusted, controlled, regulated, etc.) by adjusting or controlling (e.g., using configuration component 2394) at least one component (e.g., 210, 710*a*, 710*b*, 1410, 1610, 1710, etc.) and/or at least one other component (e.g., shaft 1450, at least one rotor 1470, at least one stator 1472, at least one stator 1474, shaft 1550, coupler 1552, object 1578, object 1579, shaft 1554, at least one rotor 1570, at least one stator 1572, at least one stator 1574, piston 1652, shaft 1650, object 1678, object 1679, shaft 1654, magnet 1750, magnet 1752, magnet 1850, magnet 1852, etc.) to implement at least one attribute (e.g., associated with the at least one component) associated with the at least one property (e.g., of the apparatus). In this manner, a control system may be implemented to regulate or otherwise control at least one property of an apparatus and/or at least one portion thereof (e.g., based on or using at least one attribute associated with at least one component of the apparatus).

In one embodiment, a control system (e.g., implemented using configuration component 2392, monitoring component 2394, processor 2310, at least one other component of apparatus 2300, some combination thereof, etc.) may allow an apparatus (or a vehicle, or at least one vehicle portion, including or implemented by the apparatus) to account or adjust for changes in terrain. For example, vibration damping of a portion of the apparatus may be increased (e.g., to reduce vibration experienced by the apparatus, user of the apparatus, etc.) responsive to detecting or encountering rougher terrain, terrain that increases vibrations induced in the apparatus, terrain that causes vibrations to be transmitted through the apparatus, etc. As another example, the bending stiffness and/or the torsional stiffness of the apparatus may be decreased (e.g., to increase the flexibility of the apparatus, freestyle capability of the apparatus, "pop" or spring of the apparatus, etc.) responsive to detecting or encountering a particular type of terrain (e.g., harder terrain, a park including jumps, a park including jibs, etc.). As yet another example, the bending stiffness and/or the torsional stiffness of the apparatus may be increased (e.g., to increase maneuverability of the apparatus, to allow the apparatus to ride higher with less sag, etc.) responsive to detecting or encountering a particular type of terrain (e.g., softer terrain, powder snow, etc.).

In one embodiment, a particular type of terrain and/or at least one attribute of another object or surface (e.g., separate from the apparatus, that the apparatus moves along, that the apparatus contacts or interfaces with, etc.) may be detected by monitoring or measuring (e.g., using monitoring component 2394) at least one attribute of at least one component and/or at least one apparatus (e.g., including the at least one component). In one embodiment, a particular type of terrain and/or at least one attribute of another object or surface (e.g., separate from the apparatus, that the apparatus moves along, that the apparatus contacts or interfaces with, etc.) may be detected by monitoring or measuring (e.g., using monitoring component 2394) at least one property of at least one component and/or at least one apparatus (e.g., including the at least one component).

For example, harder terrain may be detected responsive to measuring low deformation or strain (e.g., of at least one component and/or at least one apparatus), at least one vibration characteristic exceeding a predetermined threshold (e.g., going above a maximum threshold, going below a minimum threshold, etc.), some combination thereof, etc. As another example, softer terrain may be detected responsive to measuring higher deformation or strain (e.g., of at least one component and/or at least one apparatus), at least one vibration characteristic exceeding a predetermined threshold (e.g., going above a maximum threshold, going below a minimum threshold, etc.), some combination thereof, etc.

In one embodiment, a control system (e.g., implemented using configuration component 2392, monitoring component 2394, processor 2310, at least one other component of apparatus 2300, some combination thereof, etc.) may allow an apparatus (or a vehicle, or at least one vehicle portion, including or implemented by the apparatus) to account or adjust for changes in weather conditions. For example, where the temperature of the apparatus affects at least one property of the apparatus, at least one attribute and/or at least one property of at least one component (e.g., included in or associated with the at least one apparatus) may be altered to regulate or otherwise adjust the properties of the apparatus (e.g., to counteract the effects of a change in weather). As another example, where temperature can affect at least one attribute and/or at least one property of at least one component (e.g., including an SMA, MSMA, FSMA, etc.), the temperature of the at least one component may be regulated to implement or change at least one attribute and/or at least one property of the at least one component (e.g., by adding heat to the at least one component to raise the temperature responsive to a drop in ambient temperature, by removing heat from the at least one component to decrease the temperature responsive to an increase in ambient temperature, etc.).

In one embodiment, a control system (e.g., implemented using configuration component 2392, monitoring component 2394, processor 2310, at least one other component of apparatus 2300, some combination thereof, etc.) may allow an apparatus (or a vehicle, or at least one vehicle portion, including or implemented by the apparatus) to account or adjust for changes in riding style (e.g., how a user rides the apparatus). For example, where a user shifts his/her weight and/or puts more pressure on a particular portion of the apparatus (e.g., due to fatigue, injury, etc.), at least one property of the apparatus (e.g., of the particular portion, of at least one other portion, etc.) may be adjusted (e.g., to counteract the effects of the change in riding style). As another example, where a user begins to ride faster or slower, at least one property of the apparatus (e.g., of the particular portion, of another portion, etc.) may be adjusted (e.g., to counteract the effects of the change in speed). As yet another example, where a user begins to ride more or less aggressively, at least one property of the apparatus (e.g., of the particular portion, of another portion, etc.) may be adjusted (e.g., to counteract the effects of the change in riding style).

Figure 24:
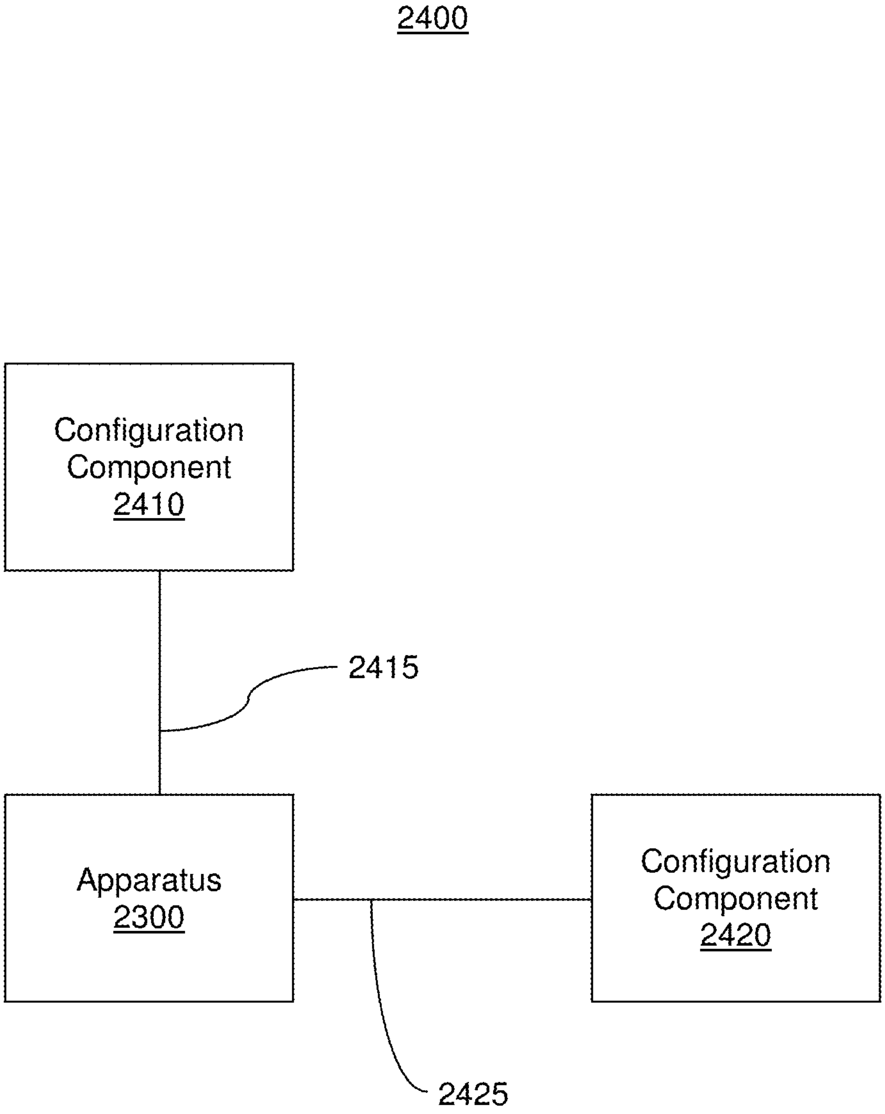
FIG. 24 shows a system including at least one configuration component in accordance with one embodiment.

FIG. 24 shows system 2400 including at least one configuration component in accordance with one embodiment of the present invention. As shown in FIG. 24, apparatus 2300 may be communicatively coupled with configuration component 2410 (e.g., via interface 2415) and/or configuration component 2420 (e.g., via interface 2425). In one embodiment, configuration component 2410 and/or configuration component 2420 may generate control signals, where the control signals may be communicated to apparatus 2300 (e.g., via interface 2415, interface 2425, etc.) to configure, control, alter, etc. at least one property and/or at least one attribute of at least one component (e.g., 210, 710*a*, 710*b*, 1410, 1610, 1710, etc.) of apparatus 2300. Additionally, where adjustment of at least one attribute of at least one component can be used to configure at least one property (e.g., resistance to bending, resistance to torsion, at least one vibration characteristic, shape, some combination thereof, etc.) of apparatus 2300, configuration component 2410 and/or configuration component 2420 may be used to configure, control, alter, etc. at least one property of apparatus 2300 (or a vehicle, or at least one vehicle portion, including or implemented by apparatus 2300).

Interface 2415 and/or interface 2425 may be or include a wired interface and/or a wireless interface. Interface 2415 and/or interface 2425 may be implemented using or include at least one signal transfer component (e.g., 2251, 2252, 2261, 2263, 2272, 2273, etc.) in one embodiment.

In one embodiment, configuration component 2410 and/or configuration component 2420 may be disposed remotely from (e.g., separate from, out of eyeshot from, out of earshot from, in a different area than, in a different state than, in a different nation than, etc.) apparatus 2300. In one embodiment, configuration component 2410 and/or configuration component 2420 may be physically coupled with apparatus 2300. And in one embodiment, configuration component 2410 and/or configuration component 2420 may be physically coupled with apparatus 2300 via a cable or other component used to implement a respective interface (e.g., 2415, 2425, etc.).

In one embodiment, configuration component 2410 and/or configuration component 2420 may be automated or controlled by a system or device. In one embodiment, configuration component 2410 and/or configuration component 2420 may be controlled manually (e.g., by at least one user). For example, configuration component 2410 and/or configuration component 2420 may include or be used to implement one or more user interfaces (e.g., 2500 of FIG. 25, 2600 of FIG. 26, etc.), where the one or more user interfaces allow at least one user to configure or control: at least one attribute and/or at least one property of apparatus 2300; at least one attribute and/or at least one property of at least one component (e.g., 210, 710*a*, 710*b*, 1410, 1610, 1710, etc.) of apparatus 2300; etc.

Although FIG. 24 shows a particular number and arrangement of components or elements of system 2400, it should be appreciated that system 2400 may include a different number and/or arrangement of components and/or elements in other embodiments. For example, two or more components may be combined, a component may be split into a plurality of sub-components, etc. As another example, system 2400 may include a smaller or larger number of configuration components (e.g., similar to configuration component 2410, configuration component 2420, etc.).

Turning back to FIG. 23, apparatus 2300 may communicate with other systems, devices, components, etc. via communication interface 2370. Communication interface 2370 may embody computer-readable instructions, data structures, program modules or other data in a modulated data signal (e.g., a carrier wave) or other transport mechanism. By way of example, and not limitation, communication interface 2370 may couple to wired media (e.g., a wired network, direct-wired connection, etc.) and/or wireless media (e.g., a wireless network, a wireless connection utilizing acoustic, radio frequency (RF), infrared, or other wireless signaling, etc.).

Communication interface 2370 may also couple apparatus 2300 to one or more external input components (e.g., a keyboard, a mouse, a trackball, a joystick, a pen, a voice input device, a touch input device, etc.). In one embodiment, communication interface 2370 may couple apparatus 2300 to one or more external output components (e.g., a display, a speaker, a printer, etc.). And in one embodiment, communication interface 2370 may include a plug, receptacle, cable, slot or any other component capable of coupling to and/or communicating with another component, device, system, etc.

In one embodiment, communication interface 2370 may be used to communicate with another system or device (e.g., configuration component 2410, configuration component 2420, another system or device, etc.) that is separate or disposed remotely from apparatus 2300. For example, communication interface 2370 may be used to communicate information or data (e.g., as determined or monitored by monitoring component 2394) associated with one or more properties (e.g., bending stiffness or rigidity, torsional stiffness or rigidity, at least one vibration characteristic, shape, some combination thereof, etc.) of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) to another system or device (e.g., for processing and/or storage by the system and/or device). As another example, communication interface 2370 may be used to communicate information or data (e.g., as determined or monitored by monitoring component 2394) associated with at least one attribute (e.g., a position, a pressure, a temperature, a property of an applied magnetic field, some combination thereof, etc.) of at least one component (e.g., 210, 710*a*, 710*b*, 1410, 1610, 1710, etc.) to another system or device (e.g., for processing and/or storage by the system and/or device). As yet another example, communication interface 2370 may be used to communicate information or data (e.g., as determined or monitored by monitoring component 2394) associated with at least one attribute (e.g., an amount of bending, torsional deformation, at least one measured vibration characteristic, vibration transmission, shape, etc.) of at least one apparatus to another system or device (e.g., for processing and/or storage by the system and/or device).

As a further example, communication interface 2370 may be used to communicate information (e.g., determined by or using information determination component 2396) associated with at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) to another system or device (e.g., configuration component 2410, configuration component 2420, another system or device, etc.). In one embodiment, the information associated with the at least one apparatus may be communicated for processing and/or storage by the system and/or device. The information (e.g., determined by or using information determination component 2396) may include a location of the at least one apparatus (e.g., determined or measured using a global positioning system (GPS), compass, etc.), a speed of the at least one apparatus (e.g., determined or measured using at least one accelerometer), acceleration of the at least one apparatus (e.g., determined or measured using at least one accelerometer), altitude of the at least one apparatus (e.g., determined or measured using an altimeter), orientation and/or attitude of the at least one apparatus (e.g., determined or measured using at least one accelerometer, at least one gyroscope, at least one ball-cage sensor or ball-in-cage sensor, etc.), at least one attribute associated with a component of or in communication with the at least one apparatus (e.g., a voltage or other attribute of the power source 2398, a functional state of another component, etc.), etc.

In one embodiment, communication interface 2370 may be used to access or receive control signals. For example, a signal or communication from another system or device (e.g., configuration component 2410, configuration component 2420, another system or device, etc.) may be received (e.g., by or via communication interface 2370) and used to control (e.g., using processor 2310, memory 2320, removable storage 2340, non-removable storage 2345, configuration component 2392, monitoring component 2394, at least one other component of apparatus 2300, etc.) a component of at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), at least one component in communication with (e.g., able to communicate with, electrically coupled to, etc.) the at least one apparatus, etc. In this manner, a system, device, component, etc. (e.g., that is separate or disposed remotely from the at least one apparatus) may remotely control or alter (e.g., while the at least one apparatus is stationary, while the at least one apparatus is moving, before manufacturing, during manufacturing, after manufacturing, on-the-fly, etc.) at least one property and/or at least one attribute of at least one component and/or at least one apparatus.

In one embodiment, communication interface 2370 (e.g., alone or in conjunction with one or more other components of apparatus 2300) may allow a user (e.g., separate or located remotely from the at least one apparatus, a user of the at least one apparatus, etc.) to remotely control or alter (e.g., while the at least one apparatus is stationary, while the at least one apparatus is moving, before manufacturing, during manufacturing, after manufacturing, on-the-fly, etc.) at least one property and/or at least one attribute of at least one component and/or at least one apparatus. In one embodiment, the remote control or alteration may be performed using configuration component 2410, configuration component 2420, another system or device, etc. For example, a coach or other user may remotely control or alter at least one property and/or at least one attribute during practice, during competition, etc., where the remote control or alteration may be used to assist the rider (e.g., of the apparatus), tune the apparatus (e.g., during a trial run, during practice, before competition, during competition, etc.), otherwise control performance of the apparatus, etc.

As another example, a technician or other user (e.g., associated with the manufacturer of the apparatus) may remotely control or alter (e.g., using configuration component 2410, configuration component 2420, another system or device, etc.) at least one property and/or at least one attribute to advantageously evaluate or test one or more configurations of the apparatus (e.g., before manufacturing, during manufacturing, after manufacturing, on-the-fly, etc.). As such, in one embodiment, the time and/or expense of designing and/or manufacturing at least one apparatus may be reduced by alleviating the need to collect data (e.g., during development and/or testing of the apparatus) using multiple conventional vehicles (e.g., each with a different set of properties that cannot be changed or configured).

As shown in FIG. 23, input component 2380 may include any component capable of receiving or allowing the input of information. For example, input component 2380 may be or include a keyboard, at least one button or key, a mouse, a trackball, a joystick, a pen, a voice input device, a touch input device (e.g., a touch screen, etc.), another type of input component, etc.

In one embodiment, input component 2380 may be or be used to implement a user interface (e.g., 2500 of FIG. 25, 2600 of FIG. 26, another user interface, etc.) that allows a user to configure (e.g., at least one property and/or at least one attribute) at least one component (e.g., 210, 710*a*, 710*b*, 1410, 1610, 1710, etc.) and/or at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). For example, the input component 2380 may be coupled with (e.g., via a cable, mounted to or on, integrated into, etc.) a user's clothing or protective gear, a user's watch, a boot, a binding, a portion of the apparatus, etc., where control signals (e.g., generated responsive to a user interaction with input component 2380 and/or at least one user interface implemented therewith) may be communicated or passed from input component 2380 to another component (e.g., configuration component 2392, processor 2310, etc.) via one or more signal transfer components (e.g., 2251, 2252, 2261, 2263, 2272, 2273, etc.). As another example, input component 2380 may wirelessly communicate with communication interface 2370 in one embodiment, where control signals (e.g., generated responsive to a user interaction with input component 2380 and/or the user interface implemented therewith) may be communicated or passed from input component 2380 to another component (e.g., configuration component 2392, processor 2310, etc.) via communication interface 2370.

Figure 25:
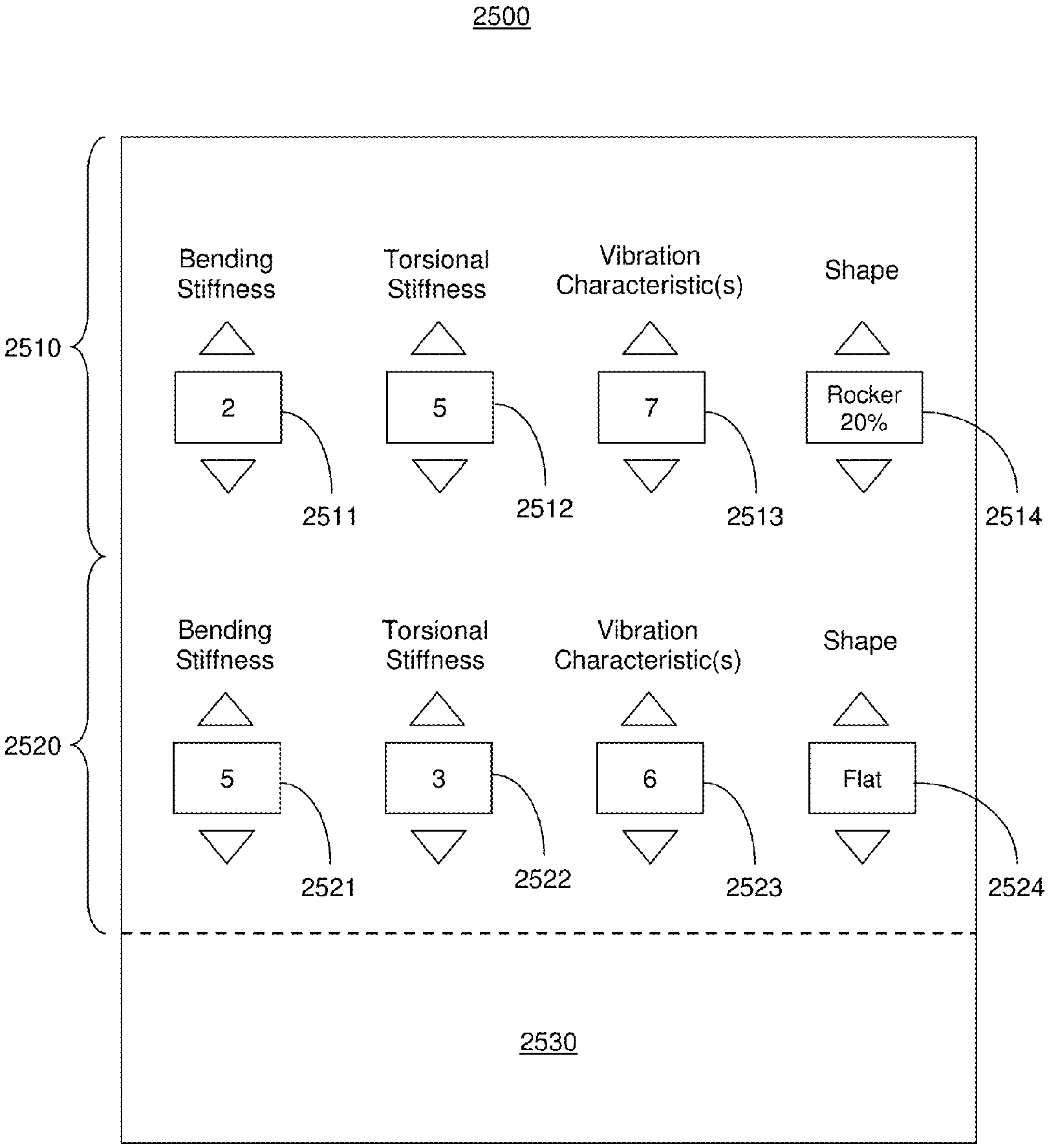
FIG. 25 shows a user interface in accordance with one embodiment.

FIG. 25 shows user interface 2500 in accordance with one embodiment of the present invention. In one embodiment, user interface 2500 may be implemented using input component 2380 of apparatus 2300. In one embodiment, one or more regions of user interface 2500 may be implemented using a graphical user interface displayed on a display device (e.g., output component 2390) such as a cathode ray tube (CRT) display, a liquid crystal display (LCD), light emitting diode (LED) display, organic light emitting diode (OLED) display, another type of display, etc. In this case, one or more users may interact with user interface 2500 via a touch screen (e.g., disposed over or in proximity to one or more portions of the display device used to display the graphical user interface), at least one physical button (e.g., separate from the display device), at least one physical key (e.g., separate from the display device), some combination thereof, etc. And in one embodiment, elements of user interface 2500 may be implemented using a keyboard, at least one physical button or key, a mouse, a trackball, a joystick, a pen, a voice input device, another type of input component, etc.

In one embodiment, user interface 2500 may allow a user to control or set at least one property of at least one component (e.g., 210, 710*a*, 710*b*, 1410, 1610, 1710, etc.) and/or at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). In one embodiment, user interface 2500 may allow a user to control or set at least one attribute of at least one component (e.g., 210, 710*a*, 710*b*, 1410, 1610, 1710, etc.) and/or at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.).

As shown in FIG. 25, region 2510 of user interface 2500 may include a plurality of sub-regions (e.g., 2511, 2512, 2513, 2514, etc.), where each sub-region may be used to control or set a respective attribute or property of a first portion of at least one apparatus. For example, sub-region 2511 may be used to set or control bending stiffness, sub-region 2512 may be used to set or control torsional stiffness, sub-region 2513 may be used to set or control at least one vibration characteristic (e.g., vibration damping, at least one damping coefficient, at least one damped natural frequency, at least one undamped natural frequency, vibration frequency response, etc.), sub-region 2514 may be used to set or control torsional stiffness, etc. A value (e.g., represented or defined in terms of a number, range, percentage, level, description using at least one word, some combination thereof, etc.) associated with a given property or attribute may be entered directly into a corresponding sub-region of region 2510 (e.g., using a keyboard, at least one button or key, a mouse, a trackball, a joystick, a pen, a voice input device, a touch input device such as a touch screen, input component 2380, another type of input component, etc.) in one embodiment. Alternatively, a value (e.g., represented or defined in terms of a number, range, percentage, level, description using at least one word, some combination thereof, etc.) associated with a given property or attribute may be set or changed using the arrows on either side of the sub-region (e.g., to increment or decrement the value of the property or attribute).

Region 2520 of user interface 2500 may include a plurality of sub-regions (e.g., 2521, 2522, 2523, 2524, etc.), where each sub-region may be used to control or set a respective attribute or property of a second portion of at least one apparatus. For example, sub-region 2521 may be used to set or control bending stiffness, sub-region 2522 may be used to set or control torsional stiffness, sub-region 2523 may be used to set or control at least one vibration characteristic (e.g., vibration damping, at least one damping coefficient, at least one damped natural frequency, at least one undamped natural frequency, vibration frequency response, etc.), sub-region 2524 may be used to set or control torsional stiffness, etc. A value (e.g., represented or defined in terms of a number, range, percentage, level, description using at least one word, some combination thereof, etc.) associated with a given property or attribute may be entered directly into a corresponding sub-region of region 2520 (e.g., using a keyboard, at least one button or key, a mouse, a trackball, a joystick, a pen, a voice input device, a touch input device such as a touch screen, input component 2380, another type of input component, etc.) in one embodiment. Alternatively, a value (e.g., represented or defined in terms of a number, range, percentage, level, description using at least one word, some combination thereof, etc.) associated with a given property or attribute may be set or changed using the arrows on either side of the sub-region (e.g., to increment or decrement the value of the property or attribute).

In one embodiment, a particular region (e.g., 2510, 2520, etc.) of user interface 2500 may correspond to a plurality of components (e.g., 210, 710*a*, 710*b*, 1410, 1610, 1710, etc.). In this case, the particular region (e.g., 2510, 2520, etc.) may be used to control or configure at least one attribute and/or at least one property of the plurality of components (e.g., to determine, configure, adjust, etc. one or more properties of an apparatus including the plurality of components). And in one embodiment, a particular region (e.g., 2510, 2520, etc.) of user interface 2500 may correspond to a single component (e.g., 210, 710*a*, 710*b*, 1410, 1610, 1710, etc.). In this case, the particular region (e.g., 2510, 2520, etc.) may be used to control or configure at least one attribute and/or at least one property of the single component (e.g., to determine, configure, adjust, etc. one or more properties of an apparatus including the single component).

In one embodiment, at least one respective attribute (e.g., a position, an internal pressure, a temperature, a property of an applied magnetic field, some combination thereof, etc.) of a plurality of components (e.g., 210, 710*a*, 710*b*, 1410, 1610, 1710, etc.) may be determined based on at least one value (e.g., represented or defined in terms of a number, range, percentage, level, description using at least one word, some combination thereof, etc.) input using user interface 2500. For example, a first set of attributes of a plurality of components may be determined based on at least one value (e.g., a bending stiffness of "2," a torsional stiffness of "5," at least one vibration characteristic of "7," a shape of "rocker 20%," some combination thereof, etc.) input using region 2510. It should be appreciated that the first set of attributes may involve setting or configuring the plurality of components in different positions, with different internal pressures, different temperatures, different properties of an applied magnetic field, different properties (e.g., bending stiffness, torsional stiffness, at least one vibration characteristic, shape, etc.), etc. As another example, a second set of attributes of a plurality of components may be determined based on at least one value (e.g., a bending stiffness of "5," a torsional stiffness of "3," at least one vibration characteristic of "6," a shape of "flat," some combination thereof, etc.) input using region 2520. It should be appreciated that the second set of attributes may involve setting or configuring the plurality of components in different positions, with different internal pressures, different temperatures, different properties of an applied magnetic field, different properties (e.g., bending stiffness, torsional stiffness, at least one vibration characteristic, shape, etc.), etc. Accordingly, where a plurality of components may collectively influence one or more properties of a portion of an apparatus, at least one respective attribute (e.g., a position, an internal pressure, a temperature, a property of an applied magnetic field, some combination thereof, etc.) associated with each component of a plurality of components (e.g., 210, 710*a*, 710*b*, 1410, 1610, 1710, etc.) may be determined, configured, adjusted, etc. based on one or more values input using user interface 2500.

As shown in FIG. 25, region 2530 may be used to present other information and/or provide other functionality. For example, the time, date, weather, temperature, other information, some combination thereof, etc. may be presented using region 2530. As another example, region 2530 may include elements (e.g., at least one physical button and/or at least one physical key, at least one displayed icon or button, etc.) used to control the rendering of content (e.g., direction of playback, skipping, pausing, muting, stopping, shuffling, navigation through a menu of a user interface or graphical user interface implemented using region 2530, etc).

Although FIG. 25 shows user interface 2500 with a specific number and arrangement of regions, it should be appreciated that user interface 2500 may have a different number and/or arrangement of regions in other embodiments. For example, user interface 2500 may include at least one additional region associated with at least one other portion of the apparatus (e.g., associated with regions 2510 and 2520). As another example, user interface 2500 may include a different number of sub-regions (e.g., similar to sub-regions 2511, 2512, 2513, 2514, 2521, 2522, 2523, 2524, etc.) for controlling or setting a different number and/or type of properties or attributes. Additionally, although FIG. 25 shows user interface 2500 with a specific size and shape of regions, it should be appreciated that one or more regions of user interface 2500 may have a different size and/or shape in other embodiments.

Figure 26:
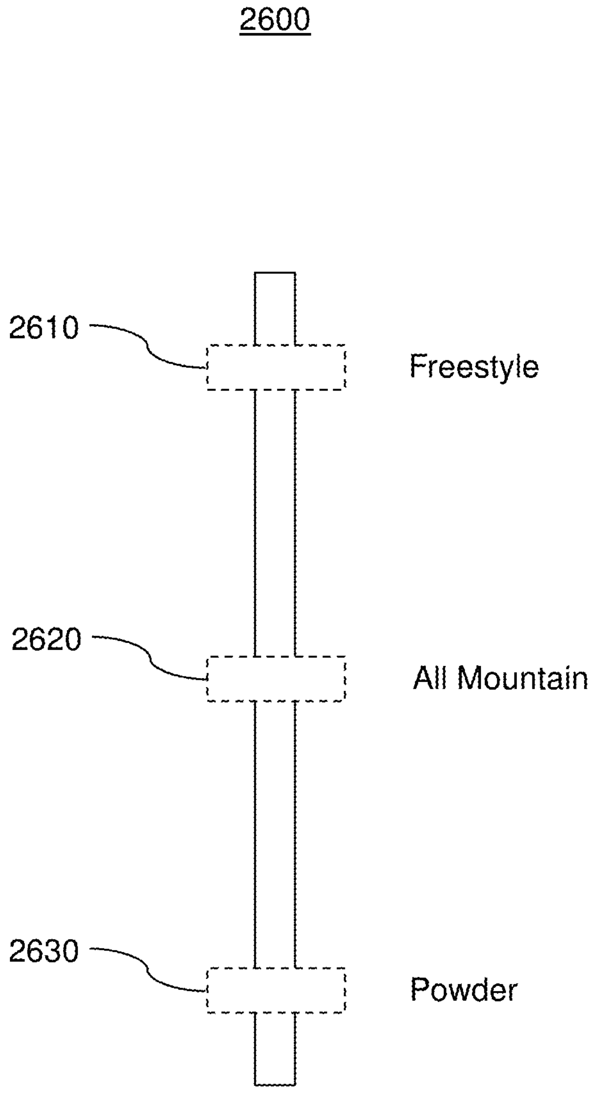
FIG. 26 shows a user interface for configuring an apparatus in accordance with one embodiment.

FIG. 26 shows user interface 2600 for configuring an apparatus in accordance with one embodiment of the present invention. In one embodiment, user interface 2600 may be implemented using input component 2380 of apparatus 2300. In one embodiment, user interface 2600 may be implemented using region 2530 of user interface 2500.

In one embodiment, one or more regions of user interface 2600 may be implemented using a graphical user interface displayed on a display device (e.g., output component 2390) such as a cathode ray tube (CRT) display, a liquid crystal display (LCD), light emitting diode (LED) display, organic light emitting diode (OLED) display, another type of display, etc. In this case, one or more users may interact with user interface 2600 via a touch screen (e.g., disposed over or in proximity to one or more portions of the display device used to display the graphical user interface), at least one physical button (e.g., separate from the display device), at least one physical key (e.g., separate from the display device), some combination thereof, etc. And in one embodiment, elements of user interface 2600 may be implemented using a keyboard, at least one physical button or key, a mouse, a trackball, a joystick, a pen, a voice input device, another type of input component, etc.

As shown in FIG. 26, element or region 2610 may be associated with and/or used to select a first configuration of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) associated with a first type of apparatus (e.g., an apparatus configured for freestyle or park riding, an apparatus configured for harder terrain, etc.). Element or region 2620 may be associated with and/or used to select a second configuration of the apparatus associated with a second type of apparatus (e.g., an apparatus configured for all-mountain riding, an apparatus configured for freestyle riding and riding in powder, etc.). Element or region 2630 may be associated with and/or used to select a third configuration of the apparatus associated with a third type of apparatus (e.g., an apparatus configured for riding in powder, an apparatus configured for loose snow or softer terrain, etc.).

Each of the configurations (e.g., the first configuration, the second configuration, the third configuration, etc.) may be associated with at least one respective attribute (e.g., a position, a pressure, a temperature, a property of an applied magnetic field, some combination thereof, etc.) and/or at least one respective property (e.g., resistance to bending, resistance to torsion, at least one vibration characteristic, shape, some combination thereof, etc.). For example, the first configuration (e.g., associated with or selected using element or region 2610) may be associated with a first attribute or first set of attributes of at least one component (e.g., 210, 710*a*, 710*b*, 1410, 1610, 1710, etc.) used to implement a first property or first set of properties of the apparatus, whereas the second configuration (e.g., associated with or selected using element or region 2620) may be associated with a second attribute or second set of attributes of at least one component (e.g., 210, 710*a*, 710*b*, 1410, 1610, 1710, etc.) used to implement a second property or second set of properties of the apparatus. In this manner, an apparatus (or at least one portion thereof) may be easily and efficiently configured (e.g., without requiring knowledge of the at least one component, of any attributes associated with the at least one component, any properties associated with the apparatus, how the configuration of the apparatus is actually carried out, etc.) to implement one type of a plurality of types of apparatuses using user interface 2600.

In one embodiment, user interface 2600 may be or include a slider, where each element or region (e.g., 2610, 2620, 2630, etc.) may be a different position of the slider. As such, a user may change the type of apparatus by simply moving the slider from one position to another.

Although FIG. 26 shows user interface 2600 with a specific number and arrangement of regions, it should be appreciated that user interface 2600 may have a different number and/or arrangement of regions in other embodiments. Additionally, although FIG. 26 shows user interface 2600 with a specific size and shape of regions, it should be appreciated that one or more regions of user interface 2600 may have a different size and/or shape in other embodiments.

Turning back to FIG. 23, output component 2390 may include any component capable of transmitting or allowing the output of information. For example, output component 2390 may be or include a display, a speaker, a printer, another type of output component, etc.

In one embodiment, output component 2390 may be used to render or present content. The content (e.g., audio data, image data, video data, etc.) may be stored on a memory of apparatus 2300 (e.g., memory 2320, removable storage 2340, non-removable storage 2345, frame buffer 2360, etc.), stored on a memory of another system or device (e.g., allowing one or more components of apparatus 2300 to access the content via communication interface 2370), some combination thereof, etc. Input component 2380 may be used to implement a user interface allowing a user to control the rendering (e.g., playback in a forward direction, reverse playback, skip, pause, mute, stop, shuffle, navigation through a menu, etc.) of the content. In one embodiment, the user interface (e.g., allowing a user to control the rendering of content) may be implemented using region 2530 of user interface 2500 (e.g., displayed in region 2530, implemented using at least one physical button and/or at least one physical key of region 2530, implemented using at least one icon or button displayed in region 2530, etc.).

As shown in FIG. 23, graphics processor 2350 may perform graphics processing operations on data stored in frame buffer 2360 or another memory (e.g., 2320, 2340, 2345, etc.) of apparatus 2300. Data stored in frame buffer 2360 may be accessed, processed, and/or modified by components (e.g., graphics processor 2350, processor 2310, some combination thereof, etc.) of apparatus 2300 and/or components of other systems, other devices, etc. Additionally, in one embodiment, the data may be processed (e.g., by graphics processor 2350) to generate other data or content, where the other data or content may be communicated for display and/or displayed (e.g., using output component 2390, an output component of another system or device, etc.).

In one embodiment, the content may be communicated using at least one signal transfer component (e.g., 2251, 2252, 2261, 2263, 2272, 2273, some combination thereof, etc.). In one embodiment, the content may be accessed and/or processed using processor 2310. And in one embodiment, the content may be accessed and/or processed using at least one other component of apparatus 2300 (e.g., configuration component 2392, monitoring component 2394, information determination component 2396, etc.).

As shown in FIG. 23, power source 2398 may include any component capable of storing and/or producing energy. For example, power source 2398 may include at least one battery, at least one capacitor, at least one ultracapacitor, at least one solar cell, some combination thereof, etc. An energy storage component (e.g., at least one battery, at least one capacitor, at least one ultracapacitor, etc.) of power source 2398 may be charged by an external charger (e.g., coupled via at least one signal transfer component of FIG. 22, by a plug or jack, etc.), by an energy producing component (e.g., a solar cell) of power source 2398 responsive to exposure to sunlight or other light, etc.

In one embodiment, one or more components of apparatus 2300 may be separated from, disposed remotely from, not physically coupled to, etc. one or more other components of apparatus 2300. For example, at least one component (e.g., 2310, 2320, 2340, 2345, 2350, 2360, 2370, 2380, 2390, 2392, 2394, 2396, 2398, some combination thereof, etc.) of apparatus 2300 may be coupled with and/or at least partially disposed in another object (e.g., a binding, a boot, a user's clothing or protective gear, a user's watch, another object, etc.) that is separated from, disposed remotely from, not physically coupled to, etc. one or more other components of apparatus 2300. The at least one component may be electrically coupled and/or communicatively coupled to the one or more other components (e.g., via at least one signal transfer component of FIG. 22, at least one wire, at least one trace, communication interface 2370, etc.). Additionally, in one embodiment, the electrical coupling and/or communicative coupling between the at least one component and the one or more other components may be gated or switched (e.g., allowing the at least one component and the one or more other components to be decoupled, selectively decoupled, etc.).

In one embodiment, power source 2398 may be may be coupled with and/or at least partially disposed in another object (e.g., a binding, a boot, a user's clothing or protective gear, a user's watch, another object, etc.), yet able to be electrically coupled to at least one other component of apparatus 2300 to provide power to the at least one other component and/or receive power from the at least one other component. In this manner, the energy storage capacity of apparatus 2300 can be expanded without increasing the size, weight, etc. of the apparatus to accommodate the at least one additional component (e.g., at least one battery, at least one capacitor, at least one ultracapacitor, some combination thereof, etc.) of power source 2398.

For example, use of an external power source (e.g., to provide power to or from at least one other component of the apparatus) can reduce the size of the apparatus (e.g., since the apparatus need not be sized to include the external power source within a cavity, housing, outer layer, body, etc. of the apparatus), the weight of the apparatus (e.g., since the weight of the apparatus may not include the weight of the external power source), etc. Additionally, use of an external power source (e.g., to provide power to or from at least one other component of the apparatus) can provide additional advantages such as allowing the energy storage capacity of the apparatus to be expanded and/or customized (e.g., to be different from the energy storage capacity determined or suggested by the manufacturer of the apparatus), allowing easier and more efficient replacement of the power source, etc.

In one embodiment, one or more signal transfer components (e.g., 2251, 2252, 2261, 2263, 2272, 2273, etc.) may act as a switch to couple two or more components (e.g., 2310, 2320, 2340, 2345, 2350, 2360, 2370, 2380, 2390, 2392, 2394, 2396, 2398, etc.) of apparatus 2300. The two or more components of apparatus 2300 may be coupled with and/or at least partially disposed in the same object (e.g., at least one layer or housing of the apparatus, at least one cavity of the apparatus, a binding, a boot, a user's clothing or protective gear, a user's watch, another object, etc.), coupled with and/or at least partially disposed in different objects, etc. For example, at least one signal transfer component of a first object (e.g., the apparatus, a binding, a boot, a user's clothing or protective gear, a user's watch, another object, etc.) may short or act as a jumper between contacts of at least one signal transfer component of a second object (e.g., the apparatus, a binding, a boot, a user's clothing or protective gear, a user's watch, another object, etc.), thereby allowing two or more components of apparatus 2300 to be electrically coupled and/or communicatively coupled via the at least one signal transfer component of the first object. As another example, a first object may include a first plurality of signal transfer components that are electrically coupled and/or communicatively coupled to one another, where the first plurality of signal transfer components may electrically couple and/or communicatively couple two or more components of the apparatus (e.g., that are electrically coupled and/or communicatively coupled to a second plurality of signal transfer components of a second object) responsive to the first plurality of signal transfer components being positioned (e.g., brought into contact, proximity, alignment, etc.) with respect to the second plurality of signal transfer components (e.g., where the first object acts as a conductive and/or communicative path for the two or more components of the apparatus).

The one or more signal transfer components (e.g., 2251, 2252, 2261, 2263, 2272, 2273, etc.) may be used to deactivate a component (e.g., via power gating, clock gating, etc.) and/or activate a component (e.g., by connecting a power source to the component, by providing a clock signal to the component, by providing a data signal to the component, etc.) in one embodiment. In one embodiment, the one or more signal transfer components (e.g., 2251, 2252, 2261, 2263, 2272, 2273, etc.) may be used to couple at least one component (e.g., a memory device storing secure information or content, another component, etc.) to at least one other component of apparatus 2300. And in one embodiment, the one or more signal transfer components (e.g., 2251, 2252, 2261, 2263, 2272, 2273, etc.) may be used to allow communication between two or more components (e.g., that are decoupled or otherwise restricted from communicating when the switch is in a particular state) of apparatus 2300, of another system or device, some combination thereof, etc.

Accordingly, using one or more signal transfer components (e.g., 2251, 2252, 2261, 2263, 2272, 2273, etc.) as a switch to couple two or more components of apparatus 2300 may provide one or more advantages. For example, where at least one signal transfer component (e.g., disposed at least partially within and/or coupled with the apparatus) and at least one other signal transfer component (e.g., disposed at least partially within and/or coupled with the user, disposed at least partially within and/or coupled with a user's clothing, disposed at least partially within and/or coupled with a user's boot, disposed at least partially within and/or coupled with a user's watch, etc.) are used as a switch for one or more components of apparatus 2300, the one or more components may be automatically powered or activated (e.g., responsive to the user stepping on the apparatus, responsive to the user being secured to the apparatus, etc.) without requiring the user to flip a switch or otherwise manually power or activate the one or more components. Additionally, the cost of the system may be reduced and/or reliability of the system may be increased by reducing the number of components (e.g., alleviating the need for a power switch by configuring at least one signal transfer component to act as a switch). As another example, power may be conserved or saved by automatically disconnecting the power to and/or deactivating the one or more components of apparatus 2300 (e.g., responsive to the user stepping off the apparatus, responsive to the user no longer being secured to the apparatus, responsive to a pause or cessation in use of the apparatus, etc.).

In one embodiment, the one or more signal transfer components (e.g., 2251, 2252, 2261, 2263, 2272, 2273, etc.) may act as a switch to limit access to secure information or content. For example, where access to a memory (e.g., 2320, 2340, 2345, etc.) storing the secure information or content is provided by the one or more signal transfer components, access to the secure information or content may be limited or prohibited by the one or more signal transfer components (e.g., responsive to the user stepping off the apparatus, responsive to the user no longer being secured to the apparatus, responsive to a pause or cessation in use of the apparatus, etc.).

In one embodiment, only an authorized user may be able to change the state of the switch (e.g., implemented by the one or more signal transfer components) to allow access to the secure information or content. For example, where at least one signal transfer component (e.g., 2252, 2263, disposed at least partially within and/or coupled with the apparatus, etc.) and at least one other signal transfer component (e.g., 2272, 2273, disposed at least partially within and/or coupled with the user, disposed at least partially within and/or coupled with a user's boot, disposed at least partially within and/or coupled with a user's clothing, disposed at least partially within and/or coupled with a user's watch, etc.) are used to reduce unauthorized access to information or content, at least one attribute (e.g., the position, type, configuration, etc.) of the at least one other signal transfer component (e.g., 2272, 2273, disposed at least partially within and/or coupled with the user, disposed at least partially within and/or coupled with a user's boot, disposed at least partially within and/or coupled with a user's clothing, disposed at least partially within and/or coupled with a user's watch, etc.) may be unique to the authorized user and/or may act as a key to reduce unauthorized access (e.g., by another user, by an unauthorized user, etc.) to the information or content. As such, since at least one attribute of at least one signal transfer component associated with an unauthorized user may be different from the at least one attribute of the at least one other signal transfer component associated with the authorized user, the at least one signal transfer component associated with the unauthorized user may be unable to provide access to the information or content.

In one embodiment, security of information or content may be increased using other authorization or verification mechanisms. For example, a device (e.g., disposed at least partially within and/or coupled with the user, disposed at least partially within and/or coupled with a user's boot, disposed at least partially within and/or coupled with a user's clothing, disposed at least partially within and/or coupled with a user's watch, etc.) may be used to verify or authenticate a user over a wired and/or wireless interface. The wired and/or wireless interface may be implemented using one or more signal transfer components (e.g., 2251, 2252, 2261, 2263, 2272, 2273, etc.), using communication interface 2370 and a corresponding communication interface of the other device (e.g., disposed at least partially within and/or coupled with the user, disposed at least partially within and/or coupled with a user's boot, disposed at least partially within and/or coupled with a user's clothing, disposed at least partially within and/or coupled with a user's watch, etc.), etc.

In one embodiment, an external memory (e.g., 2320, 2340, 2345, etc.) may be used to increase the security of information or content. For example, where the external memory (e.g., 2320, 2340, 2345, etc.) is coupled with and/or at least partially disposed in an object of the user (e.g., a boot, clothing or protective gear, a user's watch, another object of the user or carried by the user, etc.), unauthorized access to the information or content may be reduced as the external memory (e.g., 2320, 2340, 2345, etc.) may be carried with the user (e.g., away from the apparatus).

In one embodiment, the external memory may communicate with one or more components of apparatus 2300 via an interface implemented using one or more signal transfer components (e.g., 2251, 2252, 2261, 2263, 2272, 2273, etc.), communication interface 2370, etc. In this manner, one or more signal transfer components (e.g., 2251, 2252, 2261, 2263, 2272, 2273, etc.) and/or communication interface 2370 may be used to reduce unauthorized access to information or content stored on the external memory.

Accordingly, security of information, content, other data, etc. may be increased. Additionally, in one embodiment, one or more of the security mechanisms discussed herein may allow the implementation of digital rights management (DRM).

In one embodiment, a proximity switch (e.g., a capacitive switch, inductive switch, etc.) may be utilized by or included in at least one apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), another object (e.g., 2060, 2160, 2260, 2270, etc.), etc. The switch may be used to deactivate a component (e.g., via power gating or by disconnecting power source 2398 from the component, via clock gating, etc.), activate a component (e.g., by connecting power source 2398 to the component, by providing a clock signal to the component, etc.), couple at least one component (e.g., a memory storing secure information or content, another component, etc.) to at least one other component of the apparatus, allow communication between two or more components (e.g., that are decoupled or otherwise restricted from communicating when the switch is in another state), etc.

In one embodiment, the state of the proximity switch (e.g., open, closed, etc.) may be changed responsive to a user (e.g., a user's foot, leg, another body part, etc.) being in proximity to the proximity switch. In this manner, a user's presence may advantageously be used as a switch to couple (e.g., electrically, communicatively, etc.) and/or decouple (e.g., electrically, communicatively, etc.) a plurality of components, thereby providing one or more advantages such as user-friendliness and/or efficiency (e.g., by allowing the proximity switch to be automatically triggered without requiring the user to manually flip a switch), reduced cost and/or increased reliability, power savings and/or power conservation (e.g., by automatically disconnecting the power and/or deactivating at least one component of apparatus when not in use, when a user is not present, etc.), increased data security (e.g., by disconnecting or otherwise increasing the security of secure information or content when the apparatus is not in use, when a user is not present at or near the apparatus, etc.), some combination thereof, etc.

Although FIG. 22 shows components or elements of apparatus 2200 with particular shapes and sizes, it should be appreciated that apparatus 2200 may include components and/or elements of different shapes and/or sizes in other embodiments. Additionally, although FIG. 22 shows a particular number and arrangement of components or elements of apparatus 2200, it should be appreciated that apparatus 2200 may include a different number and/or arrangement of components and/or elements in other embodiments.

Although FIG. 23 shows a particular number and arrangement of components or elements of apparatus 2300, it should be appreciated that apparatus 2300 may include a different number and/or arrangement of components and/or elements in other embodiments. For example, two or more components may be combined, a component may be split into a plurality of sub-components, etc.

Figure 27:
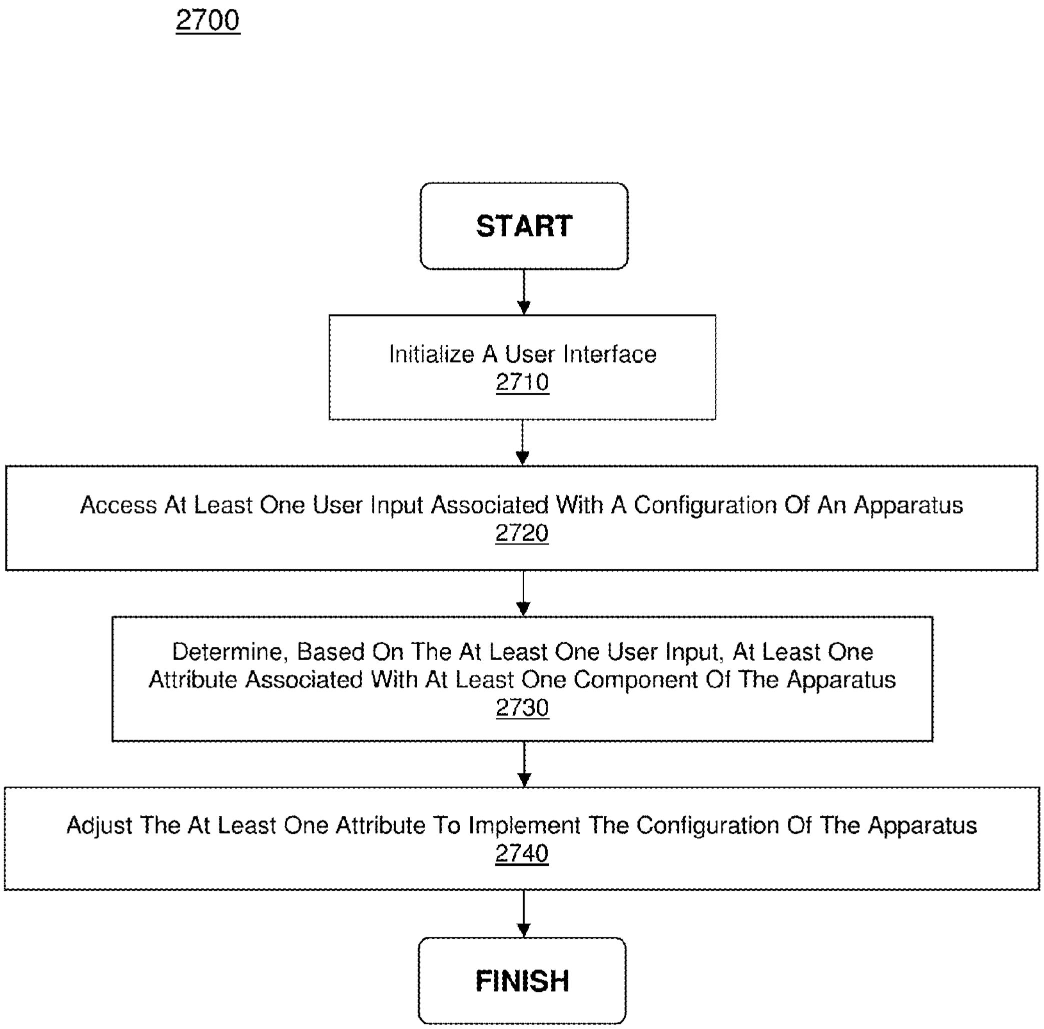
FIG. 27 shows a flowchart of a process in accordance with one embodiment.

FIG. 27 shows a flowchart of process 2700 in accordance with one embodiment of the present invention. As shown in FIG. 27, step 2710 involves initializing a user interface (e.g., 2500, 2600, another user interface, etc.).

In one embodiment, a user interface may be initialized in step 2710 by displaying one or more images (e.g., where the user interface is a graphical user interface). In one embodiment, the one or more images may be displayed on or using an output component (e.g., 2390) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), an output component (e.g., similar to output component 2390) of another object (e.g., 2060, 2160, 2260, 2270, etc.), an output component (e.g., similar to output component 2390) in communication with at least one component of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), another object (e.g., 2060, 2160, 2260, 2270, etc.), etc. And in one embodiment, the one or more images may be displayed on or using an output component (e.g., similar to output component 2390) that is electrically coupled to (or is capable of being electrically coupled to) at least one component of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), another object (e.g., 2060, 2160, 2260, 2270, etc.), etc. The electrical coupling (e.g., between the output component and the at least one component of an apparatus, between the output component and the other object, etc.) may be via at least one signal transfer component (e.g., 2251, 2252, 2261, 2263, 2272, 2273, etc.) in one embodiment.

In one embodiment, a user interface may be initialized in step 2710 by supplying at least one signal (e.g., at least one power signal, at least one clock signal, at least one data signal, etc.) to the user interface. And in one embodiment, a user interface may be initialized in step 2710 by performing at least one other operation to prepare the user interface to accept at least one user input.

The user interface initialized in step 2710 may be implemented using a component (e.g., input component 2380, output component 2390, some combination thereof, etc.) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), another object (e.g., 2060, 2160, 2260, 2270, etc.) in one embodiment. In one embodiment, the user interface initialized in step 2710 may be implemented using at least one configuration component (e.g., 2410, 2420, etc.) that is electrically coupled to and/or in communication with at least one component (e.g., a communication interface such as communication interface 2370, a processor such as processor 2310, etc.) of the apparatus (e.g., 100*a*, 100*b*, 100*c*, 100*d*, 200, 700, 900, 1200, 1400, 1500, 1600, 1700, 1800, 1900, 2000, 2100, 2200, 2300, etc.).

As shown in FIG. 27, step 2720 involves accessing at least one user input associated with a configuration of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), another object (e.g., 2060, 2160, 2260, 2270, etc.). The apparatus may be, or be used to implement, at least one vehicle and/or or at least one vehicle portion in one embodiment. In one embodiment, the configuration associated with the at least one user input (e.g., accessed in step 2720) may be a desired configuration or a configuration that is different from a current configuration of the apparatus (e.g., as determined using monitoring component 2394, information determination component 2396, some combination thereof, etc.).

In one embodiment, the at least one user input may be accessed in step 2720 via the user interface initialized in step 2710. In one embodiment, the at least one user input may be accessed in step 2720 from a component of the apparatus (e.g., input component 2380, another component, etc.), from another device or component (e.g., configuration component 2410, configuration component 2420, another component, another device, another system, etc.), some combination thereof, etc. And in one embodiment, the at least one user input may be at least one control signal communicated to and/or accessed at the apparatus.

In one embodiment, the configuration associated with the at least one user input (e.g., accessed in step 2720) may involve or be associated with at least one attribute (e.g., a position, a pressure, a temperature, a property of a magnetic field, a current, a voltage, some combination thereof, etc.) associated with at least one component (e.g., 210, 710*a*, 710*b*, 1410, 1610, 1710, etc.) of the apparatus. For example, the at least one user input may be a selection of at least one attribute (or at least one value thereof) associated with at least one component (e.g., 210, 710*a*, 710*b*, 1410, 1610, 1710, etc.) of the apparatus. The at least one attribute may include at least two different types of attributes associated with a plurality of components (e.g., at least one position associated with a first component, at least one pressure associated with a second component, at least one temperature associated with a third component, etc.) in one embodiment. And in one embodiment, the at least one attribute may include at least two different types of attributes associated with the same component (e.g., at least one position associated with a component, at least one pressure associated with the component, at least one temperature associated with the component, etc.).

In one embodiment, the at least one user input accessed in step 2720 may be associated with a configuration that is selected using or is associated with an element or region of a user interface. For example, the at least one user input may be associated with a first configuration that is input (or selected) using and/or associated with a first element or region (e.g., 2610) of a user interface (e.g., 2600). As another example, the at least one user input may be associated with a second configuration that is input (or selected) using and/or associated with a second element or region (e.g., 2620) of a user interface (e.g., 2600). And as yet another example, the at least one user input may be associated with a third configuration that is input (or selected) using and/or associated with a third element or region (e.g., 2630) of a user interface (e.g., 2600).

In one embodiment, the at least one user input accessed in step 2720 may be associated with a type of apparatus that is selected using and/or associated with an element or region of a user interface. For example, the at least one user input may be associated with a first type of apparatus (e.g., an apparatus configured for freestyle or park riding, an apparatus configured for harder terrain, etc.) that is input (or selected) using and/or associated with a first element or region (e.g., 2610) of a user interface (e.g., 2600). As another example, the at least one user input may be associated with a second type of apparatus (e.g., an apparatus configured for all-mountain riding, an apparatus configured for freestyle riding and riding in powder, etc.) that is input (or selected) using and/or associated with a second element or region (e.g., 2620) of a user interface (e.g., 2600). And as yet another example, the at least one user input may be associated with a third type of apparatus (e.g., an apparatus configured for riding in powder, an apparatus configured for loose snow or softer terrain, etc.) that is input (or selected) using and/or associated with a third element or region (e.g., 2630) of a user interface (e.g., 2600).

In one embodiment, the at least one user input accessed in step 2720 may be associated with at least one property (e.g., bending stiffness or rigidity, torsional stiffness or rigidity, at least one vibration characteristic, shape, etc.) of an apparatus (or a vehicle, or at least one vehicle portion, including or implemented by the apparatus) or a portion thereof. For example, the at least one user input may be associated with a first property or first set of properties that is input (or selected) using and/or associated with a first element or region (e.g., 2510, 2511, 2512, 2513, 1514, etc.) of a user interface (e.g., 2500). As another example, the at least one user input may be associated with a second property or second set of properties that is input (or selected) using and/or associated with a second element or region (e.g., 2520, 2521, 2522, 2523, 1524, etc.) of a user interface (e.g., 2500).

As shown in FIG. 27, step 2730 involves determining, based on the at least one user input (e.g., accessed in step 2720), at least one attribute associated with at least one component (e.g., 210, 710*a*, 710*b*, 1410, 1610, 1710, etc.) of the apparatus. In one embodiment, step 2730 may be performed by processor 2310 (e.g., alone or in combination with at least one other component of apparatus 2300). The at least one attribute may include or be at least one position, at least one pressure, at least one temperature, at least one property of a magnetic field (e.g., applied through, across, in proximity to, etc. the at least one component), a current (e.g., flowing through the at least one component), a voltage (e.g., of or measured at the at least one component), at least one other attribute (e.g., a duty cycle or another property of a pulse-width modulated signal of or measured at the at least one component), some combination thereof, etc.

In one embodiment, the at least one attribute may be determined in step 2730 by indexing at least one data structure based on the user input to determine the at least one attribute. For example, where the at least one user input is associated with a configuration and/or type of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), a first data structure (e.g., 2800 of FIG. 28) may be accessed using the configuration and/or type of the apparatus to determine at least one attribute (e.g., a position, a pressure, a temperature, a property of a magnetic field, a current, a voltage, at least one other attribute, some combination thereof, etc.) associated with at least one component (e.g., 210, 710*a*, 710*b*, 1410, 1610, 1710, etc.) of the apparatus. As another example, where the at least one user input is associated with at least one value of at least one property (e.g., bending stiffness or rigidity, torsional stiffness or rigidity, at least one vibration characteristic, shape, etc.) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), a second data structure (e.g., 2900 of FIG. 29) may be accessed using the at least one value of the at least one property to determine at least one attribute (e.g., a position, a pressure, a temperature, a property of a magnetic field, a current, a voltage, some combination thereof, etc.) associated with at least one component (e.g., 210, 710*a*, 710*b*, 1410, 1610, 1710, etc.) of the apparatus.

FIG. 28 shows data structure 2800 in accordance with one embodiment of the present invention. Data structure 2800 may be or include at least one linear data structure, at least one array, at least one table, at least one lookup table, at least one list, at least one tree, at least one hash, at least one graph, at least one other type of data structure, etc. Data structure 2800 may be stored in a memory (e.g., 2320, 2340, 2345, etc.) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), a memory coupled to or in communication with at least one component of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.), a memory of another system or device, some combination thereof, etc.

In one embodiment, data structure 2800 may include an index of configurations (e.g., of an apparatus or at least one portion of an apparatus) and attributes (e.g., associated with at least one component of the apparatus or at least one portion of the apparatus). For example, configuration 1 (e.g., of column 2810) may be associated with (or defined by, implemented by, etc.) position 1 of component 1, pressure 1 of component 2, temperature 1 of component 3, magnetic field property 1 of component 4, current 1 of component 5, voltage 1 of component 6, some combination thereof, etc. As another example, configuration 2 (e.g., of column 2820) may be defined by or associated with position 2 of component 1, pressure 2 of component 2, temperature 2 of component 3, magnetic field property 2 of component 4, current 2 of component 5, voltage 2 of component 6, some combination thereof, etc. As yet another example, configuration 3 (e.g., of column 2830) may be defined by or associated with position 3 of component 1, pressure 3 of component 2, temperature 3 of component 3, magnetic field property 3 of component 4, current 3 of component 5, voltage 3 of component 6, some combination thereof, etc.

Accordingly, data structure 2800 may be indexed or accessed (e.g., by processor 2310, by another component of apparatus 2300, etc.) using a configuration (e.g., configuration 1 of column 2810, configuration 2 of column 2820, configuration 3 of column 2830, etc.) of an apparatus (or at least one portion thereof) to determine (e.g., in accordance with, or as part of, step 2730 of FIG. 27) at least one respective attribute (e.g., a position, a pressure, a temperature, a property of a magnetic field, a current, a voltage, some combination thereof, etc.) associated with each component of at least one component (e.g., component 1, component 2, component 3, component 4, component 5, component 6, another component, some combination thereof, etc.). In one embodiment, where each configuration (e.g., configuration 1 of column 2810, configuration 2 of column 2820, configuration 3 of column 2830, etc.) is associated with a type of apparatus (e.g., an apparatus configured for freestyle or park riding, an apparatus configured for harder terrain, an apparatus configured for all-mountain riding, an apparatus configured for freestyle riding and riding in powder, an apparatus configured for riding in powder or loose snow, an apparatus configured for softer terrain, another type of apparatus, etc.), data structure 2800 may be indexed or accessed using a type of apparatus (e.g., a first type of apparatus associated with configuration 1 of column 2810, a second type of apparatus associated with configuration 2 of column 2820, a third type of apparatus associated with configuration 3 of column 2830, etc.) to determine (e.g., in accordance with, or as part of, step 2730 of FIG. 27) at least one respective attribute (e.g., a position, a pressure, a temperature, a property of a magnetic field, a current, a voltage, some combination thereof, etc.) associated with each component of at least one component (e.g., component 1, component 2, component 3, component 4, component 5, component 6, another component, some combination thereof, etc.).

In one embodiment, data structure 2800 may be used to determine at least one attribute based on a user input (e.g., to a user interface or accessed via a user interface). For example, where each element or region (e.g., 2610, 2620, 2630, etc.) of a user interface (e.g., 2600) is associated with a respective configuration (e.g., configuration 1 of column 2810, configuration 2 of column 2820, configuration 3 of column 2830, etc.) of an apparatus (or at least one portion thereof), data structure 2800 may be indexed or accessed using at least one configuration (e.g., associated with the user input, associated with one or more element or regions of the user input, determined based on the user input, selected as part of the user input, etc.) to determine (e.g., in accordance with, or as part of, step 2730 of FIG. 27) at least one attribute associated with one or more components. As another example, where each element or region (e.g., 2610, 2620, 2630, etc.) of a user interface (e.g., 2600) is associated with a respective type of apparatus, data structure 2800 may be indexed or accessed using at least one type of apparatus (e.g., associated with the user input, associated with one or more element or regions of the user input, determined based on the user input, selected as part of the user input, etc.) to determine (e.g., in accordance with, or as part of, step 2730 of FIG. 27) at least one attribute associated with one or more components.

In one embodiment, data structure 2800 may be stored in a memory that is selectively coupled to or capable of being decoupled from at least one component of an apparatus (e.g., **100*a*, 100*b*, 100*c*, 100*d*, 200, 700, 900, 1200, 1400, 1500, 1600, 1700, 1800, 1900, 2000, 2100, 2200, 2300, etc.). For example, data structure 2800 may be stored in a memory (e.g., 2320, 2340, 2345, etc.) where access to the memory is controlled or switched using one or more signal transfer components (e.g., 2251, 2252, 2261, 2263, 2272, 2273, etc.). In this manner, the ability to configure an apparatus (e.g., in accordance with one or more steps of process 2700) may be reduced or limited (e.g., to authorized users of the apparatus) by using a switch or other mechanism to selectively couple a memory (e.g., including data structure 2800) to at least one other component of the apparatus (e.g., processor 2310, another component of apparatus 2300**, etc.).

Each component (e.g., component 1, component 2, component 3, component 4, component 5, component 6, etc.) depicted in FIG. 28 may be or include at least one component (e.g., 210, **710*a*, 710*b*, 1410, 1610, 1710, etc.) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) in one embodiment. In one embodiment, at least one component depicted in FIG. 28 may be included in or part of the same portion of an apparatus as at least one other component depicted in FIG. 28. And in one embodiment, at least one component depicted in FIG. 28 may be included in or part of at least one different portion of an apparatus from at least one other component depicted in FIG. 28**.

Although FIG. 28 shows data structure 2800 with a specific amount and type of data, it should be appreciated that data structure 2800 may include a different amount and/or type of data in other embodiments. For example, more than one component may be associated with the same attribute (e.g., a plurality of components of data structure 2800 may be associated with positions, a plurality of components of data structure 2800 may be associated with pressures, etc.). As another example, a particular component (e.g., component 1, component 2, component 3, component 4, component 5, component 6, etc.) may be associated with a plurality of different types of attributes (e.g., configuration 1 may be associated with position 1 of component 1 and a pressure of component 1, etc.). And as yet another example, in other embodiments, data structure 2800 may include data associated with a different number of components, a different number of configurations, a different number of attributes, some combination thereof, etc. Although the data of data structure 2800 is depicted in FIG. 28 in one or more specific forms, it should be appreciated that the data of data structure 2800 may be expressed in other forms (e.g., as at least one number, as at least one range, as at least one percentage, as at least one level, using at least one word, other forms, etc.) in other embodiments.

FIG. 29 shows data structure 2900 in accordance with one embodiment of the present invention. Data structure 2900 may be or include at least one linear data structure, at least one array, at least one table, at least one lookup table, at least one list, at least one tree, at least one hash, at least one graph, at least one other type of data structure, etc. Data structure 2900 may be stored in a memory (e.g., 2320, 2340, 2345, etc.) of an apparatus (e.g., **100*a*, 100*b*, 100*c*, 100*d*, 200, 700, 900, 1200, 1400, 1500, 1600, 1700, 1800, 1900, 2000, 2100, 2200, 2300, etc.), a memory coupled to or in communication with at least one component of an apparatus (e.g., 100*a*, 100*b*, 100*c*, 100*d*, 200, 700, 900, 1200, 1400, 1500, 1600, 1700, 1800, 1900, 2000, 2100, 2200, 2300**, etc.), a memory of another system or device, some combination thereof, etc.

In one embodiment, data structure 2900 may include an index of attributes (e.g., associated with at least one component) and values of properties (e.g., of an apparatus). For example, each row of data structure 2900 may include values of a respective property (e.g., bending stiffness, torsional stiffness, at least one vibration characteristic, shape, etc.) implemented by different attributes (e.g., attribute 1, attribute 2, attribute 3, attribute 4, etc.) associated with at least one component (e.g., 210, **710*a*, 710*b*, 1410, 1610, 1710, etc.). As such, data structure 2900 may indicate (or include) an association (or relationship) between an attribute (e.g., attribute 1, attribute 2, attribute 3, attribute 4, etc.) associated with at least one component (e.g., 210, 710*a*, 710*b*, 1410, 1610, 1710, etc.) and at least one value of at least one property (e.g., listed in column 2930) of an apparatus (e.g., 100***b*, 100*c*, 100*d*, 200, 700, 900, 1200, 1400, 1500, 1600, 1700, 1800, 1900, 2000, 2100, 2200, 2300, etc.).

In one embodiment, at least two columns (e.g., 2940, 2950, 2960, 2970, etc.) of data structure 2900 may include different values of the same attribute. For example, column 2940 may be associated with a first position, whereas column 2950 may be associated with a second position. And in one embodiment, at least two columns (e.g., 2940, 2950, 2960, 2970, etc.) of data structure 2900 may include different types of attributes. For example, column 2940 may be associated with a position, whereas column 2950 may be associated with a pressure.

In one embodiment, rows 2910 may be associated with a first component or first set of components, whereas rows 2920 may be associated with a second component or second set of components. In one embodiment, the first component or first set of components may be in the same portion of the apparatus as the second component or second set of components. In one embodiment, the first component or first set of components may be in at least one different portion of the apparatus than the second component or second set of components.

As such, data structure 2900 may indicate (or include) an association (or relationship) between an attribute (or set of attributes) and at least one respective value of at least one respective property (e.g., of an apparatus) imparted by or associated with each component of a plurality of components (e.g., associated with rows 2910, 2920, etc.). For example, attribute 2 (e.g., of column 2950) may be associated with a first property value or first set of property values (e.g., from rows 2910 such as a bending stiffness of "2," a torsional stiffness of "5," at least one vibration characteristic of "7," a shape of "rocker 20%," some combination thereof, etc.) imparted by or associated with a first component of the apparatus. Attribute 2 (e.g., of column 2950) may also be associated with a second property value or second set of property values (e.g., from rows 2920 such as a bending stiffness of "3," a torsional stiffness of "4," at least one vibration characteristic of "2," a shape of "small curve," some combination thereof, etc.) imparted by or associated with a second component of the apparatus.

Accordingly, data structure 2900 may be indexed or accessed (e.g., by processor 2310, by another component of apparatus 2300, etc.) using at least one value of at least one property (e.g., at least one bending stiffness, at least one torsional stiffness, at least one vibration characteristic, at least one shape, etc.) associated with at least one component (e.g., the component associated with rows 2910, the component associated with rows 2920, etc.) to determine (e.g., in accordance with, or as part of, step 2730 of FIG. 27) at least one attribute (or at least one value of at least one attribute) associated with the at least one component. For example, data structure 2900 may be accessed using at least one value of at least one property (e.g., a bending stiffness of "2," a torsional stiffness of "5," at least one vibration characteristic of "7," a shape of "rocker 20%," some combination thereof, etc.) associated with a first component (e.g., that is associated with rows 2910) to determine an attribute (e.g., attribute 2 of column 2950) associated with the first component.

In one embodiment, data structure 2900 may be used to determine at least one attribute based on a user input (e.g., to a user interface or accessed via a user interface). For example, where each element or region (e.g., 2510, 2511, 2512, 2513, 2514, 2520, 2521, 2522, 2523, 2524, etc.) of a user interface (e.g., 2500) is associated with at least one respective property (e.g., of column 2930 such as a bending stiffness, a torsional stiffness, a vibration characteristic, a shape, etc.) of an apparatus (or at least one portion thereof), data structure 2900 may be indexed or accessed using at least one value of at least one property (e.g., associated with the user input, associated with one or more element or regions of the user input, determined based on the user input, selected as part of the user input, etc.) of an apparatus (or at least one portion thereof) to determine (e.g., in accordance with, or as part of, step 2730 of FIG. 27) at least one attribute (or at least one value of at least one attribute) associated with at least one component (e.g., of the apparatus that is used to implement or provide the at least one value of at least one property to the apparatus). As another example, where a user input is associated with one or more of the property values (e.g., a bending stiffness of "2," a torsional stiffness of "5," at least one vibration characteristic of "7," a shape of "rocker 20%," some combination thereof, etc.) depicted in region 2510 of user interface 2500 in FIG. 25, data structure 2900 may be indexed or accessed using the one or more property values to determine at least one attribute (e.g., attribute 2 of column 2950) based on the user input.

In one embodiment, data structure 2900 may be stored in a memory that is selectively coupled to or capable of being decoupled from at least one component of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.). For example, data structure 2900 may be stored in a memory (e.g., 2320, 2340, 2345, etc.) where access to the memory is controlled or switched using one or more signal transfer components (e.g., 2251, 2252, 2261, 2263, 2272, 2273, etc.). In this manner, the ability to configure an apparatus (e.g., in accordance with one or more steps of process 2700) may be reduced or limited (e.g., to authorized users of the apparatus) by using a switch or other mechanism to selectively couple a memory (e.g., including data structure 2900) to at least one other component of the apparatus (e.g., processor 2310, another component of apparatus 2300, etc.).

Each component (e.g., associated with rows 2910, associated with rows 2920, etc.) may be or include at least one component (e.g., 210, 710*a*, 710*b*, 1410, 1610, 1710, etc.) of an apparatus (e.g., 100*a*, 100*b*, 100*c*, 100*d*, 200, 700, 900, 1200, 1400, 1500, 1600, 1700, 1800, 1900, 2000, 2100, 2200, 2300, etc.) in one embodiment. In one embodiment, a first component (e.g., associated with rows 2910) may be included in or part of the same portion of an apparatus as a second component (e.g., associated with rows 2920). And in one embodiment, a first component (e.g., associated with rows 2910) may be included in or part of a different portion of an apparatus than a second component (e.g., associated with rows 2920).

Although FIG. 29 shows data structure 2900 with a specific amount and type of data, it should be appreciated that data structure 2900 may include a different amount and/or type of data in other embodiments. For example, a different number and/or type of properties (e.g., in column 2930) may be associated with at least one component (e.g., that is associated with rows 2910, rows 2920, etc.) in other embodiments. As another example, data structure 2900 may include data associated with a different number of components and/or attributes in other embodiments. Although the data of data structure 2900 is depicted in FIG. 29 in one or more specific forms, it should be appreciated that the data of data structure 2900 may be expressed in other forms (e.g., as at least one number, as at least one range, as at least one percentage, as at least one level, using at least one word, other forms, etc.) in other embodiments.

Turning back to FIG. 27, step 2740 involves adjusting at least one attribute (e.g., of or associated with the at least one component) to implement the configuration of the apparatus (e.g., associated with the at least one user input accessed in step 2720). In one embodiment, step 2740 may be performed by configuration component 2392 (e.g., alone or in combination with at least one other component of apparatus 2300). In one embodiment, step 2740 may involve adjusting or readjusting at least one attribute (e.g., at least one position, at least one pressure, at least one temperature, at least one property of a magnetic field, at least one current, at least one voltage, at least one duty cycle, at least one other property of a pulse-width modulated signal, some combination thereof, etc.) to, or based on, at least one value of the at least one attribute determined in step 2730. And in one embodiment, the adjustment may be performed in step 2740 in accordance with one or more of the previously-described Figures.

Although FIG. 27 shows process 2700 with a specific number of steps, it should be appreciated that process 2700 may include or involve a different number of steps in other embodiments. For example, step 2710 may be optional in one or more embodiments. Although FIG. 27 shows process 2700 with a specific ordering of steps, it should be appreciated that process 2700 may include or involve a different ordering of steps in other embodiments.

In the foregoing specification, embodiments have been described with reference to numerous specific details that may vary from implementation to implementation. Thus, the sole and exclusive indicator of what is, and is intended by the applicant to be, the invention is the set of claims that issue from this application, in the specific form in which such claims issue, including any subsequent correction thereto. Hence, no limitation, element, property, feature, advantage, or attribute that is not expressly recited in a claim should limit the scope of such claim in any way. Accordingly, the specification and drawings are to be regarded in an illustrative rather than a restrictive sense.

What is claimed is:

1. A sports board comprising:

at least one layer;

a first component coupled with said at least one layer;

a second component coupled with said at least one layer, wherein said second component is configured to control said first component to implement a plurality of configurations of said sports board, and wherein said second component is further configured to control, based on information associated with a configuration of said plurality of configurations, said first component to provide a value of a property to a portion of said at least one layer; and a communication interface coupled with said at least one layer, wherein said communication interface is configured to receive said information associated with said configuration from at least one component separate from said sports board, and wherein said communication interface is further configured to communicate data associated with said sports board to said at least one component separate from said sports board.

2. The sports board of claim 1, wherein each component of said at least one component separate from said sports board is selected from a group consisting of a component coupled with clothing, a component coupled with protective gear, a component coupled with a watch, a component coupled with a boot, and a component coupled with a binding.

3. The sports board of claim 1, wherein said information associated with said configuration is a user input.

4. The sports board of claim 1 further comprising:

a third component coupled with said at least one layer, wherein said third component is configured to determine said data associated with said sports board.

5. The sports board of claim 1, wherein said data is selected from a group consisting of: a measured value of said property; and a measured value of an attribute of said first component.

6. The sports board of claim 5, wherein said attribute is selected from a group consisting of a position, a pressure, a temperature, a property of a magnetic field, a current, a voltage, a duty cycle, and a property of a pulse-width modulated signal.

7. The sports board of claim 1, wherein said property is selected from a group consisting of bending stiffness, bending rigidity, torsional stiffness, torsional rigidity, at least one vibration characteristic, and shape.

8. The sports board of claim 1, wherein said data is selected from a group consisting of a location of said sports board, a speed of said sports board, an acceleration of said sports board, an altitude of said sports board, an orientation of said sports board, and an attitude of said sports board, a voltage of a power source of said sports board, and a functional state of at least one component of said sports board.

9. The sports board of claim 1, wherein said at least one layer includes an element selected from a group consisting of a top layer, a base, and a core.

10. A system comprising:

a sports board including:

at least one layer;

a first component coupled with said at least one layer; and a second component coupled with said at least one layer, wherein said second component is configured to control said first component to implement a plurality of configurations of said sports board, and wherein said second component is further configured to control, based on information associated with a configuration of said plurality of configurations, said first component to provide a value of a property to a portion of said at least one layer; and at least one component separate from said sports board, wherein said at least one component is configured to communicate said information associated with said configuration to said sports board, and wherein said at least one component is further configured to receive data associated with said sports board from said sports board.

11. The system of claim 10, wherein each component of said at least one component separate from said sports board is selected from a group consisting of a component coupled with clothing, a component coupled with protective gear, a component coupled with a watch, a component coupled with a boot, and a component coupled with a binding.

12. The system of claim 10, wherein said at least one component separate from said sports board includes a user interface, wherein said user interface is configured to present said plurality of configurations, and wherein said information associated with said configuration is a user selection, accessed via said user interface, of said configuration from said plurality of configurations.

13. The system of claim 10, wherein said at least one component separate from said sports board includes a user interface, wherein said user interface includes a first region allowing configuration of said sports board, and wherein said user interface further includes a second region configured to perform at least one operation selected from a group consisting of: presenting a time; presenting a date; presenting information related to weather; presenting a temperature; allowing a user to control rendering of content on an output device of said sports board; and allowing a user to control rendering of content on an output device coupled with said sports board.

14. The system of claim 13, wherein said rendering of content is selected from a group consisting of:

playback, skipping, pausing, muting, stopping, shuffling, and navigation through a menu.

15. The system of claim 10, wherein said at least one component separate from said sports board includes a user interface, and wherein said user interface includes at least one element selected from a group consisting of a display device, a touch screen, at least one physical button, a keyboard, a mouse, a trackball, a joystick, a pen, and a voice input device.

16. The system of claim 10, wherein said at least one component separate from said sports board is further configured to allow authentication of a user of said sports board.

17. The system of claim 10, wherein said at least one component separate from said sports board is further configured to perform, responsive to receiving said data from said sports board, at least one operation selected from a group consisting of processing said data and storing said data.

18. The system of claim 10, wherein said sports board and said at least one component separate from said sports board each include respective communication interfaces configured to implement an interface selected from a group consisting of a wired interface and a wireless interface.

19. The system of claim 10, wherein said data is selected from a group consisting of: a measured value of said property; and a measured value of an attribute of said first component.

20. The system of claim 19, wherein said attribute is selected from a group consisting of a position, a pressure, a temperature, a property of a magnetic field, a current, a voltage, a duty cycle, and a property of a pulse-width modulated signal.

21. The system of claim 10, wherein said property is selected from a group consisting of bending stiffness, bending rigidity, torsional stiffness, torsional rigidity, at least one vibration characteristic, and shape.

22. The system of claim 10, wherein said data is selected from a group consisting of a location of said sports board, a speed of said sports board, an acceleration of said sports board, an altitude of said sports board, an orientation of said sports board, an attitude of said sports board, a voltage of a power source of said sports board, and a functional state of at least one component of said sports board.

23. The system of claim 10, wherein said at least one layer includes an element selected from a group consisting of a top layer, a base, and a core.

24. A method comprising:

receiving, at a sports board, information associated with a configuration of a plurality of configurations of said sports board, wherein said receiving further comprises receiving said information from at least one component separate from said sports board;

determining, based on said information associated with said configuration, a value of an attribute associated with a component, wherein said component is coupled with a portion of at least one layer of said sports board;

controlling said component based on said value of said attribute; and responsive to said controlling, communicating data associated with said sports board to said at least one component separate from said sports board.

25. The method of claim 24, wherein each component of said at least one component separate from said sports board is selected from a group consisting of a component coupled with clothing, a component coupled with protective gear, a component coupled with a watch, a component coupled with a boot, and a component coupled with a binding.

26. The method of claim 24, wherein said at least one component separate from said sports board includes a portable electronic device.

27. The method of claim 24, wherein said at least one component separate from said sports board includes a user interface, and further comprising:

presenting, via said user interface, said plurality of configurations; and accessing, via said user interface, said information associated with said configuration, wherein said information associated with said configuration is a user selection of said configuration from said plurality of configurations.

28. The method of claim 24, wherein said at least one component separate from said sports board includes a user interface, and further comprising:

allowing, via a first region of said user interface, configuration of said sports board; and performing, via a second region of said user interface, at least one operation, wherein said at least one operation is selected from a group consisting of: presenting a time; presenting a date; presenting information related to weather; presenting a temperature; allowing a user to control rendering of content on an output device of said sports board; and allowing a user to control rendering of content on an output device coupled with said sports board.

29. The method of claim 28, wherein said rendering of content is selected from a group consisting of: playback, skipping, pausing, muting, stopping, shuffling, and navigation through a menu.

30. The method of claim 24, wherein said at least one component separate from said sports board includes a user interface, and wherein said user interface includes at least one element selected from a group consisting of a display device, a touch screen, at least one physical button, a keyboard, a mouse, a trackball, a joystick, a pen, and a voice input device.

31. The method of claim 24 further comprising:

allowing, using at least one component separate from said sports board, authentication of a user of said sports board.

32. The method of claim 24 further comprising:

performing, responsive to said receiving, at least one operation using said at least one component separate from said sports board, and wherein said at least one operation is selected from a group consisting of processing said data and storing said data.

33. The method of claim 24 further comprising:

implementing an interface using respective communication interfaces of said sports board and said at least one component separate from said sports board, and wherein said interface is selected from a group consisting of a wired interface and a wireless interface.

34. The method of claim 24 further comprising:
determining, using another component coupled with said at least one layer, said data associated with said sports board.

35. The method of claim 24, wherein said data is selected from a group consisting of: a measured value of a property of said portion of said at least one layer; and a measured value of an attribute of said component.

36. The method of claim 35, wherein said property is selected from a group consisting of bending stiffness, bending rigidity, torsional stiffness, torsional rigidity, at least one vibration characteristic, and shape.

37. The method of claim 24, wherein said attribute is selected from a group consisting of a position, a pressure, a temperature, a property of a magnetic field, a current, a voltage, a duty cycle, and a property of a pulse-width modulated signal.

38. The method of claim 24, wherein said data is selected from a group consisting of a location of said sports board, a speed of said sports board, an acceleration of said sports board, an altitude of said sports board, an orientation of said sports board, an attitude of said sports board, a voltage of a power source of said sports board, and a functional state of at least one component of said sports board.

39. The method of claim 24, wherein said at least one layer includes an element selected from a group consisting of a top layer, a base, and a core.

40. The sports board of claim 1, wherein said at least one component separate from said sports board includes a portable electronic device.

41. The system of claim 10, wherein said at least one component separate from said sports board includes a portable electronic device.

* * * * *

UNITED STATES PATENT AND TRADEMARK OFFICE

CERTIFICATE OF CORRECTION

PATENT NO. : 9,526,970 B1
APPLICATION NO. : 15/083227
DATED : December 27, 2016
INVENTOR(S) : Failing It is certified that error appears in the above-identified patent and that said Letters Patent is hereby corrected as shown below:

In the Claims

In Column 70, Line 24, in Claim 8, delete "sports board, and an attitude" and insert -- sports board, an attitude --.

Signed and Sealed this
Eighteenth Day of June, 2019

Andrei Iancu
*Director of the United States Patent and Trademark Office*